(12) United States Patent
Atsumi et al.

(10) Patent No.: US 9,812,466 B2
(45) Date of Patent: Nov. 7, 2017

(54) SEMICONDUCTOR DEVICE

(71) Applicant: Semiconductor Energy Laboratory Co., Ltd., Kanagawa-ken (JP)

(72) Inventors: Tomoaki Atsumi, Kanagawa (JP); Masayuki Sakakura, Kanagawa (JP); Yoshitaka Yamamoto, Nara (JP); Jun Koyama, Kanagawa (JP); Tetsuhiro Tanaka, Kanagawa (JP); Kazuki Tanemura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/817,709

(22) Filed: Aug. 4, 2015

(65) Prior Publication Data
US 2016/0043110 A1    Feb. 11, 2016

(30) Foreign Application Priority Data

Aug. 8, 2014  (JP) .................................. 2014-162751
Dec. 17, 2014  (JP) .................................. 2014-254710

(51) Int. Cl.
*H01L 27/12* (2006.01)
*H01L 29/786* (2006.01)

(52) U.S. Cl.
CPC .... *H01L 27/1225* (2013.01); *H01L 29/78648* (2013.01)

(58) Field of Classification Search
CPC ................................................. H01L 27/1225
(Continued)

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Asok K Sarkar
*Assistant Examiner* — Dmitriy Yemelyanov
(74) *Attorney, Agent, or Firm* — Husch Blackwell LLP

(57) ABSTRACT

A highly reliable semiconductor device that is suitable for high-speed operation is provided. A semiconductor device includes a first circuit, a second circuit, and a third circuit. The first circuit has an arithmetic processing function. The second circuit includes a memory circuit. The memory circuit includes a transistor which includes a first conductor, a second conductor, a first insulator, a second insulator, and a semiconductor. The first conductor includes a region overlapping the semiconductor with the first insulator positioned between the first conductor and the semiconductor. The second conductor includes a region overlapping the semiconductor with the second insulator positioned between the second conductor and the semiconductor. The first conductor is capable of selecting on or off of the transistor. The third circuit is electrically connected to the second conductor, and is capable of changing the potential of the (Continued)

second conductor in synchronization with an operation of the transistor.

21 Claims, 38 Drawing Sheets

(58) Field of Classification Search
USPC .......................................................... 257/43
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,692,223 B2 | 4/2010 | Isobe et al. |
| 7,732,819 B2 | 6/2010 | Akimoto et al. |
| 7,791,072 B2 | 9/2010 | Kumomi et al. |
| 8,067,775 B2 | 11/2011 | Miyairi et al. |
| 8,237,166 B2 | 8/2012 | Kumomi et al. |
| 8,384,080 B2 | 2/2013 | Taniguchi et al. |
| 8,486,774 B2 | 7/2013 | Terai et al. |
| 8,547,771 B2 | 10/2013 | Koyama |
| 8,674,979 B2 | 3/2014 | Hayakawa |
| 8,692,252 B2 | 4/2014 | Takata et al. |
| 8,847,230 B2 | 9/2014 | Terai et al. |
| 8,896,049 B2 | 11/2014 | Isobe et al. |
| 8,947,158 B2 | 2/2015 | Watanabe |
| 8,995,174 B2 | 3/2015 | Koyama |
| 9,024,317 B2 | 5/2015 | Endo et al. |
| 9,029,851 B2 | 5/2015 | Miyairi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0292615 A1* | 11/2012 | Saito ................... H01L 21/84 257/43 |
| 2013/0191673 A1* | 7/2013 | Koyama ................ G06F 1/26 713/324 |
| 2015/0008428 A1 | 1/2015 | Yamamoto et al. |
| 2015/0011046 A1 | 1/2015 | Tanaka et al. |
| 2015/0054571 A1 | 2/2015 | Watanabe et al. |
| 2015/0149795 A1 | 5/2015 | Watanabe |
| 2015/0228677 A1 | 8/2015 | Miyairi et al. |
| 2015/0263175 A1 | 9/2015 | Koyama |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |

(56) References Cited

FOREIGN PATENT DOCUMENTS

| | | |
|---|---|---|
| JP | 2011-124360 A | 6/2011 |
| JP | 2011-138934 A | 7/2011 |
| JP | 2012-257187 A | 12/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digests of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (M=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

FIG. 14A
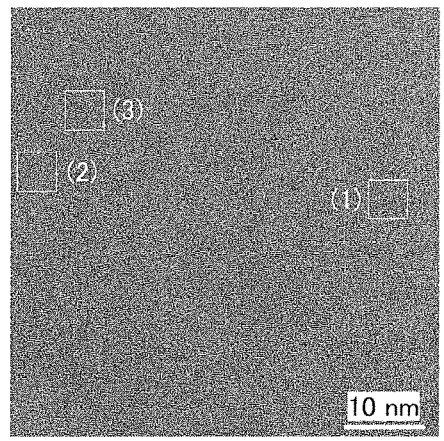
FIG. 14B    FIG. 14C    FIG. 14D
    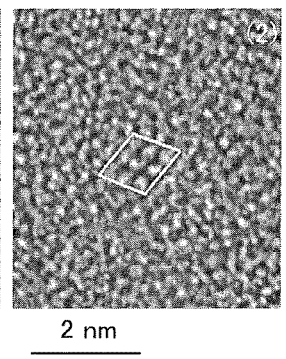    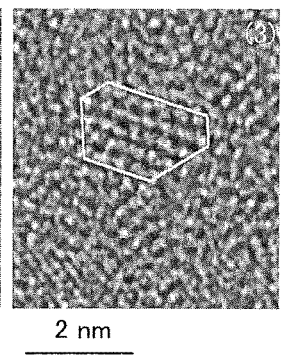

FIG. 15B in-plane method (φ scan) CAAC-OS

FIG. 15C In-plane method (φ scan) Single crystal OS

Sample irradiated with electron
beam parallel to sample surface

Sample irradiated with electron
beam perpendicular to sample
surface

AV ; Application of voltage

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a driving method thereof, and a manufacturing method thereof. In particular, one embodiment of the present invention relates to a semiconductor device, a display device, or a light-emitting device each including an oxide semiconductor.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

The transistor is applied to a wide range of electronic devices such as an integrated circuit (IC) or an image display device (display device). A silicon-based semiconductor material is widely known as a material for a semiconductor that can be used in a transistor. As another material, an oxide semiconductor has been attracting attention.

For example, a transistor including an amorphous oxide semiconductor containing indium (In), gallium (Ga), and zinc (Zn) is disclosed in Patent Document 1.

Techniques for improving carrier mobility by stacking oxide semiconductors are disclosed in Patent Documents 2 and 3.

It is known that a transistor including an oxide semiconductor has an extremely small leakage current when the transistor is off. For example, a low-power-consumption CPU utilizing the small leakage current characteristic of a transistor including an oxide semiconductor is disclosed (see Patent Document 4).

Patent Document

[Patent Document 1] Japanese Published Patent Application No. 2006-165528
[Patent Document 2] Japanese Published Patent Application No. 2011-124360
[Patent Document 3] Japanese Published Patent Application No. 2011-138934
[Patent Document 4] Japanese Published Patent Application No. 2012-257187

SUMMARY OF THE INVENTION

An object of one embodiment of the present invention is to provide a semiconductor device including a transistor with low off-state current. Another object of one embodiment of the present invention is to provide a semiconductor device with low power consumption. Another object of one embodiment of the present invention is to provide a highly reliable semiconductor device. Another object of one embodiment of the present invention is to provide a semiconductor device capable of high-speed writing. Another object of one embodiment of the present invention is to provide a semiconductor device capable of high-speed reading. Another object of one embodiment of the present invention is to provide a semiconductor device capable of retaining data for a long period. Another object of one embodiment of the present invention is to provide a novel semiconductor device. Another object of one embodiment of the present invention is to provide an eye-friendly display device. Another object of one embodiment of the present invention is to provide a semiconductor device including a transparent semiconductor.

Note that the descriptions of these objects do not disturb the existence of other objects. Note that one embodiment of the present invention does not necessarily achieve all the objects listed above. Other objects will be apparent from and can be derived from the description of the specification, the drawings, the claims, and the like.

(1) One embodiment of the present invention is a semiconductor device including a first circuit, a second circuit, and a third circuit. The first circuit has an arithmetic processing function. The second circuit includes a memory circuit. The memory circuit includes a transistor which includes a first conductor, a second conductor, a first insulator, a second insulator, and a semiconductor. The first conductor includes a region overlapping the semiconductor with the first insulator positioned between the first conductor and the semiconductor. The second conductor includes a region overlapping the semiconductor with the second insulator positioned between the second conductor and the semiconductor. The first conductor is capable of selecting on or off of the transistor. The third circuit is electrically connected to the second conductor, and is capable of changing a potential of the second conductor in synchronization with an operation of the transistor.

(2) Another embodiment of the present invention is a semiconductor device including a first circuit, a second circuit, and a third circuit. The first circuit has an arithmetic processing function. The second circuit includes a memory circuit. The memory circuit includes a transistor which includes a first conductor, a second conductor, a first insulator, a second insulator, and a semiconductor. The first conductor includes a region overlapping the semiconductor with the first insulator positioned between the first conductor and the semiconductor. The second conductor includes a region overlapping the semiconductor with the second insulator positioned between the second conductor and the semiconductor. The first conductor is capable of selecting on or off of the transistor. The third circuit applies a positive voltage to the second conductor when the transistor is on. The third circuit is capable of applying zero voltage or a negative voltage to the second conductor when the transistor is off.

(3) Another embodiment of the present invention is a semiconductor device including a first circuit, a second circuit, a third circuit, and a fourth circuit. The first circuit has an arithmetic processing function. The second circuit includes a first memory circuit. The fourth circuit includes a second memory circuit. The first memory circuit includes a first transistor which includes a first conductor, a second conductor, a first insulator, a second insulator, and a first semiconductor. The first conductor includes a region overlapping the first semiconductor with the first insulator positioned between the first conductor and the first semiconductor. The second conductor includes a region overlapping the first semiconductor with the second insulator positioned between the second conductor and the first semiconductor. The first conductor is capable of selecting on or off of the first transistor. The third circuit is electrically connected to the second conductor, and is capable of changing a potential of the second conductor in synchronization with an operation of the first transistor. The fourth circuit includes a second transistor which includes a third conductor, a fourth conductor, a third insulator, a fourth insulator, a second semiconductor, and an electron trap layer. The third conductor includes a region overlapping the second semiconductor with the third insulator positioned between the third conductor and the second semiconductor. The fourth conductor includes a region overlapping the second semiconductor with the fourth insulator and the electron trap layer positioned between the fourth conductor and the second semiconductor. The third conductor is capable of selecting on or off of the second transistor. An interface between the electron trap layer and the fourth insulator has negative fixed charge.

(4) Another embodiment of the present invention is a semiconductor device including a first circuit, a second circuit, a third circuit, and a fourth circuit. The first circuit has an arithmetic processing function. The second circuit includes a first memory circuit. The fourth circuit includes a second memory circuit. The first memory circuit includes a first transistor which includes a first conductor, a second conductor, a first insulator, a second insulator, and a first semiconductor. The first conductor includes a region overlapping the first semiconductor with the first insulator positioned between the first conductor and the first semiconductor. The second conductor includes a region overlapping the first semiconductor with the second insulator positioned between the second conductor and the first semiconductor. The first conductor is capable of selecting on or off of the first transistor. The third circuit applies a positive voltage to the second conductor when the first transistor is on. The third circuit is capable of applying no voltage or a negative voltage to the second conductor when the first transistor is off. The fourth circuit includes a second transistor which includes a third conductor, a fourth conductor, a third insulator, a fourth insulator, a second semiconductor, and an electron trap layer. The third conductor includes a region overlapping the second semiconductor with the third insulator positioned between the third conductor and the second semiconductor. The fourth conductor includes a region overlapping the second semiconductor with the fourth insulator and the electron trap layer positioned between the fourth conductor and the second semiconductor. The third conductor is capable of selecting on or off of the second transistor. An interface between the electron trap layer and the fourth insulator has negative fixed charge.

(5) Another embodiment of the present invention is the semiconductor device according to any one of (1) to (4), in which the electron trap layer contains one of hafnium oxide, aluminum oxide, tantalum oxide, and aluminum silicate.

(6) Another embodiment of the present invention is the semiconductor device according to any one of (1) to (5), in which the electron trap layer has crystallinity.

(7) Another embodiment of the present invention is the semiconductor device according to any one of (1) to (6), in which an electron is introduced to the electron trap layer by heating.

(8) Another embodiment of the present invention is the semiconductor device according to any one of (1) to (7), in which introduction of an electron to the electron trap layer is performed by heating and application of a potential to a second electrode.

A semiconductor device or the like including a transistor with low off-state current can be provided. A semiconductor device with low power consumption can be provided. A highly reliable semiconductor device can be provided. A semiconductor device capable of high-speed writing can be provided. A semiconductor device capable of retaining data for a long period can be provided A semiconductor device capable of high-speed reading can be provided. A novel semiconductor device can be provided. An eye-friendly display device can be provided. A semiconductor device including a transparent semiconductor can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 14A to 14D are Cs-corrected high-resolution TEM images of a plane of a CAAC-OS.

FIGS. 15A to 15C show structural analysis of a CAAC-OS and a single crystal oxide semiconductor by XRD.

DETAILED DESCRIPTION OF THE INVENTION

Figure 1A:
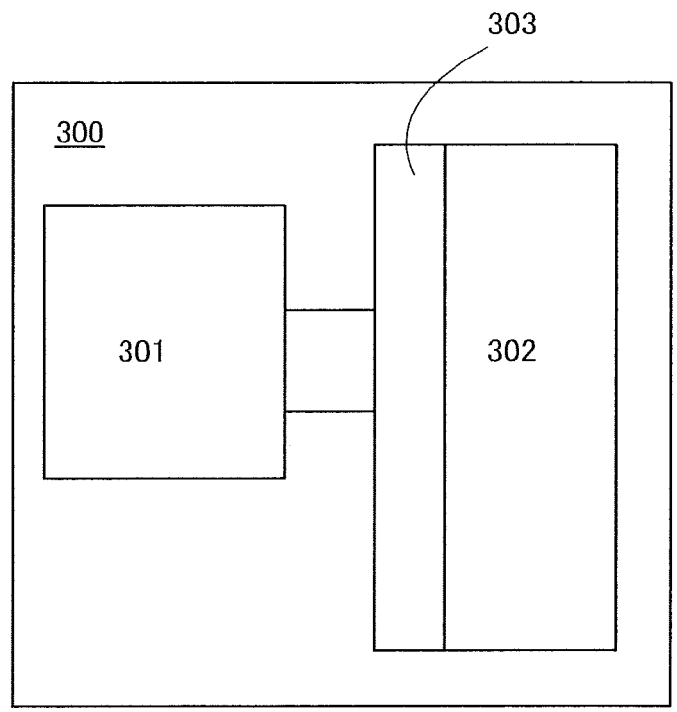
FIGS. 1A and 1B are block diagrams each illustrating a semiconductor device of one embodiment of the present invention.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of the embodiments below.

Note that in structures of the present invention described below, the same portions or portions having similar functions are denoted by the same reference numerals in different drawings, and description thereof is not repeated in some cases. Further, the same hatching pattern is applied to portions having similar functions, and the portions are not especially denoted by reference numerals in some cases.

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

Note that in this specification and the like, ordinal numbers such as "first" and "second" are used in order to avoid confusion among components and do not limit the components numerically.

Note that in each drawing described in this specification, the size, the layer thickness, or the region of each component is exaggerated for clarity in some cases. Therefore, embodiments of the present invention are not limited to such a scale.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Unless otherwise specified, the off-state current in this specification refers to a drain current of a transistor in the off state (also referred to as non-conduction state and cutoff state). Unless otherwise specified, the off state of an n-channel transistor means that a voltage (Vgs) between its gate and source is lower than the threshold voltage (Vth), and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. Thus, "the off-state current of a transistor is lower than or equal to I" may mean "there is Vgs with which the off-state current of the transistor becomes lower than or equal to I". Furthermore, "the off-state current of a transistor" means "the off-state current in an off state at predetermined Vgs", "the off-state current in an off state at Vgs in a predetermined range", "the off-state current in an off state at Vgs with which sufficiently reduced off-state current is obtained", or the like.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range of −0.8 V to −0.5 V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value per the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is Vgs at which the off-state current of a transistor is lower than or equal to I at room temperature, 60° C., 85° C., 95° C., 125° C., a temperature at which the reliability of a semiconductor device or the like including the transistor is ensured, or a temperature at which the semiconductor device or the like including the transistor is used (e.g., temperature in the range of 5° C. to 35° C.).

The off-state current of a transistor depends on voltage Vds between its drain and source in some cases. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at Vds at which the reliability of a semiconductor device or the like including the transistor is ensured or Vds at which the semiconductor device or the like including the transistor is used. The description "an off-state current of a transistor is lower than or equal to I" may refer to a situation where there is Vgs at which the off-state current of a transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, Vds at which the reliability of a semiconductor device or the like including the transistor is ensured, or Vds at which in the semiconductor device or the like including the transistor is used.

In this specification, the term "leakage current" sometimes expresses the same meaning as off-state current.

In this specification, the off-state current sometimes refers to a current that flows between a source and a drain when a transistor is off, for example.

(Embodiment 1)

In this embodiment, a semiconductor device including a central arithmetic processing circuit, a data memory circuit, and a control circuit is described.

FIG. 1A is a block diagram of a semiconductor device 300 of one embodiment of the present invention. The semiconductor device 300 includes a central arithmetic processing circuit 301, a data memory circuit 302, and a control circuit 303. The data memory circuit 302 is electrically connected to the control circuit 303 which can change a back gate potential of a data memory transistor in synchronization with writing and retention operations.

Figure 2:
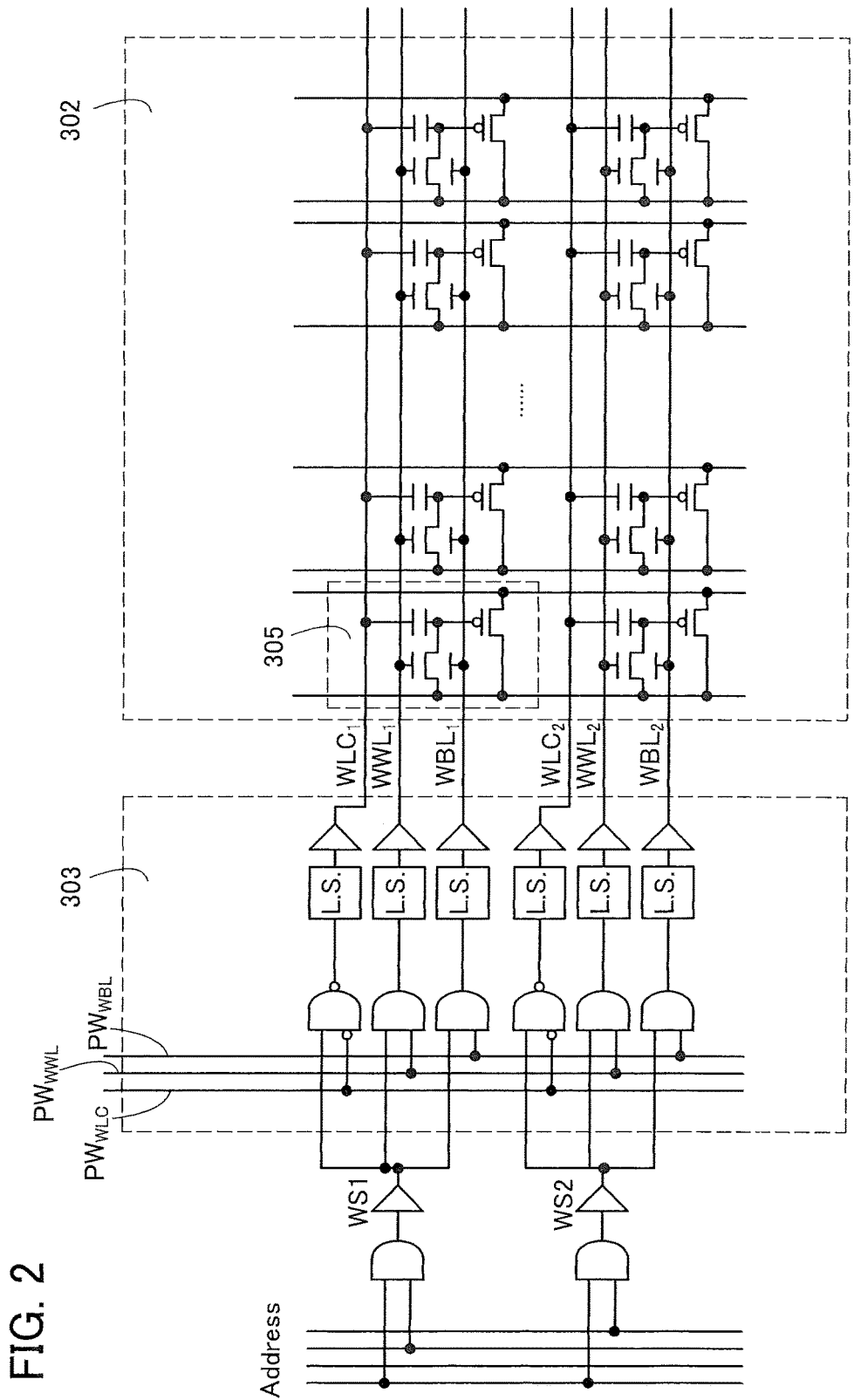
FIG. 2 is a circuit diagram of a semiconductor device of one embodiment of the present invention.
Figure 3A:
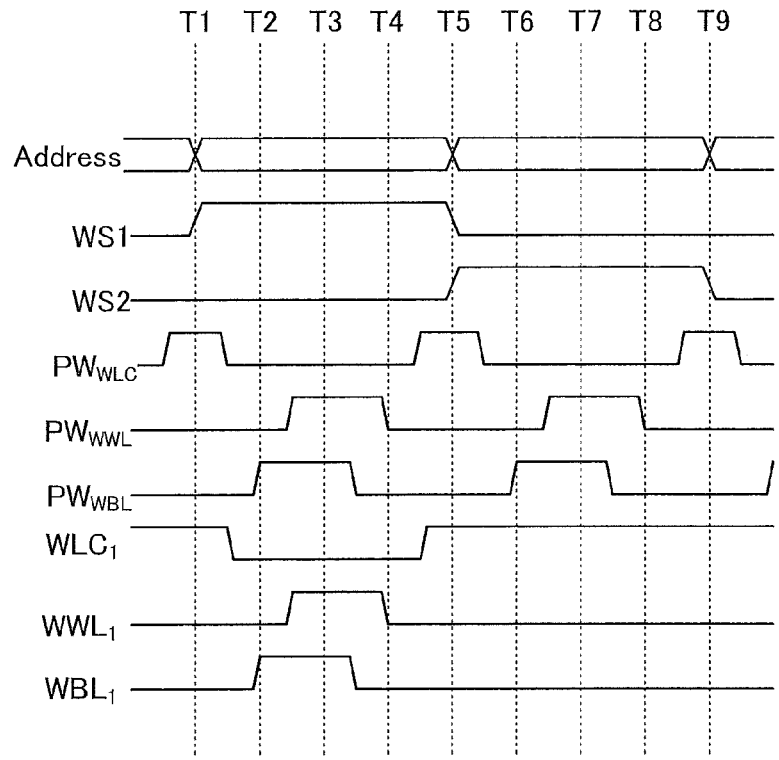
FIGS. 3A and 3B are a timing chart of signals and a circuit diagram of a semiconductor device of one embodiment of the present invention.

FIG. 2 illustrates an example of the control circuit 303 electrically connected to the data memory circuit 302. FIG. 3A is a timing chart showing electrical signals for operating the control circuit 303. In the timing chart, vertical dotted lines at regular time intervals are illustrated as T1 to T9 to easily recognize each timing of operations, e.g., the timing of an operation for setting an electrical signal to Low or High. Furthermore, signal names such as Address and $PW_{WLC}$ written for signal lines of the circuit in FIG. 2 correspond to signal names written in the timing chart of FIG. 3A.

Figure 3B:
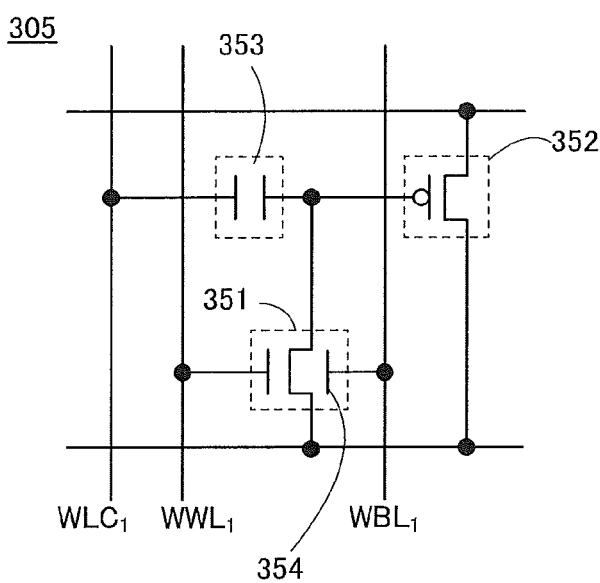

FIG. 3B illustrates a memory cell 305 which is extracted from the data memory circuit 302 in FIG. 2. The memory cell 305 in FIG. 3B includes a transistor 351 in which an oxide semiconductor is used as a channel formation region, a transistor 352 in which, for example, another semiconductor is used as a channel formation region, and a capacitor 353. The transistor 351 includes a back gate electrode 354. An operation of writing data to the data memory circuit 302 and an operation of retaining data are described with reference to FIGS. 3A and 3B.

First, $WWL_1$ is Low at the timing T1, whereby the transistor 351 is turned off. Changing $WLC_1$ from High to Low at the timing between T1 and T2 causes a state where data can be written to the memory cell 305. $WBL_1$ is changed from Low to High at T2, whereby potential is applied to the back gate electrode 354. As a result, when the transistor 351 is on, the threshold voltage of the transistor 351 can be lower than that of the transistor 351 in the state where no potential is applied to the back gate electrode 354. Next, $WWL_1$ is changed from Low to High at the timing between T2 and T3, whereby the transistor 351 is turned on.

At that time, data is written. Since the threshold voltage of the transistor 351 shifts in the negative direction as described above, the on-state current of the transistor 351 is larger than that of the transistor 351 whose threshold voltage does not shift in the negative direction. Accordingly, time needed for accumulating charge in the capacitor 353 can be shortened. That is, data can be written at high speed. Then, $WBL_1$ is returned from High to Low at the timing between T3 and T4, whereby the memory cell 305 is again returned to the state where no potential is applied to the back gate electrode 354 of the transistor 351. As a result, the threshold voltage of the transistor 351 can also be returned to the value in the state where no potential is applied to the back gate electrode 354. Next, $WWL_1$ is returned from High to Low, for example 0 V or negative voltage, at T4 to turn off the transistor 351 and changing $WLC_1$ from Low to High at the timing between T4 and T5; as a result, the off-state current of the transistor 351 becomes low, which makes it possible to retain charge which has been accumulated in the capacitor 353. In this manner, by the series of operations of the control circuit 303 in accordance with the timing chart shown in FIG. 3A, data can be written to the data memory circuit at high speed. Furthermore, the data can be retained for a long period.

(Embodiment 2)

In this embodiment, a semiconductor device including a data memory circuit and a program memory circuit is described.

Figure 1B:
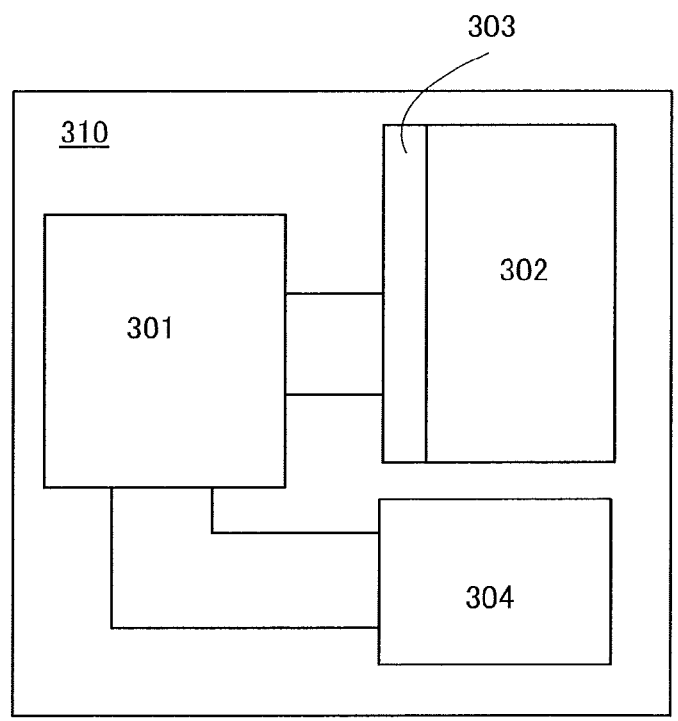

FIG. 1B is a block diagram of a semiconductor device 310 of one embodiment of the present invention. The semiconductor device 310 includes the central arithmetic processing circuit 301, the data memory circuit 302, the control circuit 303, and a program memory circuit 304. The data memory circuit 302 is electrically connected to the control circuit 303 which can change a back gate potential of a data memory transistor in synchronization with writing and retention operations. The program memory circuit 304 includes a transistor. The transistor includes an electron trap layer. The data memory circuit 302 is provided near the control circuit 303 and required to operate at high speed; however, the data retention period thereof is short. Therefore, the structure described in Embodiment 1 is preferable, that is, the data memory circuit 302 is preferably electrically connected to the control circuit 303 which can change the back gate potential of the data memory transistor in synchronization with a writing operation. On the other hand, it is more important for the program memory circuit 304 to retain data for a long period than to operate at high speed. Thus, it is preferable that the program memory circuit 304 be formed using a transistor including an electron trap layer, which is described later in Embodiment 3, to extend the retention period for memory data.

The operation for writing data to the data memory circuit 302 and the operation for retaining data are as described in Embodiment 1. By application of voltage to a back gate electrode of the transistor included in the program memory circuit 304, electrons are injected to the electron trap layer. The threshold voltage of the transistor shifts in the positive direction owing to charge of the electrons; thus, the drain current of the transistor at a given value of Vgs becomes small. For example, when it is possible to reduce the drain current of the transistor at Vgs of 0 V, program data or the like can be retained for a long period even without application of a power supply potential. Application of voltage to the back gate electrode need not be performed at all times; for example, it may be performed one time when an operational test of the semiconductor device is carried out, for example. Note that the back gate electrode may be set to an earth potential after application of voltage to the back gate electrode. For example, the back gate electrode may be electrically connected to a wiring, an electrode, or the like which is electrically connected to an earth electrode. Setting the back gate electrode to the earth potential stabilizes the transistor characteristics to stabilize the operation of the semiconductor device in some cases. The data memory circuit 302 may include an electron trap layer. The electron trap layer does not affect the operation of the control circuit. In this manner, two memory circuits with different configurations enable the semiconductor device to perform writing of data at high speed and retain program data for a long period. Furthermore, the power consumption of the semiconductor device can be reduced.

(Embodiment 3)

Figure 4A:
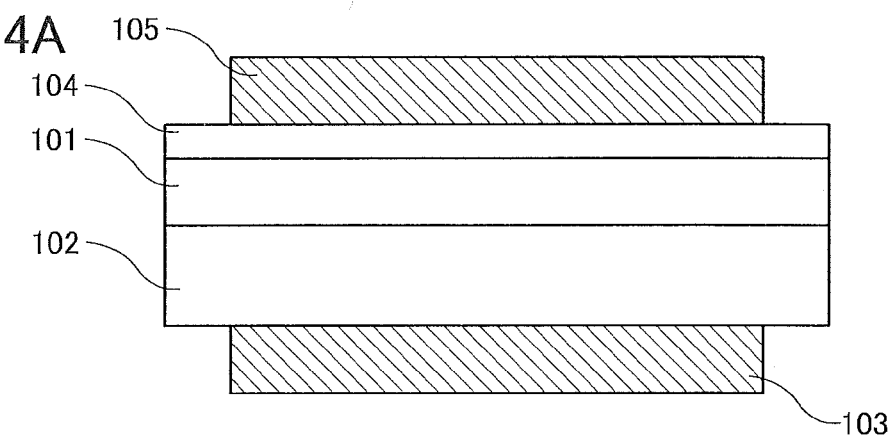
FIGS. 4A to 4C illustrate examples of a semiconductor device of an embodiment.

In this embodiment, a structure of a semiconductor device including a semiconductor, an electron trap layer, and a gate electrode, the principle of operation of the semiconductor device, and a circuit that uses the semiconductor device are described. Use of a transistor illustrated in FIG. 4A in the data memory circuit 302, and use of a transistor illustrated in any of FIGS. 4B and 4C and FIG. 5 in the program memory circuit 304 make it possible to perform high-speed writing of data in the data memory circuit 302 and to retain data in the program memory circuit 304 for a long period. FIG. 4A illustrates a semiconductor device including a semiconductor 101, an insulator 102, a gate electrode 103, an insulator 104, and a gate electrode 105. The insulators 102 and 104 each function as a gate insulating film.

Figure 4B:
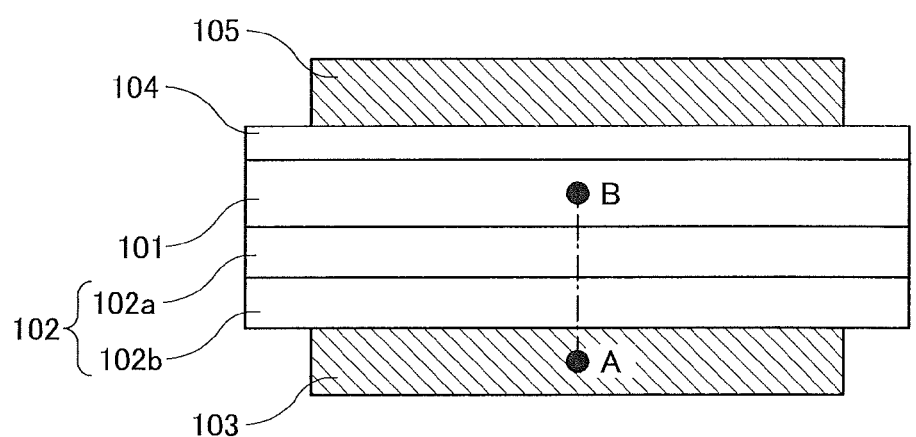

Here, the transistor illustrated in FIG. 4B includes the insulator 102 which is a stack of an insulator 102a and the electron trap layer 102b, for example. Alternatively, the transistor illustrated in FIG. 4C includes the insulator 102 which is a stack of the insulator 102a, the electron trap layer 102b, and an insulator 102c. Alternatively, the insulator 102 may be a stack of more insulators. Alternatively, as illustrated in FIG. 5, a conductor 102d which is electrically insulated may be included in an insulator 102e. The insulator 102e may be formed of a plurality of insulators. That is, a stacked structure between the semiconductor 101 and the gate electrode 103 of the transistor illustrated in FIG. 4A is different from a stacked structure between the semiconductor 101 and the gate electrode 103 of each of the transistors illustrated in FIGS. 4B and 4C and FIG. 5.

Figure 4C:
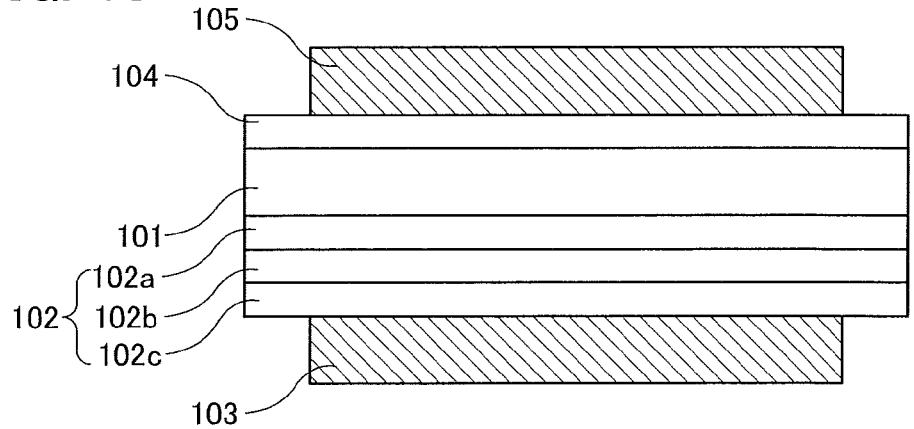
Figure 5:
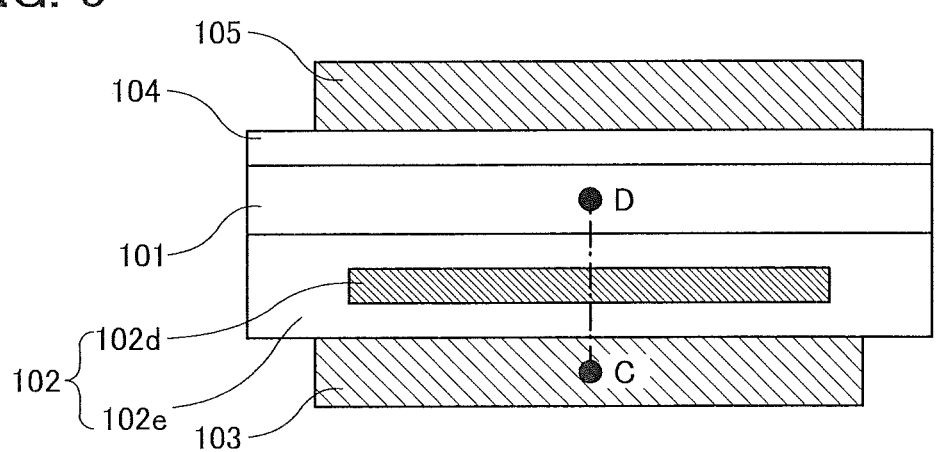
FIG. 5 illustrates an example of a semiconductor device of an embodiment.

The insulator 102 illustrated in FIG. 4A, the insulator 102a illustrated in FIGS. 4B and 4C, the insulator 102c illustrated in FIG. 4C, and the insulator 102e illustrated in FIG. 5 can be formed using an insulator containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The electron trap layer 102b can be formed using an insulator containing one or more of hafnium oxide, aluminum oxide, aluminum silicate, and the like. Note that each thickness of the insulators 102a, 102c, and 102e is greater than or equal to 1 nm and less than or equal to 30 nm. The thickness of the electron trap layer 102b is greater than or equal to 1 nm and less than or equal to 100 nm.

Note that the transistor illustrated in FIG. 4A can be formed at the same time through the same process as the transistors illustrated in FIGS. 4B and 4C and FIG. 5. In this process, the semiconductors 101 of the transistors, the gate electrodes 103 of the transistors, the insulators 104 of the transistors, and the gate electrodes 105 of the transistors can each be formed at the same step. On the other hand, a process for forming the insulator 102 of the transistor illustrated in FIG. 4A may include a step of etching the electron trap layer 102b. As a result, the transistor without the electron trap layer 102b illustrated in FIG. 4A can be manufactured.

Figure 6A:
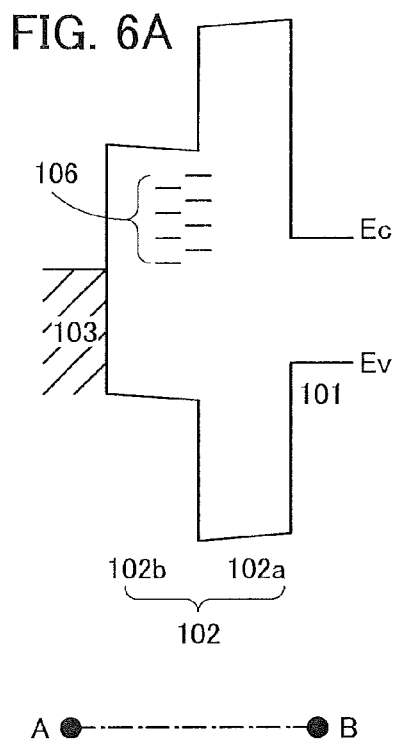
FIGS. 6A to 6D illustrate band diagram examples of a semiconductor device of an embodiment.

FIG. 6A illustrates a band diagram example of the semiconductor device illustrated in FIG. 4B, from Point A to Point B. In FIG. 6A, Ec denotes the conduction band minimum and Bv denotes the valence band maximum. In FIG. 6A, the potential of the gate electrode 103 is equal to that of a source electrode or a drain electrode (not shown).

In this example, the energy gap of the insulator 102a is larger than that of the electron trap layer 102b. Furthermore, the electron affinity of the insulator 102a is smaller than that of the electron trap layer 102b; however, one embodiment of the present invention is not limited thereto.

Figure 6B:
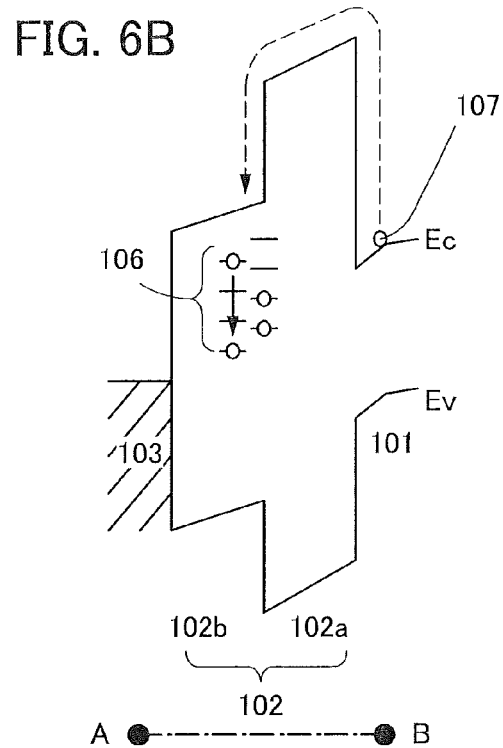

Electron trap states 106 exist at the interface between the insulator 102a and the electron trap layer 102b and/or in the electron trap layer 102b. FIG. 6B shows the state where the potential of the gate electrode 103 is higher than that of the source or drain electrode. The potential of the gate electrode 103 may be higher than that of the source or drain electrode by 1 V or more. The potential of the gate electrode 103 may be lower than the highest potential applied to the gate electrode 105 after this process. The potential may be typically less than 4 V. Alternatively, the potential may be less than 50 V.

At this time, the potential of the gate electrode 105 is preferably the same as the potential of the source or drain electrode. Electrons 107 that exist in the semiconductor 101 move toward the gate electrode 103 having a higher potential. Some of the electrons 107 moving from the semiconductor 101 toward the gate electrode 103 are trapped by the electron trap states 106.

There are some processes to enable the electrons 107 to go over the barrier of the insulator 102a to reach the electron trap layer 102b. The first is a process by the tunnel effect. The thinner the insulator 102a is, the more prominent the tunnel effect is. However, in this case, the electrons trapped in the electron trap states 106 may flow out due to the tunnel effect.

Even when the insulator 102a is relatively thick, the tunnel effect (Fowler-Nordheim tunnel effect) can be obtained by application of an appropriate voltage to the gate electrode 103. In the case of the Fowler-Nordheim tunnel effect, a tunnel current increases with the square of the electric field between the gate electrode 103 and the semiconductor 101.

The second is the process that the electrons 107 hop from trap states to trap states in the energy gap such as defect states in the insulator 102a to reach the electron trap layer 102b. This is a conduction mechanism called Poole-Frenkel conduction, in which as the absolute temperature is higher and trap states are shallower, the electric conductivity is higher.

The third is the process that the electrons 107 go over the barrier of the insulator 102a by thermal excitation. The distribution of electrons existing in the semiconductor 101 follows the Fermi-Dirac distribution; in general, the proportion of electrons having high energy is larger as the temperature is higher. Assuming that the density of electrons having energy 3 eV higher than the Fermi level at 300 K (27° C.) is 1, for example, the density is $6 \times 10^{16}$ at 450 K (177° C.), $1.5 \times 10^{25}$ at 600 K (327° C.), and $1.6 \times 10^{30}$ at 750 K (477° C.).

The movement of the electrons 107 toward the gate electrode 103 by going over the barrier of the insulator 102a occurs by the above three processes or the combination of these processes. In particular, the second and the third processes indicate that current increases exponentially as the temperature is higher.

Also, the Fowler-Nordheim tunnel effect in the first process is more likely to occur as the density of electrons in a thin part (a high-energy portion) of a barrier layer of the insulator 102a is higher; thus, a higher temperature is better.

Note that in most cases, current flowing in the above processes is weak in particular when the potential of the gate electrode 103 is low (5 V or lower). However, by taking a long time for the process, the needed number of electrons can be trapped by the electron trap states 106. As a result, the insulator 102 is negatively charged.

In other words, the potential of the gate electrode 103 is kept higher than that of the source or drain electrode at a high temperature (a temperature higher than the operating temperature or the storage temperature of the semiconductor device, or higher than or equal to 125° C. and lower than or equal to 450° C., typically higher than or equal to 150° C. and lower than or equal to 300° C.) for 1 second or longer, typically 1 minute or longer, or 5 milliseconds or longer and shorter than 10 seconds, and typically 3 seconds. As a result, a necessary number of electrons moves from the semiconductor 101 toward the gate electrode 103 and some of them are trapped by the electron trap states 106. The temperature of the process for trapping electrons is referred to as process temperature below.

Here, the number of electrons trapped by the electron trap states 106 can be controlled by the potential of the gate electrode 103. When a certain number of electrons is trapped by the electron trap states 106, due to the electric charge, the electric field of the gate electrode 103 is blocked and a channel formed in the semiconductor 101 disappears.

The total number of electrons trapped by the electron trap states 106 increases linearly at first, and then, the rate of increase gradually decreases, and the total number of electrons converges at a certain value. The convergence value depends on the potential of the gate electrode 103. As the potential is higher, the number of trapped electrons is more likely to be large; however, it never exceeds the total number of electron trap states 106.

The electrons trapped by the electron trap states 106 are required not to transfer from the insulator 102 to the other regions. For this, each thickness of the insulators 102a and the electron trap layer 102b is preferably set at a thickness at which the tunnel effect is not a problem. For example, each physical thickness of the insulator 102a and the electron trap layer 102b is preferably greater than 1 nm.

Typically, the thickness of the insulator 102a is greater than or equal to 10 nm and less than or equal to 20 nm, and the equivalent silicon oxide thickness of the electron trap layer 102b is greater than or equal to 10 nm and less than or equal to 25 nm.

A reduction in the operation temperature or storage temperature of the semiconductor device can prevent electrons trapped by the electron trap states 106 from flowing outwardly. For example, the probability that electrons go over a 3 eV-barrier when the storage temperature of the semiconductor device is 120° C. is less than one hundred-thousandth of that when process temperature is 300° C.

It is also effective that the effective mass of a hole is extremely large or is substantially localized in the semiconductor 101. In this case, the injection of holes from the semiconductor 101 to the insulator 102a and the electron trap layer 102b does not occur and consequently a phenomenon in which electrons trapped by the electron trap states 106 bond to holes and disappear does not occur.

A material showing Poole-Frenkel conduction may be used for the electron trap layer 102b. The Poole-Frenkel conduction is, as described above, electron hopping conduction between defect states and the like in a material. A material including a large number of defect states or including deep defect states has low electric conductivity and consequently can hold electrons trapped by the electron trap states 106 for a long period.

Circuit design and/or material selection may be made so that no voltage at which electrons trapped in the insulator 102a and/or the electron trap layer 102b are released is applied. For example, in a material whose effective mass of holes is extremely large or is substantially localized, such as an In—Ga—Zn-based oxide semiconductor, a channel is formed when the potential of the gate electrode 103 is higher than that of the source or drain electrode; however, when the potential of the gate electrode 103 is lower than that of the source or drain electrode, the material shows characteristics similar to an insulator. In this case, the electric field between the gate electrode 103 and the semiconductor 101 is extremely small and consequently the Fowler-Nordheim tunnel effect or electron conduction according to the Poole-Frenkel conduction is significantly decreased.

To hold electrons trapped by electron trap states inside the electron trap layer 102b or at the interface with another insulator, it is effective that the insulator 102 is formed using three insulators as illustrated in FIG. 4C, that the electron affinity of the insulator 102c is smaller than that of the electron trap layer 102b, and that the energy gap of the insulator 102c is larger than that of the electron trap layer 102b.

In this case, if the physical thickness of the insulator 102c is large enough, electrons trapped by the electron trap states 106 can be held even when the electron trap layer 102b has a small thickness. As a material of the insulator 102c, the same material as or a material similar to that of the insulator 102a can be used. Alternatively, a material whose constituent elements are the same as those of the electron trap layer 102b but number of electron trap states is small enough may be used. The number (density) of electron trap states depends on the formation method.

Figure 6C:
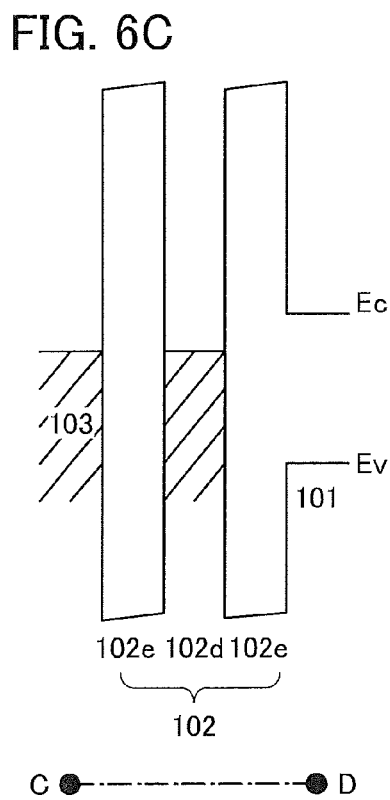

Note that when the electrically insulated conductor 102d is provided in the insulator 102e as illustrated in FIG. 5, electrons are trapped in the conductor 102d according to the above principle. In FIG. 6C, the potential of the gate electrode 103 is equal to that of the source or drain electrode.

Figure 6D:
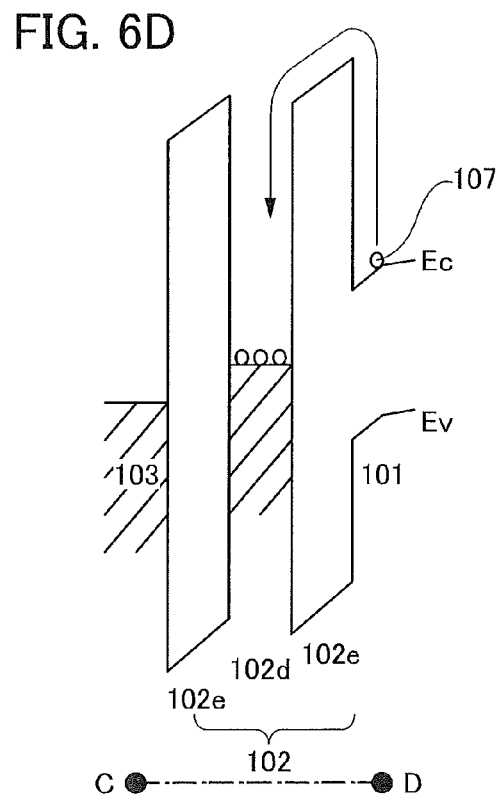

FIG. 6D shows the state where the potential of the gate electrode 103 is higher than the potential of the source or drain electrode. The electrons 107 that exist in the semiconductor 101 move toward the gate electrode 103 having a higher potential. Some of the electrons moving from the semiconductor 101 toward the gate electrode 103 are trapped in the conductor 102d. In other word, in the semiconductor device illustrated in FIG. 5, the conductor 102d functions as the electron trap states 106 in the semiconductor device in FIG. 4B.

When the work function of the conductor 102d is large, an energy barrier to the insulator 102e is high and consequently the electrons trapped by the electron trap states 106 can be prevented from flowing outwardly.

In the above structure, each of the insulator 102a, the electron trap layer 102b, and the insulator 102c may be composed of a plurality of insulators. A plurality of insulators containing the same constituting elements and formed by different formation methods may be used.

For example, when the insulators 102a and the electron trap layer 102b are formed using insulators composed of the same constituting elements (e.g., hafnium oxide), the insulator 102a may be formed by a chemical vapor deposition (CVD) method or an atomic layer deposition (ALD) method, and the electron trap layer 102b may be formed by a sputtering method.

Note that any of various CVD methods can be used. Examples of the CVD methods include a thermal CVD method, an optical CVD method, a plasma CVD method, an metal organic CVD (MOCVD) method, and a low pressure CVD (LPCVD) method. Thus, insulators may be formed by different CVD methods.

In general, an insulator formed by a sputtering method has more defects and stronger electron trapping characteristics than an insulator formed by a CVD method or an ALD method. From this reason, the electron trap layer 102b may be formed by a sputtering method and the insulator 102c may be formed by a CVD method or an ALD method when the electron trap layer 102b and the insulator 102c contain the same constituent elements.

When the electron trap layer 102b is formed using a plurality of insulators containing the same constituent elements, one insulator may be formed by a sputtering method and another insulator may be formed by a CVD method or an ALD method.

Figure 7A:
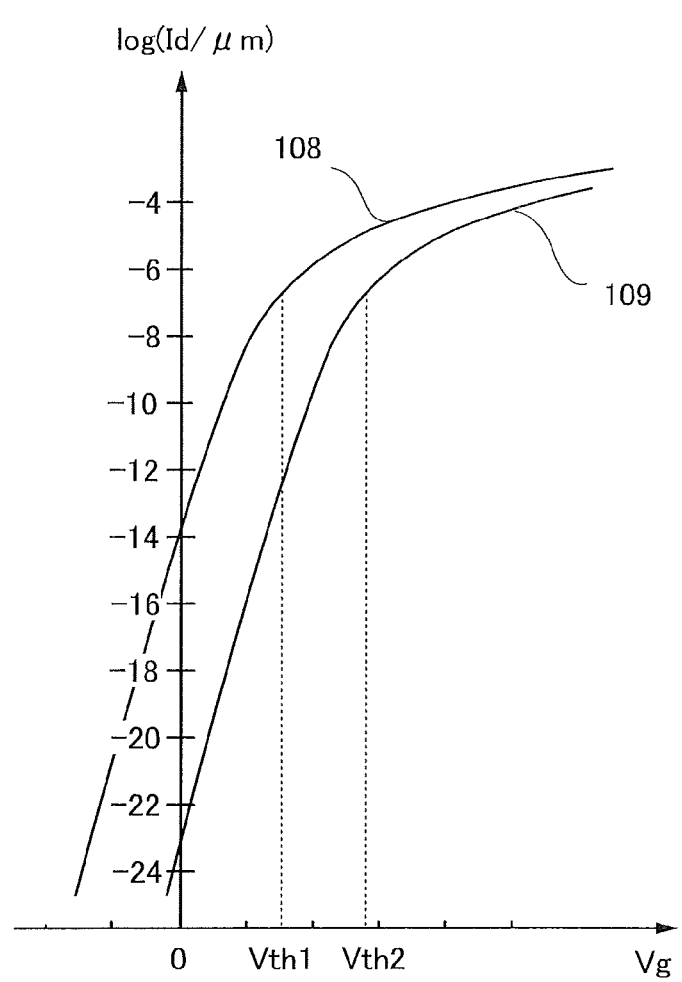
FIG. 7A schematically shows characteristics of a semiconductor device of an embodiment and FIG. 7B illustrates an example of a circuit in which the semiconductor device is used.

As described above, the threshold voltage of the semiconductor device is increased by the trap of electrons in the insulator 102 as illustrated in FIG. 7A. In particular, when the semiconductor 101 is formed using a material with a large energy gap (wide energy gap material), a current between the source and drain when the potentials of the gate electrodes 103 and 105 are each equal to the potential of the source or drain electrode can be significantly reduced.

For example, the drain current density at a gate voltage of 0 V (a current value per micrometer of a channel width) of an In—Ga—Zn oxide semiconductor whose energy gap is 3.2 eV can be less than or equal to 1 zA/μm ($1\times10^{-21}$ A/μm), typically less than or equal to 1 yA/μm ($1\times10^{-24}$ A/μm).

FIG. 7A schematically shows dependence of current per micrometer of channel width (Id/pa) between the source and drain electrodes on the potential of the gate electrode 105 (Vg) at room temperature, before and after electron trap in the insulator 102. Note that each potential of the source electrode and the gate electrode 103 is 0 V and the potential of the drain electrode is +1 V. Although current smaller than 1 fA cannot be measured directly, it can be estimated from a value measured by another method, the subthreshold swing value (SS value), and the like.

As indicated by a curve 108, the threshold voltage of the semiconductor device is Vth1 at first. After electron trapping, the threshold voltage increases (shifts in the positive direction) to become Vth2. As a result, the current density at Vg=0 becomes 1 aA/μm ($1\times10^{-18}$ A/μm) or less, for example, greater than or equal to 1 zA/μm and less than or equal to 1 yA/μm.

Figure 7B:
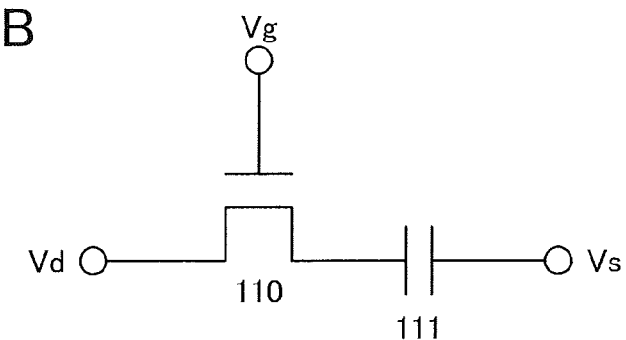

FIG. 7B illustrates a circuit in which charge stored in a capacitor 111 is controlled by a transistor 110. Leakage current between electrodes of the capacitor 111 is ignored. The capacitance of the capacitor 111 is 1 fF, the potential of the capacitor 111 on the transistor 110 side is +1 V, and the potential of Vd is 0 V.

The curve 108 in FIG. 7A denotes the Id-Vd characteristics of the transistor 110 and the channel width is 0.1 μm, in which case the drain current density at a gate voltage of 0 V is approximately 1 fA and the resistivity of the transistor 110 at this time is approximately $1\times10^{15}\Omega$. Accordingly, the time constant of a circuit composed of the transistor 110 and the capacitor 111 is approximately one second. This means that most of the charge stored in the capacitor 111 is lost in approximately one second.

The curve 109 in FIG. 7A denotes the Id-Vd characteristics of the transistor 110 and the channel width is 0.1 μm, in which case the drain current density at a gate voltage of 0 V is approximately 1 yA and the resistivity of the transistor 110 at this time is approximately $1\times10^{24}\Omega$. Accordingly, the time constant of the circuit composed of the transistor 110 and the capacitor 111 is approximately $1\times10^{9}$ seconds (=approximately 31 years). This means that one-third of the charge stored in the capacitor 111 is left after 10 years.

From this, charge can be held for 10 years in a simple circuit composed of a transistor and a capacitor without applying such a large voltage. This can be applied to various kinds of memory devices.

(Embodiment 4)

In this embodiment, a semiconductor device of one embodiment of the present invention is described with reference to drawings. Although a transistor in which a gate electrode for controlling a threshold voltage exists between a substrate and a semiconductor is mainly described below, a transistor in which a semiconductor exists between a gate electrode for controlling a threshold voltage and a substrate may be used. Alternatively, a transistor including a first gate electrode, a second gate electrode, in which the first gate electrode is between a substrate and a semiconductor and the semiconductor is between the first gate electrode and the second gate electrode may be used.

Figure 8A:
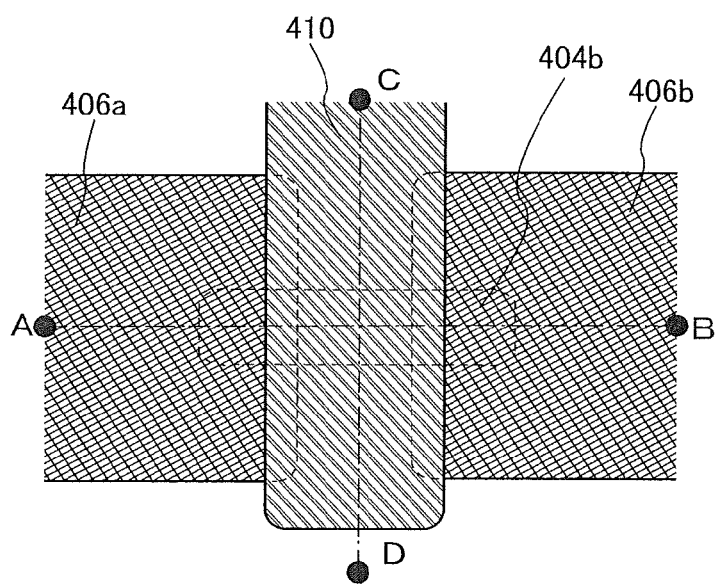
FIGS. 8A to 8C are a top view and cross-sectional views illustrating a transistor.
Figure 8B:
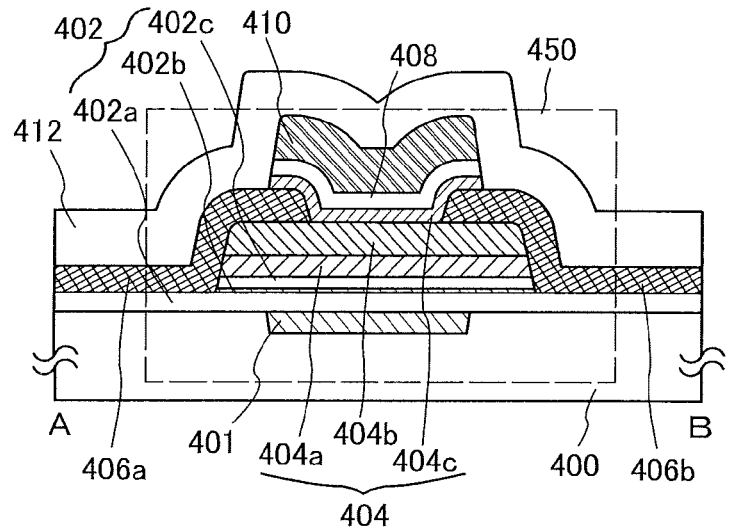
Figure 8C:
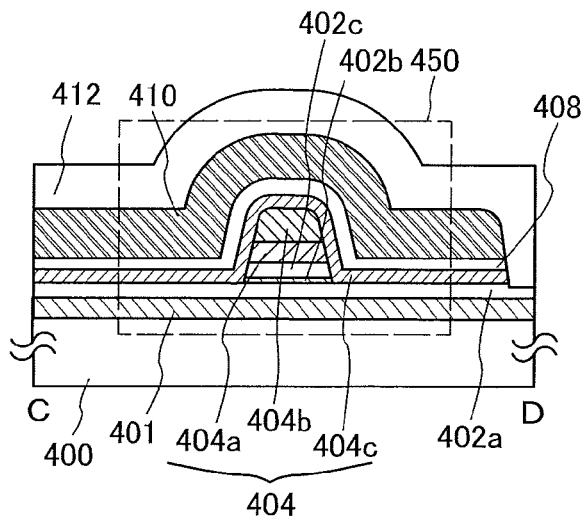

FIGS. 8A to 8C are a top view and cross-sectional views which illustrate a transistor of one embodiment of the present invention. FIG. 8A is the top view. FIG. 8B illustrates a cross section taken along the dashed-dotted line A-B in FIG. 8A. FIG. 8C illustrates a cross section taken along the dashed-dotted line C-D in FIG. 8A. Note that for simplification of the drawing, some components in the top view in FIG. 8A are not illustrated. In some cases, the direction of the dashed-dotted line A-B is referred to as a channel length direction, and the direction of the dashed-dotted line C-D is referred to as a channel width direction.

A transistor 450 illustrated in FIGS. 8A to 8C includes a gate electrode 401 embedded in a substrate 400; an insulator 402a over the substrate 400 and the gate electrode 401; an electron trap layer 402b over the insulator 402a; an insulator 402c over the electron trap layer 402b; an oxide semiconductor 404a over the insulator 402c; an oxide semiconductor 404b over the oxide semiconductor 404a; a source electrode 406a and a drain electrode 406b that are over the insulator 402a and includes regions in contact with side surfaces of the electron trap layer 402b, side surfaces of the insulator 402c, side surfaces of the oxide semiconductor 404a, and side and top surfaces of the oxide semiconductor 404b; an oxide semiconductor 404c including a region in contact with a top surface of the insulator 402a, the side surfaces of the electron trap layer 402b, the side surfaces of the insulator 402c, the side surfaces of the oxide semiconductor 404a, the side and top surfaces of the oxide semiconductor 404b, and the source and drain electrodes 406a and 406b; a gate insulator 408 over the oxide semiconductor 404c; a gate electrode 410 that is over and in contact with the gate insulator 408 and faces the top and side surfaces of the oxide semiconductor 404b; and an oxide insulator 412 over the source electrode 406a, the drain electrode 406b, and the gate electrode 410.

In addition, a base insulator 402 includes the insulator 402a, the electron trap layer 402b, and the insulator 402c.

The oxide semiconductors 404a, 404b, and 404c are collectively referred to as a multilayer semiconductor 404.

In the case where a material used as the electron trap layer 402b has a high relative dielectric constant, the electron trap layer 402b can be formed thick. For example, in the case of using hafnium oxide with a relative dielectric constant of 16, the electron trap layer 402b can be formed approximately four times as thick as the electron trap layer 402b using silicon oxide with a relative dielectric constant of 3.9. The increase in the thickness of the electron trap layer 402b is preferable in terms of preventing the leakage of trapped electrons. Note that each thickness of the insulator 402a and the insulator 402c is greater than or equal to 1 nm and less than or equal to 30 nm, typically greater than or equal to 10 nm and less than or equal to 20 nm. The thickness of the electron trap layer 402b is greater than or equal to 1 nm and less than or equal to 100 nm, typically greater than or equal to 5 nm and less than or equal to 20 nm.

Note that the channel length means the distance between a source (a source region, source electrode) and a drain (drain region, drain electrode) in a region where a semiconductor and a gate electrode overlap each other in the top view. That is, the channel length in FIG. 8A is the distance between the source electrode 406a and the drain electrode 406b in the region where the oxide semiconductor 404b and the gate electrode 410 overlap each other. A channel width means a length of a region where a source faces parallel to a drain and where a semiconductor and a gate electrode overlap each other. That is, in FIG. 8A, a channel width is a length of a portion where the source electrode 406a and the drain electrode 406b face parallel to each other and where the oxide semiconductor 404b and the gate electrode 410 overlap each other.

When a portion of the base insulator 402 functions as an electron trap layer, electrons can be trapped in electron trap states existing at the interface between the insulator 402c and the electron trap layer 402b or inside the electron trap layer 402b as described in Embodiment 3. That is, a negative fixed charge is provided at the interface between the insulator 402c and the electron trap layer 402b or inside the electron trap layer 402b. The number of electrons trapped in the electron trap states can be adjusted by the potential of the gate electrode 401.

The gate electrode 410 electrically surrounds the oxide semiconductor 404b, so that the on-state current is increased. Such a transistor structure is referred to as a surrounded channel (s-channel) structure. In the s-channel structure, a current flows through the whole oxide semiconductor 404b (bulk). Since a current flows through the oxide semiconductor 404b, an adverse effect of interface scattering is unlikely to occur, leading to a high on-state current. Note that as the oxide semiconductor 404b is thicker, the on-state current can be increased.

In formation of a transistor with a short channel length and a short channel width, when an electrode, a semiconductor, or the like is processed at the same time when a resist mask is recessed, the electrode, the semiconductor, or the like has a rounded upper end portion (curved surface) in some cases. With this structure, the coverage with the gate insulator 408, the gate electrode 410, and the oxide insulator 412, which are to be formed over the oxide semiconductor 404b, can be improved. In addition, electric field concentration that might occur at end portions of the source electrode 406a and the drain electrode 406b can be reduced, which can suppress deterioration of the transistor.

Miniaturization of a transistor leads to high integration and high density of a semiconductor device. For example, the channel length of the transistor is less than or equal to 100 nm, preferably less than or equal to 40 nm, further preferably less than or equal to 30 nm, and still further preferably less than or equal to 20 nm, and the channel width of the transistor is less than or equal to 100 nm, preferably less than or equal to 40 nm, further preferably less than or equal to 30 nm, and still further preferably less than or equal to 20 nm. Even with a small channel width as described above, the transistor of one embodiment of the present invention can have increased on-state current by having the s-channel structure.

The substrate 400 is not limited to a simple supporting substrate, and may be a substrate where another device such as a transistor is formed. In that case, at least one of the gate electrode 410, the source electrode 406a, and the drain electrode 406b of the transistor 450 may be electrically connected to the above device.

The base insulator 402 can have a function of supplying oxygen to the multilayer semiconductor 404 as well as a function of preventing diffusion of impurities from the substrate 400. In the case where the substrate 400 is provided with another device as described above, the base insulator 402 also has a function as an interlayer insulator. In that case, since the base insulator 402 has an uneven surface, the base insulator 402 is preferably subjected to planarization treatment such as chemical mechanical polishing (CMP) treatment so as to have a flat surface.

The multilayer semiconductor 404 in the channel formation region of the transistor 450 has a structure in which the oxide semiconductor 404a, the oxide semiconductor 404b, and the oxide semiconductor 404c are stacked in this order from the substrate 400 side. The oxide semiconductor 404b is surrounded by the oxide semiconductor 404a and the oxide semiconductor 404c. As in FIG. 8C, the gate electrode 410 electrically surrounds the oxide semiconductor 404b.

Here, for the oxide semiconductor 404b, for example, an oxide semiconductor whose electron affinity (an energy difference between a vacuum level and the conduction band minimum) is higher than those of the oxide semiconductors 404a and 404c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor 404a and the oxide semiconductor 404c each contain one or more kinds of metal elements forming the oxide semiconductor 404b. For example, the oxide semiconductor 404a and the oxide semiconductor 404c are preferably formed using an oxide semiconductor whose conduction band minimum is closer to a vacuum level than that of the oxide semiconductor 404b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode 410, a channel is formed in the oxide semiconductor 404b where the conduction band minimum is the lowest in the multilayer semiconductor 404. In other words, the oxide semiconductor 404c is formed between the oxide semiconductor 404b and the gate insulator 408, whereby a structure in which the channel of the transistor is provided in a region that is not in contact with the gate insulator 408 is obtained.

Further, since the oxide semiconductor 404a contains one or more metal elements contained in the oxide semiconductor 404b, an interface state is unlikely to be formed at the interface between the oxide semiconductor 404b and the oxide semiconductor 404a, compared with the interface between the oxide semiconductor 404b and the base insulator 402 on the assumption that the oxide semiconductor 404b is in contact with the base insulator 402. The interface state sometimes forms a channel, leading to a change in the threshold of the transistor. Thus, with the oxide semiconductor 404a, a variation in the electrical characteristics of the transistor, such as threshold voltage, can be reduced. Further, the reliability of the transistor can be improved.

Furthermore, since the oxide semiconductor 404c contains one or more metal elements contained in the oxide semiconductor 404b, scattering of carriers is unlikely to occur at the interface between the oxide semiconductor 404b and the oxide semiconductor 404c, compared with the interface between the oxide semiconductor 404b and the gate insulator 408 on the assumption that the oxide semiconductor 404b is in contact with the gate insulator 408. Thus, with the oxide semiconductor 404c, the field-effect mobility of the transistor can be increased.

For the oxide semiconductor 404a and the oxide semiconductor 404c, for example, a material containing aluminum, titanium, gallium, germanium, zirconium, tin, lanthanum, cerium, or hafnium with a higher atomic ratio than that used for the oxide semiconductor 404b can be used. Specifically, an atomic ratio of any of the above metal elements in the oxide semiconductor 404a and the oxide semiconductor 404c is 1.5 times or more, preferably 2 times or more, further preferably 3 times or more as much as that in the oxide semiconductor 404b. Any of the above metal elements is strongly bonded to oxygen and thus has a function of suppressing generation of an oxygen vacancy in the oxide semiconductor 404a and the oxide semiconductor 404c. That is, an oxygen vacancy is less likely to be generated in the oxide semiconductor 404a and the oxide semiconductor 404c than in the oxide semiconductor 404b.

Note that when each of the oxide semiconductors 404a, 404b, and 404c is an In-M-Zn oxide containing at least indium, zinc, and M (M is a metal such as aluminum, titanium, gallium, germanium, yttrium, zirconium, tin, lanthanum, cerium, or hafnium), and when the oxide semiconductor 404a has an atomic ratio of In:M:Zn=$x_1$:$y_1$:$z_1$, the oxide semiconductor 404b has an atomic ratio of In:M:Zn=$x_2$:$y_2$:$z_2$, and the oxide semiconductor 404c has an atomic ratio of In:M:Zn=$x_3$:$y_3$:$z_3$, $y_1/x_1$ and $y_3/x_3$ is each preferably larger than $y_2/x_2$. $Y_1/x_1$ and $y_3/x_3$ is each 1.5 times or more, preferably 2 times or more, further preferably 3 times or more as large as $y_2/x_2$. At this time, when $y_2$ is greater than or equal to $x_2$ in the oxide semiconductor 404b, the transistor can have stable electrical characteristics. However, when $y_2$ is 3 times or more as large as $x_2$, the field-effect mobility of the transistor is reduced; accordingly, $y_2$ is preferably equal to $x_2$ or less than 3 times $x_2$.

In each of the oxide semiconductors 404a and 404c, the proportions of In and M when the summation of In and M is assumed to be 100 atomic % are as follows: the atomic percentage of In is less than 50 atomic % and the atomic percentage of M is greater than 50 atomic %; further preferably the atomic percentage of In is less than 25 atomic % and the atomic percentage of M is greater than 75 atomic %. In the oxide semiconductor 404b, the proportions of In and M when the summation of In and M is assumed to be 100 atomic % are preferably as follows: the atomic percentage of In is greater than 25 atomic % and the atomic percentage of M is less than 75 atomic %, or the atomic percentage of In is greater than 34 atomic % and the atomic percentage of M is less than 66 atomic %.

The thicknesses of the oxide semiconductor 404a and the oxide semiconductor 404c are each greater than or equal to 3 nm and less than or equal to 100 nm, preferably greater than or equal to 3 nm and less than or equal to 50 nm. The thickness of the oxide semiconductor 404b is greater than or equal to 3 nm and less than or equal to 200 nm, preferably greater than or equal to 3 nm and less than or equal to 100 nm, further preferably greater than or equal to 3 nm and less than or equal to 50 nm. In addition, the oxide semiconductor 404b is preferably thicker than the oxide semiconductor 404a and the oxide semiconductor 404c.

For the oxide semiconductor 404a, the oxide semiconductor 404b, and the oxide semiconductor 404c, an oxide semiconductor containing indium, zinc, and gallium can be used, for example. In particular, the oxide semiconductor 404b preferably contains indium because carrier mobility can be increased.

Note that stable electrical characteristics can be effectively imparted to a transistor using an oxide semiconductor, by reducing the concentration of impurities in the oxide semiconductor to make the oxide semiconductor intrinsic or substantially intrinsic. The term "substantially intrinsic" refers to the state where an oxide semiconductor has a carrier density lower than $1 \times 10^{17}/cm^3$, preferably lower than $1 \times 10^{15}/cm^3$, further preferably lower than $1 \times 10^{13}/cm^3$.

In the oxide semiconductor, hydrogen, nitrogen, carbon, silicon, and a metal element other than main components of the oxide semiconductor are impurities. For example, hydrogen and nitrogen form donor levels to increase the carrier density. In addition, silicon in the oxide semiconductor forms an impurity level. The impurity level might become a trap, so that the electrical characteristics of the transistor might deteriorate. Accordingly, in the oxide semiconductor 404a, the oxide semiconductor 404b, and the oxide semiconductor 404c and at interfaces between these layers, the impurity concentration is preferably reduced.

In order to make the oxide semiconductor intrinsic or substantially intrinsic, in secondary ion mass spectrometry (SIMS), for example, the concentration of silicon at a certain depth of the oxide semiconductor or in a region of the oxide semiconductor is preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. Further, the concentration of hydrogen at a certain depth of the oxide semiconductor or in a region of the oxide semiconductor is preferably lower than or equal to $2 \times 10^{20}$ atoms/cm$^3$, further preferably lower than or equal to $5 \times 10^{19}$ atoms/cm$^3$, still further preferably lower than or equal to $1 \times 10^{19}$ atoms/cm$^3$, yet still further preferably lower than or equal to $5 \times 10^{18}$ atoms/cm$^3$. Further, the concentration of nitrogen at a certain depth of the oxide semiconductor or in a region of the oxide semiconductor is preferably lower than $5 \times 10^{19}$ atoms/cm$^3$, further preferably lower than or equal to $5 \times 10^{18}$ atoms/cm$^3$, still further preferably lower than or equal to $1 \times 10^{18}$ atoms/cm$^3$, yet still further preferably lower than or equal to $5 \times 10^{17}$ atoms/cm$^3$.

In the case where the oxide semiconductor includes crystals, high concentration of silicon or carbon might reduce the crystallinity of the oxide semiconductor. In order not to lower the crystallinity of the oxide semiconductor, for example, the concentration of silicon at a certain depth of the oxide semiconductor or in a region of the oxide semiconductor may be lower than $1 \times 10^{19}$ atoms/cm$^3$, preferably lower than $5 \times 10^{18}$ atoms/cm$^3$, further preferably lower than $1 \times 10^{18}$ atoms/cm$^3$. Further, the concentration of carbon at a certain depth of the oxide semiconductor or in a region of the oxide semiconductor may be lower than $1 \times 10^{19}$ atoms/cm$^3$, preferably lower than $5\times10^{18}$ atoms/cm$^3$, further preferably lower than $1\times10^{18}$ atoms/cm$^3$, for example.

A transistor in which the above-described highly purified oxide semiconductor is used for a channel formation region has an extremely low off-state current. In the case where the voltage between a source and a drain is set at approximately 0.1 V, 5 V, or 10 V, for example, the off-state current standardized on the channel width of the transistor can be as low as several yoctoamperes per micrometer to several zeptoamperes per micrometer.

Note that as the gate insulator of the transistor, an insulator containing silicon is used in many cases; thus, it is preferable that a region of the multilayer semiconductor, which serves as a channel, be not in contact with the gate insulator as in the transistor of one embodiment of the present invention, for the above-described reason. In the case where a channel is formed at the interface between the gate insulator and the multilayer semiconductor, scattering of carriers occurs at the interface, whereby the field-effect mobility of the transistor may be reduced. Also from the view of the above, it is preferable that the region of the multilayer semiconductor, which serves as a channel, be separated from the gate insulator.

Accordingly, with the multilayer semiconductor 404 having a stacked structure of the oxide semiconductors 404a, 404b, and 404c, a channel can be formed in the oxide semiconductor 404b; thus, the transistor can have high field-effect mobility and stable electrical characteristics.

Next, a band diagram of the multilayer semiconductor 404 is described. For analyzing a band diagram, a stacked film corresponding to the multilayer semiconductor 404 is formed. In the stacked film, an In—Ga—Zn oxide with an energy gap of 3.5 eV is used for layers corresponding to the oxide semiconductor 404a and the oxide semiconductor 404c, and In—Ga—Zn oxide with an energy gap of 3.15 eV is used for a layer corresponding to the oxide semiconductor 404b.

The thickness of each of the oxide semiconductor 404a, the oxide semiconductor 404b, and the oxide semiconductor 404c was 10 nm. The energy gap 1.0 was measured with the use of a spectroscopic ellipsometer (UT-300 manufactured by HORLBA Jobin Yvon). Furthermore, the energy difference between the vacuum level and the valence band maximum was measured using an ultraviolet photoelectron spectroscopy (UPS) device (VersaProbe, ULVAC-PHI, Inc.).

Figure 9A:
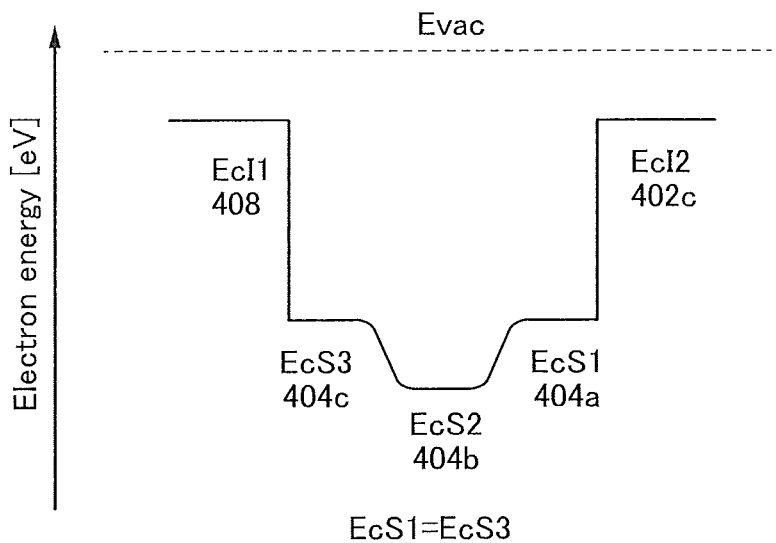
FIGS. 9A and 9B are schematic band diagrams of stacked semiconductors.

FIG. 9A is part of a schematic band structure showing an energy difference (electron affinity) between the vacuum level and the conduction band minimum of each layer, which is calculated by subtracting the energy gap from the energy difference between the vacuum level and the valence band maximum. FIG. 9A is a band diagram showing the case where silicon oxide layers are provided in contact with the oxide semiconductor 404a and the oxide semiconductor 404c. Here, Evac represents energy of the vacuum level, EcI1 and EcI2 represent the conduction band minimum of the silicon oxide layer, EcS1 represents the conduction band minimum of the oxide semiconductor 404a, EcS2 represents the conduction band minimum of the oxide semiconductor 404b, and EcS3 represents the conduction band minimum of the oxide semiconductor 404c.

As shown in FIG. 9A, the conduction band minimum continuously varies among the oxide semiconductor 404a, the oxide semiconductor 404b, and the oxide semiconductor 404c. This can be understood also from the fact that the constituent elements are common among the oxide semiconductor 404a, the oxide semiconductor 404b, and the oxide semiconductor 404c and oxygen is easily diffused among the oxide semiconductors 404a to 404c. Accordingly, the oxide semiconductor 404a, the oxide semiconductor 404b, and the oxide semiconductor 404c have a continuous physical property although they have different compositions in a stack.

The multilayer semiconductor 404 in which layers containing the same main components are stacked is formed to have not only a simple stacked structure of the layers but also a continuous energy band (here, in particular, a well structure having a U shape in which the conduction band minimum continuously varies among the layers). In other words, the stacked structure is formed such that there exist no impurities that form a defect level such as a trap center or a recombination center at each interface. If impurities exist between the stacked layers in the multilayer semiconductor, the continuity of the energy band is lost and carriers at the interface disappear by a trap or recombination.

Note that FIG. 9A shows the case where EcS1 and EcS3 are equal to each other; however, EcS1 and EcS3 may be different from each other. For example, part of the band diagram in the case where EcS1 is higher than EcS3 is shown in FIG. 9B.

For example, when EcS1 is equal to EcS3, an In—Ga—Zn oxide having an atomic ratio of In:Ga:Zn=1:3:2, 1:3:3, 1:3:4, 1:6:4, or 1:9:6 can be used for the oxide semiconductor 404a and the oxide semiconductor 404c and an In—Ga—Zn oxide having an atomic ratio of In:Ga:Zn=1:1:1 or 3:1:2 can be used for the oxide semiconductor 404b. When EcS1 is higher than EcS3, an In—Ga—Zn oxide having an atomic ratio of In:Ga:Zn=1:6:4 or 1:9:6 can be used for the oxide semiconductor 404a, an In—Ga—Zn oxide having an atomic ratio of In:Ga:Zn is 1:1:1 or 3:1:2 can be used for the oxide semiconductor 404b, and an In—Ga—Zn oxide having an atomic ratio of In:Ga:Zn=1:3:2, 1:3:3, or 1:3:4 can be used for the oxide semiconductor 404c, for example.

Figure 9B:
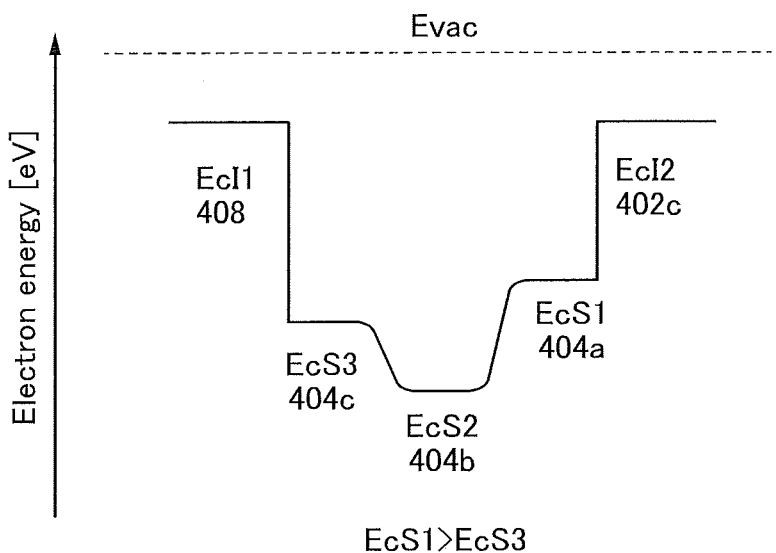

According to FIGS. 9A and 9B, the oxide semiconductor 404b of the multilayer semiconductor 404 serves as a well, so that a channel is formed in the oxide semiconductor 404b in a transistor including the multilayer semiconductor 404. Note that since the conduction band minimum continuously varies, the multilayer semiconductor 404 can also be referred to as a U-shaped well. Further, a channel formed to have such a structure can also be referred to as a buried channel.

Note that trap states due to impurities or defects might be formed in the vicinity of the interface between the oxide semiconductors 404a and 404c and an insulating layer such as a silicon oxide layer. The oxide semiconductor 404b can be distanced away from the trap states owing to existence of the oxide semiconductor 404a and the oxide semiconductor 404c. However, when the energy difference between EcS2 and EcS1 or between EcS2 and EcS3 is small, an electron in the oxide semiconductor 404b might reach the trap states by passing over the oxide semiconductor 404a or the oxide semiconductor 404c. When electrons serving as negative fixed charges are trapped in the trap states, the threshold voltage of the transistor shifts in the positive direction.

Thus, to reduce a variation in the threshold voltage of the transistor, energy differences between EcS2 and each of EcS1 and EcS3 are necessary. Each of the energy differences is preferably greater than or equal to 0.1 eV, further preferably greater than or equal to 0.15 eV.

The oxide semiconductor 404a, the oxide semiconductor 404b, and the oxide semiconductor 404c preferably include crystal parts. In particular, when a crystal in which c-axes are aligned is used, the transistor can have stable electrical characteristics.

In the case where an In—Ga—Zn oxide is used for the multilayer semiconductor 404, it is preferable that the oxide semiconductor 404c contain less In than the oxide semiconductor 404b so that diffusion of In to the gate insulator is prevented.

For the source electrode 406a and the drain electrode 406b, a conductive material that can be bonded to oxygen is preferably used. For example, aluminum, chromium, copper, tantalum, titanium, molybdenum, or tungsten can be used. Among the materials, in particular, it is preferable to use Ti which is easily bonded to oxygen or to use W with a high melting point, which allows subsequent process temperatures to be relatively high. Note that the conductive material that can be bonded to oxygen includes, in its category, a material to which oxygen is easily diffused.

When the conductive material that can be bonded to oxygen is in contact with a multilayer semiconductor, a phenomenon occurs in which oxygen in the multilayer semiconductor is diffused to the conductive material that can be bonded to oxygen. The phenomenon noticeably occurs when the temperature is high. Since the fabricating process of the transistor involves some heat treatment steps, the above phenomenon causes generation of oxygen vacancies in the vicinity of a region which is in the multilayer semiconductor and is in contact with the source electrode or the drain electrode. The oxygen vacancies bond to hydrogen that is slightly contained in the layer, whereby the region is changed to an n-type region. Thus, the n-type region can serve as a source or a drain of the transistor.

In the case of forming a transistor with an extremely short channel length, an n-type region which is formed by the generation of oxygen vacancies might extend in the channel length direction of the transistor, causing a short circuit. In that case, the electrical characteristics of the transistor change; for example, the threshold voltage shifts to cause a state in which on and off states of the transistor cannot be controlled with the gate voltage (continuous conduction state). Accordingly, when a transistor with an extremely short channel length is formed, it is not always preferable that a conductive material that can be bonded to oxygen be used for a source electrode and a drain electrode.

In such a case, a conductive material which is less likely to be bonded to oxygen than the above material is preferably used for the source electrode 406a and the drain electrode 406b. As the conductive material which is not easily bonded to oxygen, for example, a material containing tantalum nitride, titanium nitride, or ruthenium or the like can be used. Note that in the case where the conductive material is in contact with the oxide semiconductor 404b, the conductive materials may be stacked with the above-described conductive material which is easily bonded to oxygen.

The insulator 402a, the insulator 402c, and the gate insulator 408 can be formed using an insulator containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The electron trap layer 402b can be formed using an insulator containing one or more of hafnium oxide, aluminum oxide, aluminum silicate, and the like. Note that each thickness of the insulator 402a and the insulator 402c is greater than or equal to 1 nm and less than or equal to 30 nm, preferably greater than or equal to 10 nm and less than or equal to 20 nm. The thickness of the electron trap layer 402b is greater than or equal to 1 nm and less than or equal to 20 nm, preferably greater than or equal to 5 nm and less than or equal to 10 nm.

For the gate electrodes 401 and 410, a conductor formed using aluminum, titanium, chromium, cobalt, nickel, copper, yttrium, zirconium, molybdenum, ruthenium, silver, tantalum, tungsten, or the like can be used. The gate electrodes 401 and 410 may be a stacked layer including any of the above materials. Alternatively, a conductor containing nitrogen may be used for the gate electrodes 401 and 410. For example, the gate electrodes 401 and 410 can be a stacked layer in which a tungsten is formed over titanium nitride, a stacked layer in which tungsten is fainted over tungsten nitride, or a stacked layer in which tungsten is formed over tantalum nitride.

The oxide insulator 412 may be formed over the gate insulator 408 and the gate electrode 410. The oxide insulator can be formed using an insulator containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide. The oxide insulator may be a stacked layer of any of the above materials.

Here, the oxide insulator 412 preferably contains excess oxygen. An oxide insulator containing excess oxygen refers to an oxide insulator from which oxygen can be released by heat treatment or the like. The oxide insulator containing excess oxygen is preferably a layer in which the amount of released oxygen when converted into oxygen atoms is $1.0 \times 10^{19}$ atoms/cm$^3$ or more in thermal desorption spectroscopy analysis. Note that the temperature of the oxide insulating surface in the thermal desorption spectroscopy analysis is preferably higher than or equal to 100° C. and lower than or equal to 700° C., or higher than or equal to 100° C. and lower than or equal to 500° C. Oxygen released from the oxide insulator can be diffused to the channel formation region in the multilayer semiconductor 404 through the gate insulator 408, so that oxygen vacancies formed in the channel formation region can be filled with the oxygen. In this manner, stable electrical characteristics of the transistor can be obtained.

High integration of a semiconductor device requires miniaturization of a transistor. However, it is known that miniaturization of a transistor causes deterioration of the electrical characteristics of the transistor. When a channel width is shortened, an on-state current is decreased.

However, in the transistor of one embodiment of the present invention, as described above, the oxide semiconductor 404c is formed so as to cover a region where a channel is formed in the oxide semiconductor 404b, and a channel formation layer and the gate insulator are not in contact with each other. Accordingly, scattering of carriers at the interface between the channel formation layer and the gate insulator can be reduced and the on-state current of the transistor can be increased.

When the oxide semiconductor is formed to be intrinsic or substantially intrinsic, the field-effect mobility might be reduced because of a decrease in the number of carriers contained in the oxide semiconductor. However, in the transistor of one embodiment of the present invention, a gate electric field is applied to the oxide semiconductor in the side surface direction in addition to the perpendicular direction. That is, the gate electric field is applied to the whole of the oxide semiconductor, whereby current flows in the bulk of the oxide semiconductor. Consequently, a change in the electrical characteristics can be suppressed owing to the highly purified intrinsic oxide semiconductor and the field-effect mobility of the transistor can be increased.

In the transistor of one embodiment of the present invention, the oxide semiconductor 404b is formed over the oxide semiconductor 404a, so that an interface state is less likely to be formed. In addition, impurities do not enter the oxide semiconductor 404b from above and below because the oxide semiconductor 404b is an intermediate layer in a three-layer structure. With the structure in which the oxide semiconductor 404b is surrounded by the oxide semiconductor 404a and the oxide semiconductor 404c (or the oxide semiconductor 404b is electrically surrounded by the gate electrode 410), on-state current of the transistor is increased as described above, and in addition, threshold voltage can be stabilized and an SS value can be reduced. Thus, a drain current at a gate voltage of 0 V can be reduced and power consumption can be reduced. Furthermore, the threshold voltage of the transistor becomes stable; thus, long-term reliability of the semiconductor device can be improved.

Figure 10A:
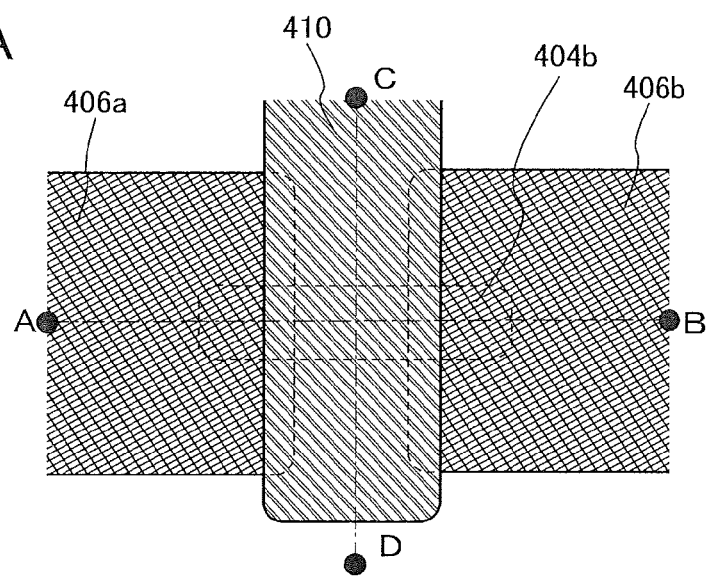
FIGS. 10A to 10C are a top view and cross-sectional views illustrating a transistor.
Figure 10B:
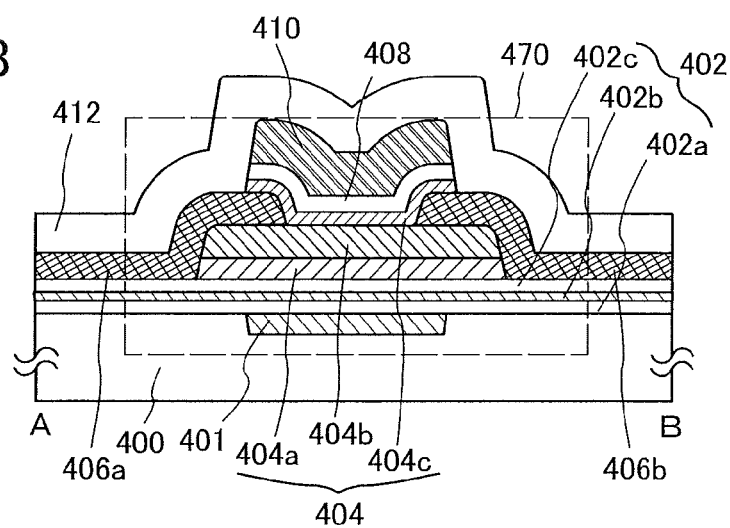
Figure 10C:
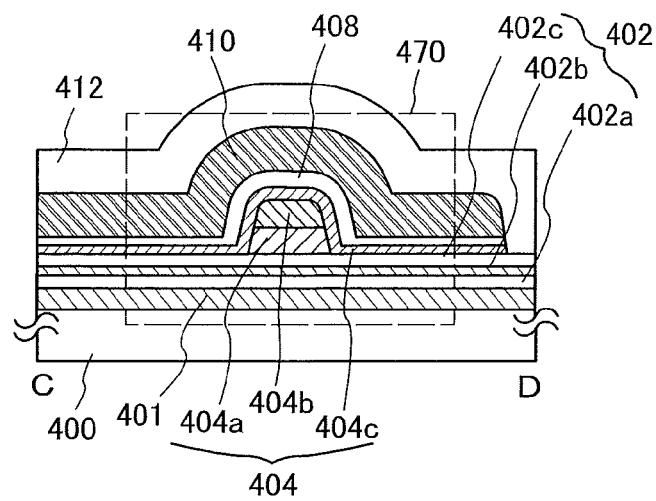

A transistor 470 illustrated in FIGS. 10A to 10C can be used. FIGS. 10A to 10C are a top view and cross-sectional views which illustrate the transistor 470. FIG. 10A is the top view. FIG. 10B illustrates a cross section taken along the dashed-dotted line A-B in FIG. 10A. FIG. 10C illustrates a cross section taken along the dashed-dotted line C-D in FIG. 10A. Note that for simplification of the drawing, some components are not illustrated in the top view in FIG. 10A.

In the transistor 470, the base insulator 402 is not etched because overetching of a conductor to be the source electrode 406a and the drain electrode 406b does not occur when the source electrode 406a and the drain electrode 406b are formed.

To prevent the base insulator 402 from being etched by overetching of the conductor, the etching rate of the base insulator 402 is preferably set (sufficiently) lower than the etching rate of the conductor.

Note that, hafnium oxide, aluminum oxygen, and the like which can be used as the electron trap layer 402b can prevent oxygen diffusion. Thus, the electron trap layer 402b formed over an entire surface of the insulator 402a can prevent oxygen from diffusing to the gate electrode 401. Note that oxygen may be generated when the oxide insulator 412 is formed by a sputtering method. As a result, oxidation of the gate electrode layer 401 can be prevented and an increase in a resistance of the gate electrode 401 can be prevented. Furthermore, oxygen can be moved to the oxide semiconductors 404a to 404c to reduce the oxygen vacancies in the oxide semiconductors 404a to 404c.

In this embodiment, although the oxide semiconductor 404b is sandwiched between the oxide semiconductor 404a and the oxide semiconductor 404c, without limited to this structure, one embodiment of the present invention may have a structure in which only the oxide semiconductor 404b is provided without the oxide semiconductor 404a and the oxide semiconductor 404c and is electrically covered with the gate electrode.

This embodiment can be combined with any of the other embodiments in this specification as appropriate.
(Embodiment 5)

In this embodiment, a method for manufacturing the transistor 450, which is described in Embodiment 4 with reference to FIGS. 8A to 8C, is described with reference to FIGS. 11A to 11D and FIGS. 12A to 12C.

Figure 11A:
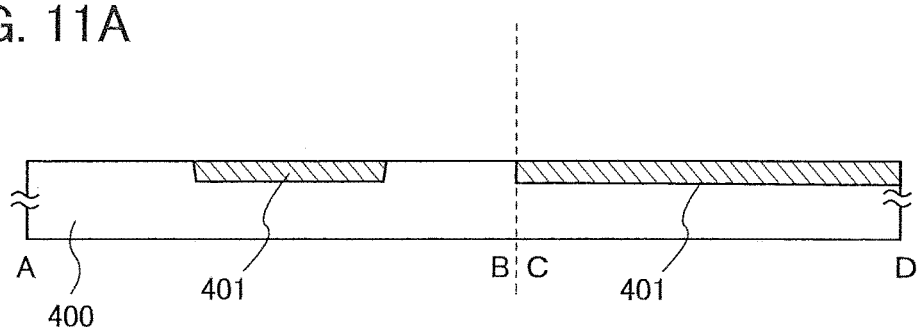
FIGS. 11A to 11D illustrate a method for manufacturing a transistor.

To form the gate electrode 401, a plurality of linear grooves is formed on the substrate 400, a conductor is deposited using aluminum, titanium, chromium, cobalt, nickel, copper, yttrium, zirconium, molybdenum, ruthenium, silver, tantalum, tungsten, or an alloy material containing any of these as a main component, and is planarized and etched (see FIG. 11A). The conductor can be formed by a sputtering method, a CVD method, or the like.

For the substrate 400, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Any of these substrates further provided with a semiconductor element thereover may be used.

Figure 11B:
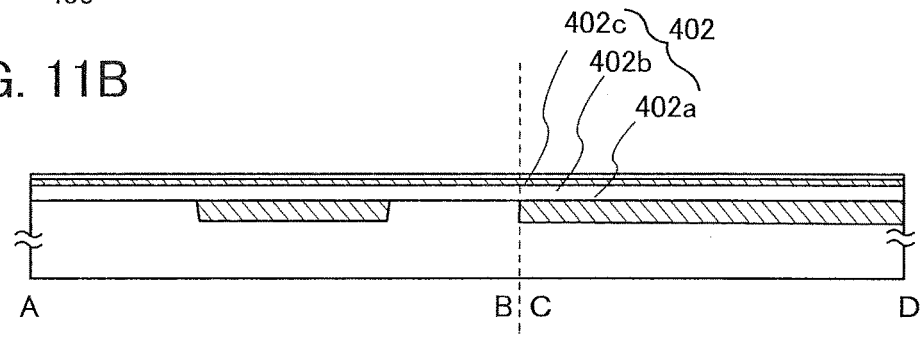

Furthermore, the base insulator 402 composed of the insulators 402a to 402c is formed (see FIG. 11B).

Oxygen may be added to the base insulator 402 by an ion implantation method, an ion doping method, a plasma immersion ion implantation method, or the like. Adding oxygen enables the base insulator 402 to supply oxygen much easily to the multilayer semiconductor 404.

Figure 11C:
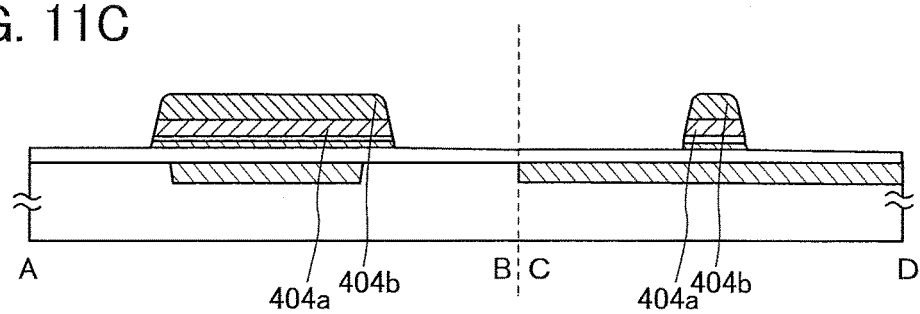

Next, the oxide semiconductors 404a and 404b are formed over the base insulator 402 by a sputtering method, a CVD method, a molecular beam epitaxy (MBE) method, an ALD method, or a pulsed laser deposition (PLD) method (see FIG. 11C). At this time, as illustrated, the base insulator 402 can be slightly over-etched. By over-etching of the base insulator 402, the gate electrode 410 to be formed later can cover the oxide semiconductor 404c easily.

For processing the oxide semiconductor 404a and the oxide semiconductor 404b into island shapes, a layer to be a hard mask (e.g., a tungsten layer) and a resist mask are provided over the oxide semiconductor 404b, and the layer to be a hard mask is etched to Run a hard mask. The resist mask is removed and then the oxide semiconductor 404a and the oxide semiconductor 404b are etched using the hard mask as a mask. Then, the resist mask is removed. At this step, the hard mask is gradually reduced as the etching progresses; as a result, the edges of the hard mask is rounded to have a curved surface. Accordingly, the edges of the oxide semiconductor 404b is rounded to have a curved surface. This structure improves the coverage with the oxide semiconductor 404c, the gate insulator 408, the gate electrode 410, and the oxide insulator 412, which are to be formed over the oxide semiconductor 404b, and can prevent shape defects such as disconnection. In addition, electric field concentration which might occur at end portions of the source electrode 406a and the drain electrode 406b can be reduced, which can reduce deterioration of the transistor.

In order to form continuous junction in a stacked layer including the oxide semiconductors 404a and 404b, or a stacked layer including the oxide semiconductors 404a, 404b, and 404c to be formed in a later step, the layers need to be formed successively without exposure to the air with the use of a multi-chamber deposition apparatus (e.g., a sputtering apparatus) including a load lock chamber. It is preferable that each chamber of the sputtering apparatus be able to be evacuated to a high vacuum (to approximately $5 \times 10^{-7}$ Pa to $1 \times 10^{-4}$ Pa) by an adsorption vacuum pump such as a cryopump and that the chamber be able to heat a substrate to 100° C. or higher, preferably 500° C. or higher so that water and the like acting as impurities of the oxide semiconductor can be removed as much as possible. Alternatively, a combination of a turbo molecular pump and a cold trap is preferably used to prevent back-flow of a gas containing a carbon component, moisture, or the like from an exhaust system into the chamber.

Not only high vacuum evacuation in a chamber but also increasing the purity of a sputtering gas is necessary to obtain a high-purity intrinsic oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor can be prevented as much as possible.

The materials described in Embodiment 4 can be used for the oxide semiconductor 404a, the oxide semiconductor 404b, and the oxide semiconductor 404c that is to be formed in a later step. For example, an In—Ga—Zn oxide having an atomic ratio of In:Ga:Zn=1:3:4 or 1:3:2 can be used for the oxide semiconductor 404a, an In—Ga—Zn oxide having an atomic ratio of In:Ga:Zn=1:1:1 can be used for the oxide semiconductor 404b, and an In—Ga—Zn oxide having an atomic ratio of In:Ga:Zn=1:3:4 or 1:3:2 can be used for the oxide semiconductor 404c.

An oxide semiconductor that can be used for each of the oxide semiconductors 404a, 404b, and 404c preferably contains at least indium (In) or zinc (Zn). Both In and Zn are preferably contained. Furthermore, in order to reduce variations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like are used. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, In—Zn oxide, Sn—Zn oxide, Al—Zn oxide, Zn—Mg oxide, Sn—Mg oxide, In—Mg oxide, In—Ga oxide, In—Ga—Zn oxide, In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Ce—Zn oxide, In—Pr—Zn oxide, In—Nd—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide, In—Sn—Ga—Zn oxide, In—Hf—Ga—Zn oxide, In—Al—Ga—Zn oxide, In—Sn—Al—Zn oxide, In—Sn—Hf—Zn oxide, or In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a layer containing the In—Ga—Zn oxide is also referred to as an IGZO layer.

Alternatively, a material represented by $InMO_3(ZnO)_m$ (m>0 is satisfied, and in is not an integer) may be used. Note that M represents one or more metal elements selected from Ga, Fe, Mn, or Co. A material represented by $In_2SnO_5(ZnO)_n$ (n>0, n is an integer) may be used.

Note that as described in Embodiment 4 in detail, materials are selected so that the oxide semiconductors 404a and 404c each have an electron affinity lower than that of the oxide semiconductor 404b.

Note that the oxide semiconductor is preferably formed by a sputtering method. As a sputtering method, an RF sputtering method, a DC sputtering method, an AC sputtering method, or the like can be used. In particular, a DC sputtering method is preferably used because dust generated in the film formation can be reduced and the film thickness can be uniform.

When In—Ga—Zn oxide is used for the oxide semiconductors 404a, 404b, and 404c, a material with an atomic ratio of In:Ga:Zn=1:1:1, 2:2:1, 3:1:2, 1:3:2, 1:3:4, 1:4:3, 1:5:4, 1:6:6, 2:1:3 1:6:4, 1:9:6, 1:1:4, or 1:1:2 is used so that the oxide semiconductors 404a and 404c each have an electron affinity lower than that of the oxide semiconductor 404b.

Note that the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The indium content in the oxide semiconductor 404b is preferably higher than those in the oxide semiconductors 404a and 404c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher carrier mobility than an oxide having a composition in which the proportion of In is equal to or lower than that of Ga. Thus, with use of an oxide having a high indium content for the oxide semiconductor 404b, a transistor having high mobility can be achieved.

A structure of an oxide semiconductor is described below.

In this specification, a term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 13A:
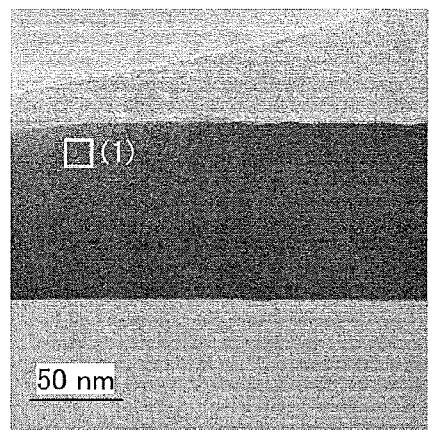
FIGS. 13A to 13D are Cs-corrected high-resolution TEM images of a cross section of a CAAC-OS and a cross-sectional schematic view of a CAAC-OS.

A CAAC-OS observed with TEM is described below. FIG. 13A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 13B:
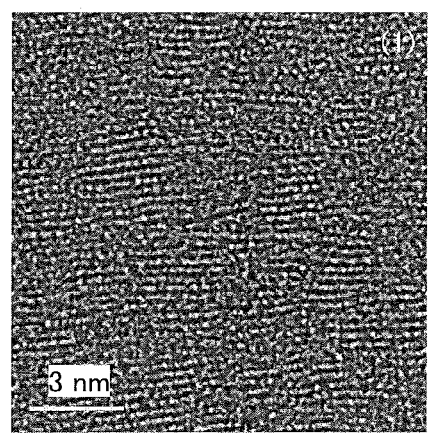

FIG. 13B is an enlarged Cs-corrected high-resolution TEM image of a region (1) in FIG. 13A. FIG. 13B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 13C:
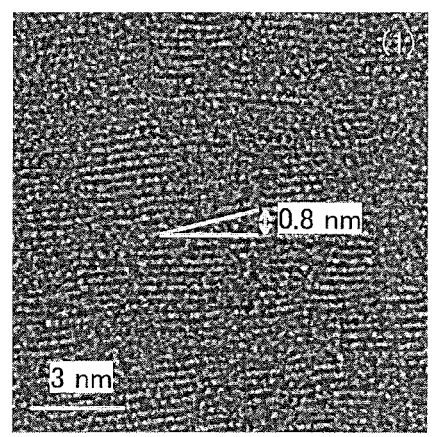

As shown in FIG. 13B, the CAAC-OS has a characteristic atomic arrangement. The characteristic atomic arrangement is denoted by an auxiliary line in FIG. 13C. FIGS. 13B and 13C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 13D:
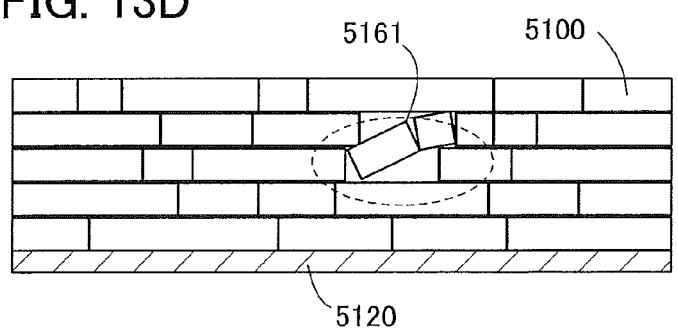

Here, according to the Cs-corrected high-resolution TEM images, the schematic arrangement of pellets 5100 of a CAAC-OS over a substrate 5120 is illustrated by such a structure in which bricks or blocks are stacked (see FIG. 13D). The part in which the pellets are tilted as observed in FIG. 13C corresponds to a region 5161 shown in FIG. 13D.

FIG. 14A shows a Cs-corrected high-resolution TEM image of a plane of the CAAC-OS observed from a direction substantially perpendicular to the sample surface. FIGS. 14B, 14C, and 14D are enlarged Cs-corrected high-resolution TEM images of regions (1), (2), and (3) in FIG. 14A, respectively. FIGS. 14B, 14C, and 14D indicate that metal atoms are arranged in a triangular, quadrangular, or hexagonal configuration in a pellet. However, there is no regularity of arrangement of metal atoms between different pellets.

Figure 15A:
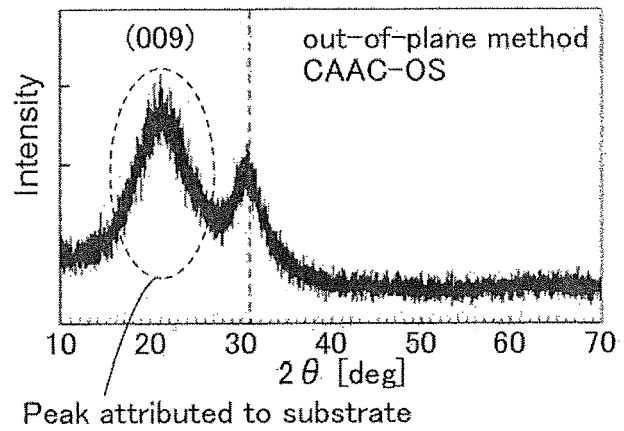
Figure 15A:
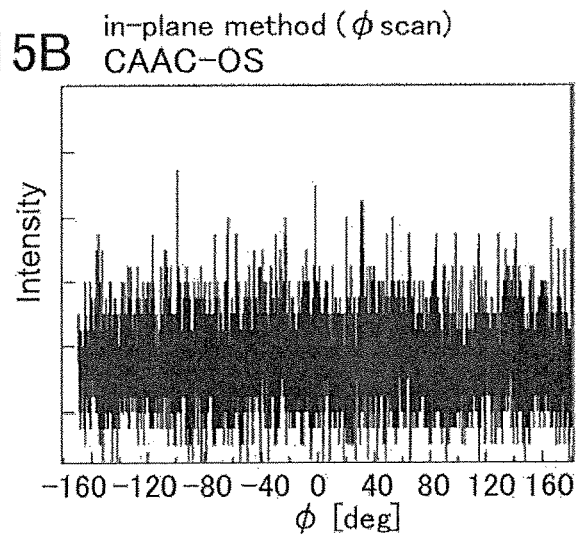
Figure 15A:
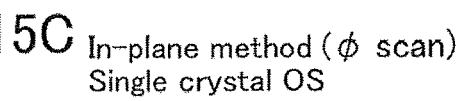

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 15A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (ϕ scan) is performed with 2θ fixed at around 56° and with the sample rotated using a normal vector of the sample surface as an axis (ϕ axis), as shown in FIG. 15B, a peak is not clearly observed. In contrast, in the case of a single crystal oxide semiconductor of $InGaZnO_4$, when ϕ scan is performed with 2θ fixed at around 56°, as shown in FIG. 15C, six peaks which are derived from crystal planes equivalent to the (110) plane are observed. Accordingly, the structural analysis using XRD shows that the directions of a-axes and b-axes are irregularly oriented in the CAAC-OS.

Figure 16A:
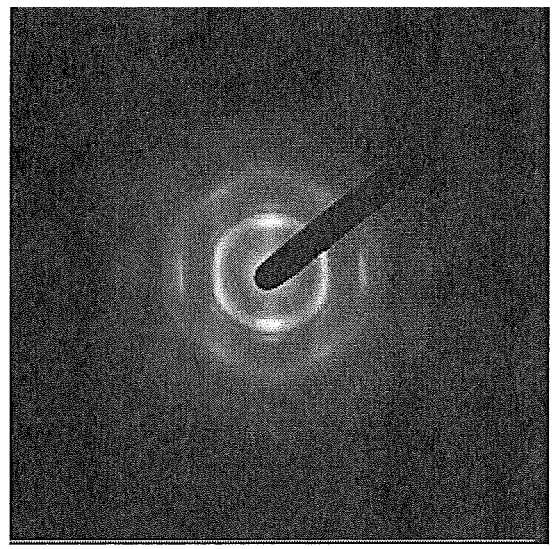
FIGS. 16A and 16B show electron diffraction patterns of a CAAC-OS.
Figure 16B:
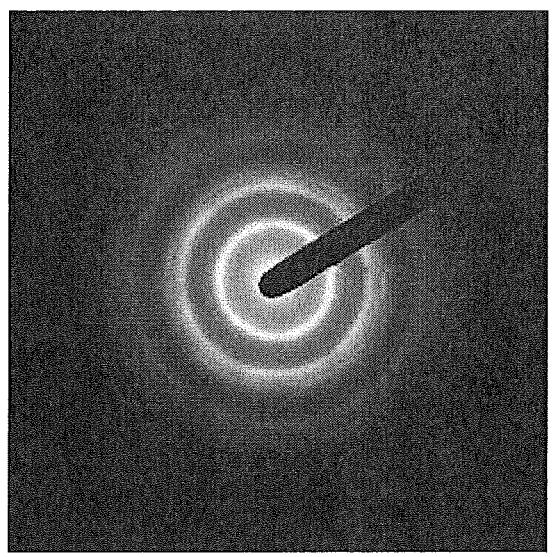

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 16A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 16B shows a diffraction pattern obtained in such a manner that an electron beam with a probe diameter of 300 nm is incident on the same sample in a direction perpendicular to the sample surface. As shown in FIG. 16B, a ring-like diffraction pattern is observed. Thus, the electron diffraction also indicates that the a-axes and b-axes of the pellets included in the CAAC-OS do not have regular alignment. The first ring in FIG. 16B is considered to be derived from the (010) plane, the (100) plane, and the like of the $InGaZnO_4$ crystal. The second ring in FIG. 16B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 inn is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 run and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 17:
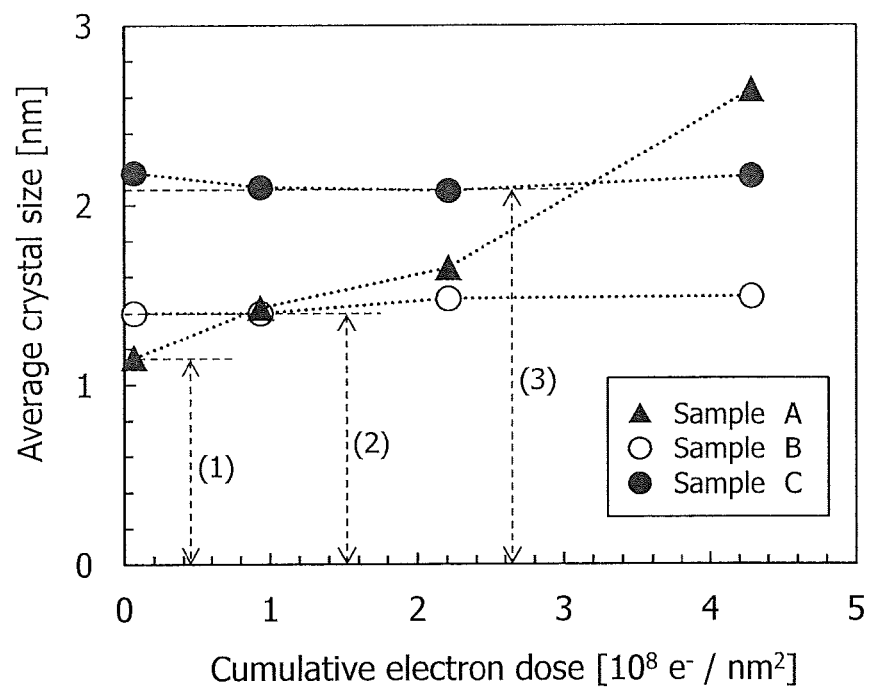
FIG. 17 shows a change of crystal parts of an In—Ga—Zn oxide due to electron irradiation.

FIG. 17 shows change in the average size of crystal parts (at 22 points to 45 points) in each sample. Note that the crystal part size corresponds to the length of a lattice fringe. FIG. 17 indicates that the crystal part size in the a-like OS increases with an increase in the cumulative electron dose. Specifically, as shown by (1) in FIG. 17, a crystal part of approximately 1.2 nm (also referred to as an initial nucleus) at the start of TEM observation grows to a size of approximately 2.6 nm at a cumulative electron dose of $4.2\times10^8$ e$^-$/nm$^2$. In contrast, the crystal part size in the nc-OS and the CAAC-OS shows little change from the start of electron irradiation to a cumulative electron dose of $4.2\times10^8$ e$^-$/nm$^2$. Specifically, as shown by (2) and (3) in FIG. 17, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

First heat treatment may be performed after the oxide semiconductor 404b is formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor 404b can be improved, and in addition, impurities such as hydrogen and water can be removed from the base insulator 402 and the oxide semiconductor 404a. Note that the first heat treatment may be performed before etching for formation of the oxide semiconductor 404b.

Then, a first conductor to be the source electrode 406a and the drain electrode 406b is formed over the oxide semiconductors 404a and 404b. For the first conductor, aluminum, chromium, copper, tantalum, titanium, molybdenum, tungsten, or an alloy material containing any of these as a main component can be used. For example, a 100-nm-thick titanium layer is formed by a sputtering method or the like. Alternatively, a tungsten layer is formed by a CVD method or the like.

Figure 11D:
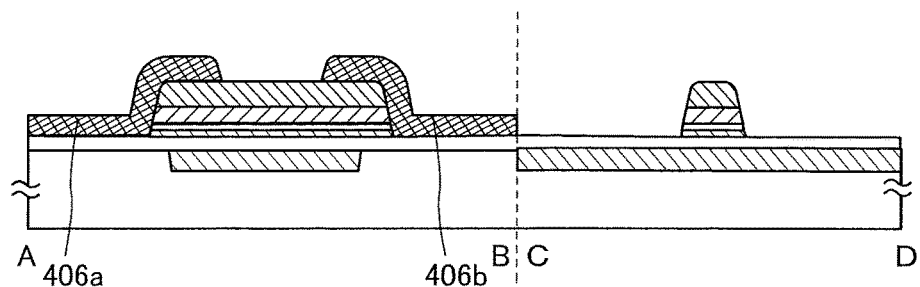

Then, the first conductor is etched so as to be divided over the oxide semiconductor 404b to form the source electrode 406a and the drain electrode 406b (see FIG. 11D).

Next, the oxide semiconductor 403c is formed over the oxide semiconductor 404b, the source electrode 406a, and the drain electrode 406b.

Note that second heat treatment may be performed after the oxide semiconductor 403c is formed. The second heat treatment can be performed in a condition similar to that of the first heat treatment. The second heat treatment can remove impurities such as hydrogen and water from the oxide semiconductor 403c. In addition, impurities such as hydrogen and water can be further removed from the oxide semiconductors 404a and 404b.

Figure 12A:
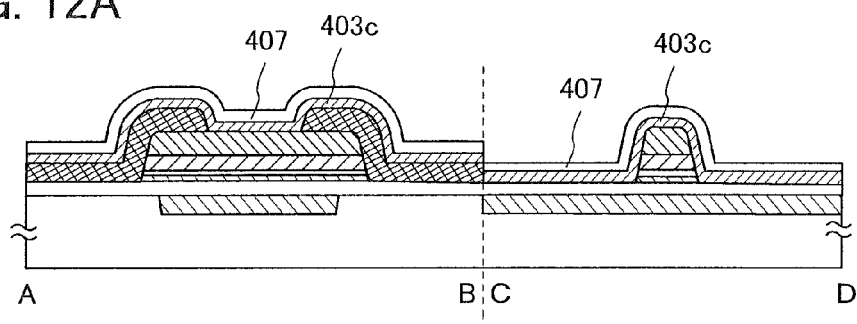
FIGS. 12A to 12C illustrate a method for manufacturing a transistor.

Next, an insulator 407 to be the gate insulator 408 is formed over the oxide semiconductor 403c (see FIG. 12A). The insulator 407 can be formed by a sputtering method, a CVD method, an MBE method, an ALD method, a PLD method, or the like.

Figure 12B:
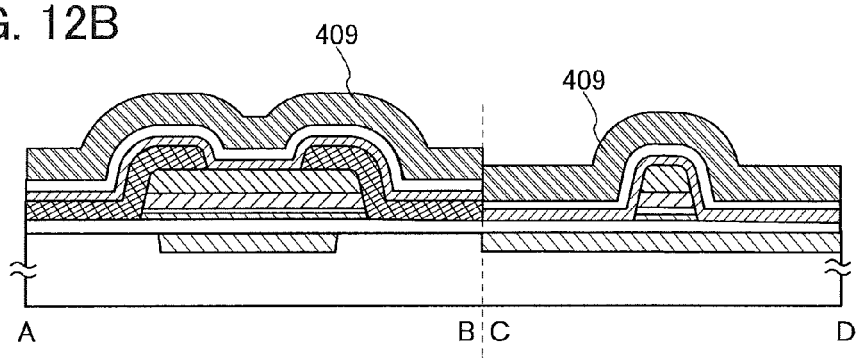

Then, a second conductor 409 to be the gate electrode 410 is formed over the insulator 407 (see FIG. 12B). For the second conductor 409, aluminum, titanium, chromium, cobalt, nickel, copper, yttrium, zirconium, molybdenum, ruthenium, silver, tantalum, tungsten, or an alloy material containing any of these as its main component can be used. The second conductor 409 can be formed by a sputtering method, a CVD method, or the like. For the second conductor 409, a conductive film containing nitrogen or a stack including the above conductor and a conductor containing nitrogen may be used.

Figure 12C:
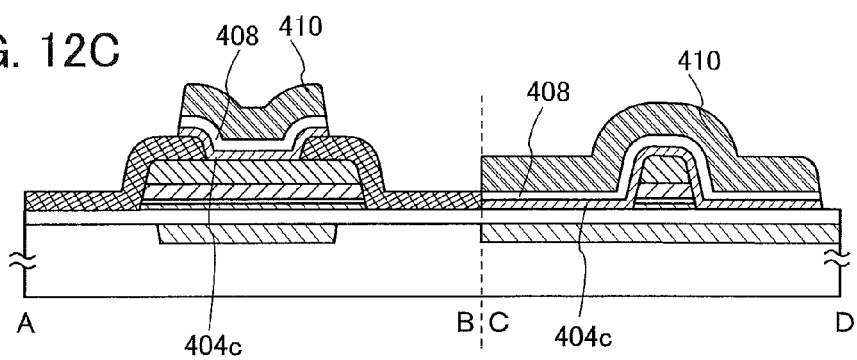

After that, the second conductor 409 is selectively etched using a resist mask to form the gate electrode 410 (see FIG. 12C). Note that as illustrated in FIG. 8C, the oxide semiconductor 404b is electrically surrounded by the gate electrode 410.

Then, the insulator 407 is selectively etched using the resist mask or the gate electrode 410 as a mask to form the gate insulator 408.

Subsequently, the oxide semiconductor 403c is etched using the resist mask or the gate electrode 410 as a mask to form the oxide semiconductor 404c.

The top edge of the oxide semiconductor 404c is aligned with the bottom edge of the gate insulator 408. The top edge of the gate insulator 408 is aligned with the bottom edge of the gate electrode 410. Although the gate insulator 408 and the oxide semiconductor 404c are formed using the gate electrode 410 as a mask, the gate insulator 408 and the oxide semiconductor 404c may be formed before the second conductor 409 is formed.

Next, the oxide insulator 412 is formed over the source electrode 406a, the drain electrode 406b, and the gate electrode 410 (see FIGS. 8B and 8C). A material and a method for the oxide insulator 412 can be similar to those for the insulator 402a. The oxide insulator 412 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or an oxide insulator containing nitrogen. The oxide insulator 412 can be formed by a sputtering method, a CVD method, an MBE method, an ALD method, or a PLD method. The oxide insulator 412 preferably contains excessive oxygen so as to be able to supply oxygen to the multilayer semiconductor 404.

Next, third heat treatment may be performed. The third heat treatment can be performed under a condition similar to that of the first heat treatment. By the third heat treatment, excess oxygen is easily released from the base insulator 402, the gate insulator 408, and the oxide insulator 412, so that oxygen vacancies in the multilayer semiconductor 404 can be reduced.

Next, fourth heat treatment is performed. In the fourth heat treatment, the potential of the gate electrode 401 is kept higher than that of the source or drain electrode at a high temperature higher than or equal to 125° C. and lower than or equal to 450° C., preferably higher than or equal to 150° C. and lower than or equal to 300° C. for one second or longer, typically one minute or longer. As a result, the needed number of electrons moves from the multilayer semiconductor 404 toward the gate electrode 401 and some of them are trapped by the electron trap states existing inside the electron trap layer 402b or at the interface with another insulator. By controlling the number of trapped electrons, the degree of the threshold increase can be controlled.

Through the above process, the transistor 450 illustrated in FIGS. 8A to 8C can be manufactured.

This embodiment can be combined with any of the other embodiments in this specification as appropriate.

(Embodiment 6)

In this embodiment, a transistor which has a different structure from the transistor 450 in Embodiment 4 is described.

Figure 18A:
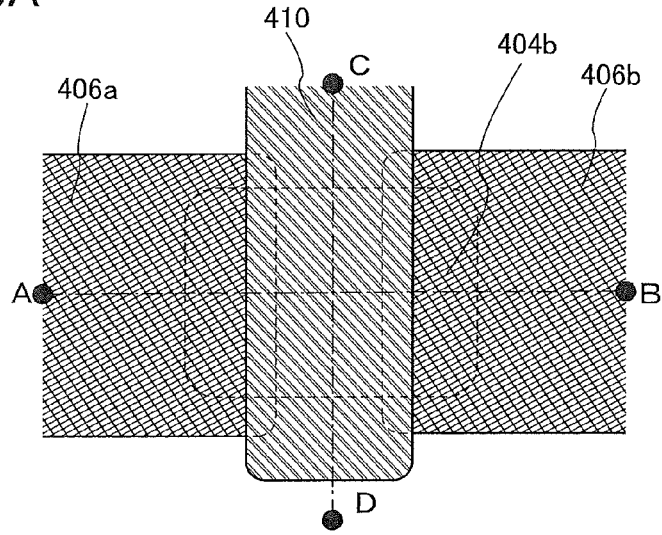
FIGS. 18A to 18C are a top view and cross-sectional views illustrating a transistor.
Figure 18B:
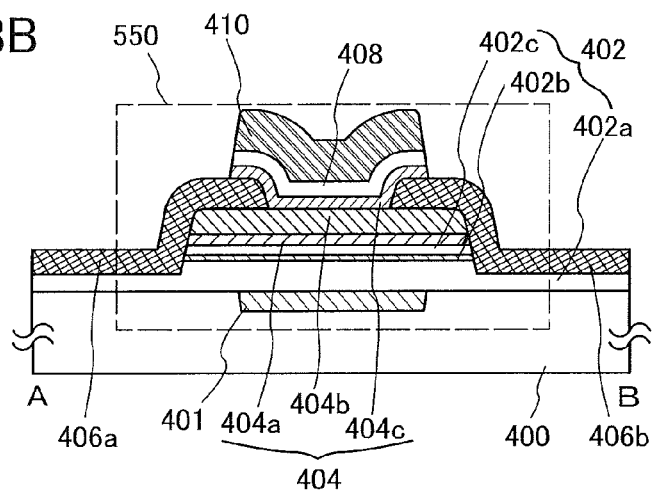
Figure 18C:
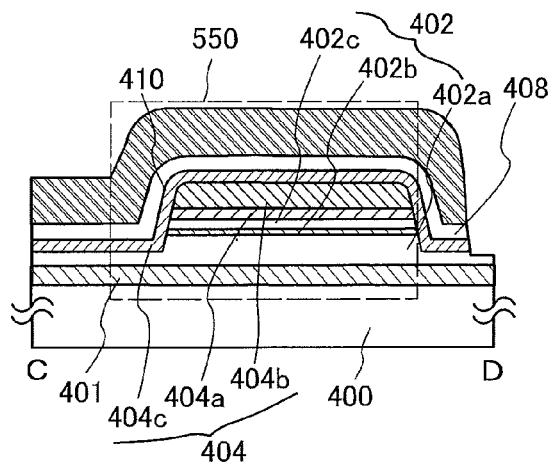

FIGS. 18A to 18C are a top view and cross-sectional views of a transistor of one embodiment of the present invention. FIG. 18A is a top view. FIG. 18B illustrates a cross section taken along dashed-dotted line A-B in FIG. 18A. FIG. 18C illustrates a cross section taken along dashed-dotted line C-D in FIG. 18A. Note that for simplification of the drawing, some components in the top view in FIG. 18A are not illustrated. In some cases, the direction of the dashed-dotted line A-B is referred to as a channel length direction, and the direction of the dashed-dotted line C-D is referred to as a channel width direction.

A transistor 550 illustrated in FIGS. 18A to 18C includes the base insulator 402 over the substrate 400; the oxide semiconductor 404a and the oxide semiconductor 404b over the base insulator 402; the source electrode 406a and the drain electrode 406b over the oxide semiconductor 404a and the oxide semiconductor 404b; the oxide semiconductor 404c in contact with the base insulator 402, the oxide semiconductor 404a, the oxide semiconductor 404b, the source electrode 406a, and the drain electrode 406b; the gate insulator 408 over the oxide semiconductor 404c; the gate electrode 410 over the gate insulator 408; and the oxide insulator 412 over the source electrode 406a, the drain electrode 406b, and the gate electrode 410. The base insulator 402 includes the insulator 402a, the electron trap layer 402b, and the insulator 402c. The oxide semiconductor 404a, the oxide semiconductor 404b, and the oxide semiconductor 404c are collectively referred to as the multilayer semiconductor 404.

The transistor 550 in this embodiment is different from the transistor 450 in Embodiment 4 in that each of the channel length and the channel width is greater than or equal to twice, typically greater than or equal to ten times as large as the thickness of the multilayer semiconductor 404.

Note that a channel length means the distance between a source (source region or source electrode) and a drain (drain region or drain electrode) in a region where a semiconductor and a gate electrode overlap each other in the top view. That is, the channel length in FIG. 18A is the distance between the source electrode 406a and the drain electrode 406b in the region where the oxide semiconductor 404b and the gate electrode 410 overlap each other. A channel width means the length of a portion where a source and a drain face and are parallel to each other and where a semiconductor and a gate electrode overlap each other. That is, the channel width in FIG. 18A is thus the length of a portion where the source electrode 406a and the drain electrode 406b face and are parallel to each other and where the oxide semiconductor 404b and the gate electrode 410 overlap each other.

Figure 19A:
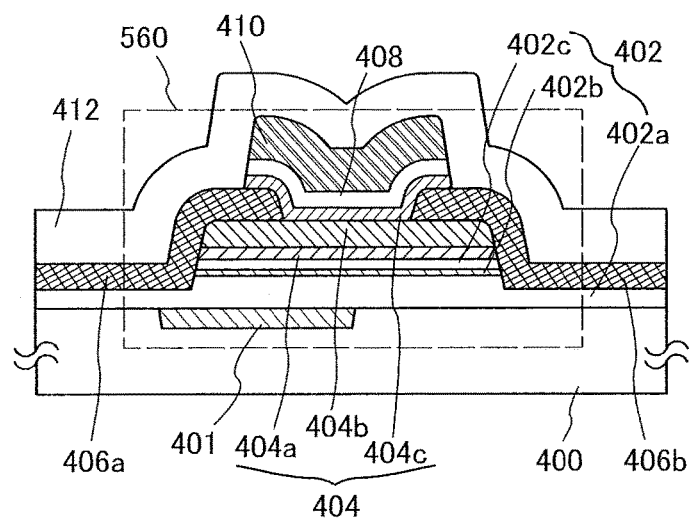
FIGS. 19A and 19B are cross-sectional views of transistors.

A transistor 560 illustrated in FIG. 19A may be used. FIG. 19A is a cross-sectional view of the transistor 560. The transistor 560 is different from the transistor 550 in that the gate electrode 401 overlaps the source electrode 406a but does not overlap the drain electrode 406b. Thus, parasitic capacitance generated between the gate electrode 401 and the drain electrode 406b can be reduced. To the contrary, the gate electrode 401 may be placed to overlap the drain electrode 406b but not the source electrode 406a.

Figure 19B:
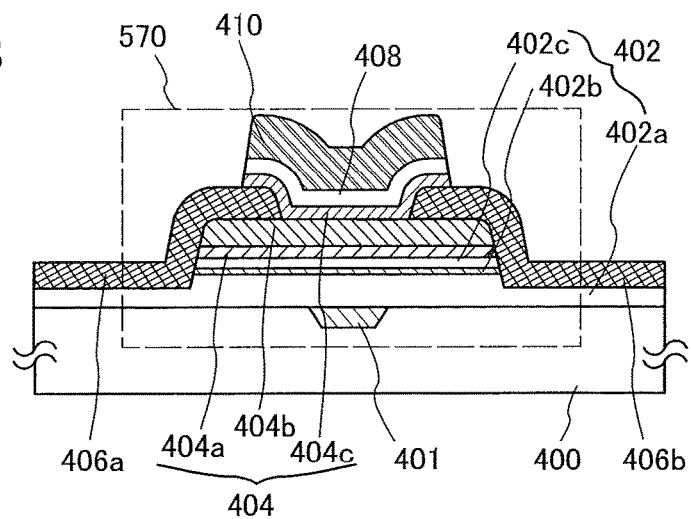

Alternatively, a transistor 570 illustrated in FIG. 19B may be used. FIG. 19B is a cross-sectional view of the transistor 570. The transistor 570 is different from the transistor 560 in that the gate electrode 401 overlaps neither the source electrode 406a nor the drain electrode 406b. Thus, parasitic capacitance generated between the gate electrode 401 and the source and drain electrodes 406a and 406b can be reduced. Because the drain current at a gate voltage of 0 V can be reduced as long as the threshold is high in at least part of the channel, such a structure can be used.

Although this embodiment has a structure in which the oxide semiconductor 404b is sandwiched between the oxide semiconductors 404a and 404c, without limitation to this structure, a structure including only the oxide semiconductor 404b and not including the oxide semiconductors 404a and 404c is possible. Alternatively, a structure in which any one or two of the oxide semiconductor 404a, the oxide semiconductor 404b, and the oxide semiconductor 404c are provided is possible.

This embodiment can be combined with any of the other embodiments in this specification as appropriate.

(Embodiment 7)

In this embodiment, an example of a circuit including the transistor of one embodiment of the present invention is described with reference to the drawings.

Figure 20A:
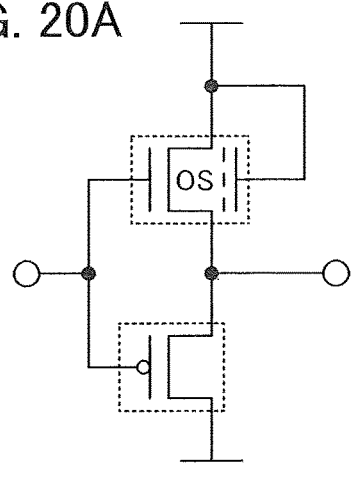
FIGS. 20A to 20D illustrate circuits that use a semiconductor device of one embodiment of the present invention and cross-sectional views of a semiconductor device.
Figure 20B:
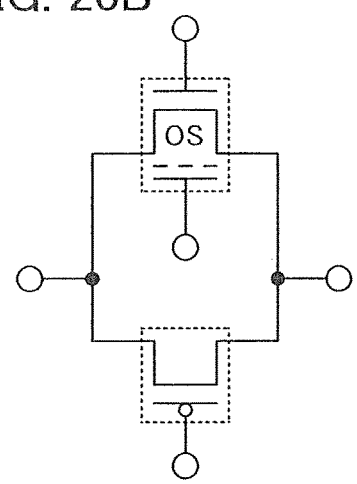
Figure 20C:
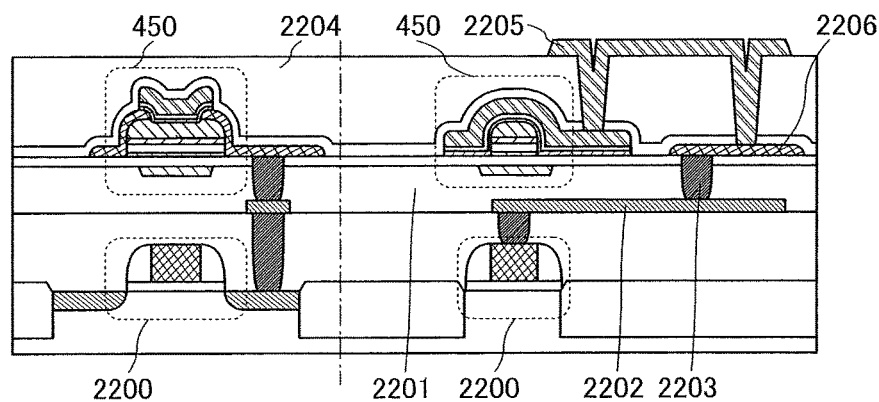
Figure 20D:
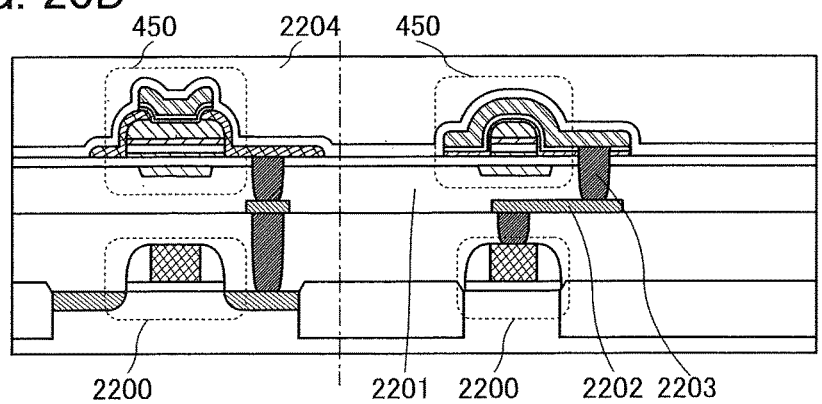

FIGS. 20A and 20B are each a circuit diagram of a semiconductor device and FIGS. 20C and 20D are each a cross-sectional view of a semiconductor device. FIGS. 20C and 20D each illustrate a cross-sectional view of the transistor 450 in the channel length direction on the left side and a cross-sectional view of the transistor 450 in the channel width direction on the right side. In the circuit diagram, "OS" is written beside a transistor in order to clearly demonstrate that the transistor includes an oxide semiconductor.

The semiconductor devices illustrated in FIGS. 20C and 20D each include a transistor 2200 containing a first semiconductor material in a lower portion and a transistor containing a second semiconductor material in an upper portion. Here, an example is described in which the transistor 450 described in Embodiment 4 as an example is used as the transistor containing the second semiconductor material.

Here, the first semiconductor material and the second semiconductor material are preferably materials having different band gaps. For example, a semiconductor material other than an oxide semiconductor (e.g., silicon, germanium, silicon germanium, silicon carbide, or gallium arsenide) can be used as the first semiconductor material, and the oxide semiconductor described in Embodiment 4 can be used as the second semiconductor material. A transistor using a material other than an oxide semiconductor, such as single crystal silicon, can operate at high speed easily. In contrast, a transistor including an oxide semiconductor has the low off-state current.

Although the transistor 2200 is a p-channel transistor here, it is needless to say that an n-channel transistor can be used to form a circuit having a different configuration. The specific structure of the semiconductor device, such as a material used for the semiconductor device and the structure of the semiconductor device, does not need to be limited to that described here except for the use of the transistor described in Embodiment 4, which is formed using an oxide semiconductor.

FIGS. 20A, 20C, and 20D each illustrate a configuration example of what is called a CMOS circuit, in which a p-channel transistor and an n-channel transistor are connected in series and gates of the transistors are connected.

The transistor using an oxide semiconductor of one embodiment of the present invention has a high on-state current, which can achieve high-speed operation of a circuit.

In the structure illustrated in FIG. 20C, the transistor 450 is provided over the transistor 2200 with an insulator 2201 positioned therebetween. Wirings 2202 are provided between the transistor 2200 and the transistor 450. Wirings and electrodes in the upper layer and the lower layer are electrically connected via plugs 2203 embedded in insulators. An insulator 2204 covering the transistor 450, a wiring 2205 over the insulator 2204, and a wiring 2206 formed by processing the same conductor as a pair of electrodes of the transistor are provided.

By stacking two transistors in the above manner, an area occupied by a circuit can be reduced; accordingly, a plurality of circuits can be arranged in high density.

In FIG. 20C, one of the source and the drain of the transistor 450 is electrically connected to one of a source and a drain of the transistor 2200 via the wiring 2202 and the plug 2203. The gate of the transistor 450 is electrically connected to a gate of the transistor 2200 via the wiring 2205, the wiring 2206, the plug 2203, the wiring 2202, and the like.

In the configuration illustrated in FIG. 20D, an opening portion in which the plug 2203 is embedded is provided in a gate insulator of the transistor 450, and the gate of the transistor 450 is in contact with the plug 2203 through the opening portion. Such a configuration makes it possible to achieve the integration of the circuit easily and to reduce the lengths and the number of wirings and plugs used to be smaller than those in the configuration illustrated in FIG. 20C; thus, the circuit can operate at higher speed.

Note that when a connection between the electrodes of the transistor 450 and the transistor 2200 is changed from that in the configuration illustrated in FIG. 20C or FIG. 20D, a variety of circuits can be formed. For example, a circuit having a configuration in which a source and a drain of a transistor are connected to those of another transistor as illustrated in FIG. 20B can operate as what is called an analog switch.

A semiconductor device having an image sensor function for reading data of an object can be manufactured with the use of the transistor described in any of the above embodiments.

Figure 21:
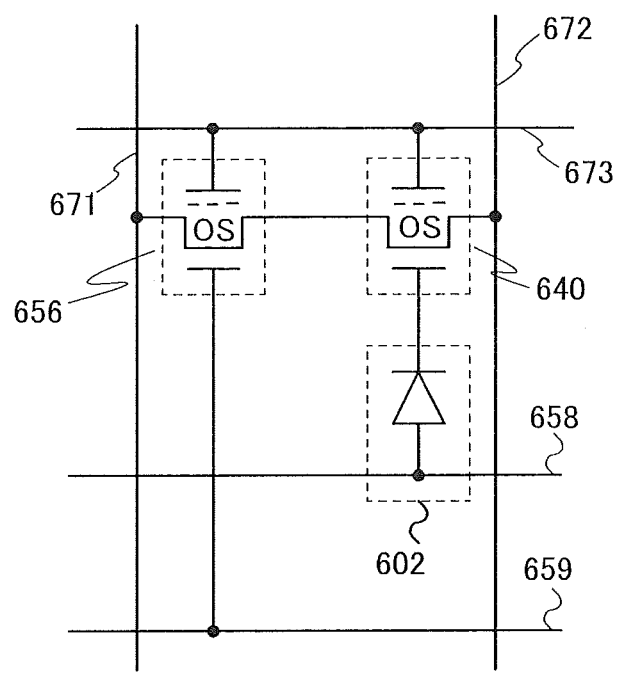
FIG. 21 is a circuit diagram of a semiconductor device of an embodiment.

FIG. 21 illustrates an example of an equivalent circuit of a semiconductor device having an image sensor function.

One electrode of a photodiode 602 is electrically connected to a photodiode reset signal line 658, and the other electrode of the photodiode 602 is electrically connected to one gate of a transistor 640. One of a source and a drain of the transistor 640 is electrically connected to a photo sensor reference signal line 672, and the other of the source and the drain thereof is electrically connected to one of a source and a drain of a transistor 656. One gate of the transistor 656 is electrically connected to a gate signal line 659, and the other of the source and the drain thereof is electrically connected to a photo sensor output signal line 671. The other gate (back gate) of the transistor 640 and the other gate (back gate) of the transistor 656 are connected to a ground line 673.

As the photodiode 602, for example, a pin photodiode in which a semiconductor having p-type conductivity, a high-resistance semiconductor (semiconductor having i-type conductivity), and a semiconductor having n-type conductivity are stacked can be used.

With detection of light that enters the photodiode 602, data on an object to be detected can be read. Note that a light source such as a backlight can be used at the time of reading data of an object.

As each of the transistor 640 and the transistor 656, the transistor in which a channel is formed in an oxide semiconductor, which is described in any of the above embodiments, can be used. In FIG. 21, "OS" is written beside the transistor 640 and the transistor 656 so that the transistors 640 and 656 can be identified as transistors including an oxide semiconductor.

It is preferable that each of the transistor 640 and the transistor 656 be one of the transistors described in the above embodiments, in which the oxide semiconductor is electrically surrounded by the gate electrode. When the oxide semiconductor has round end portions and a curved surface in the transistor, coverage with a layer formed over the oxide semiconductor can be improved. In addition, electric field concentration which might occur at end portions of the source electrode and the drain electrode can be reduced, which can suppress deterioration of the transistor. Therefore, variation in the electrical characteristics of the transistor 640 and the transistor 656 is suppressed, and the transistor 640 and the transistor 656 are electrically stable. The semiconductor device having an image sensor function illustrated in FIG. 21 can have high reliability by including the transistor.

This embodiment can be combined with any of the other embodiments in this specification as appropriate.

(Embodiment 8)

In this embodiment, an RF tag that includes the transistor described in the above embodiment or the memory device described in the above embodiment is described with reference to FIG. 22.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF device is required to have extremely high reliability in order to be used for this purpose.

A configuration of the RF tag is described with reference to FIG. 22. FIG. 22 is a block diagram illustrating a configuration example of an RF tag.

Figure 22:
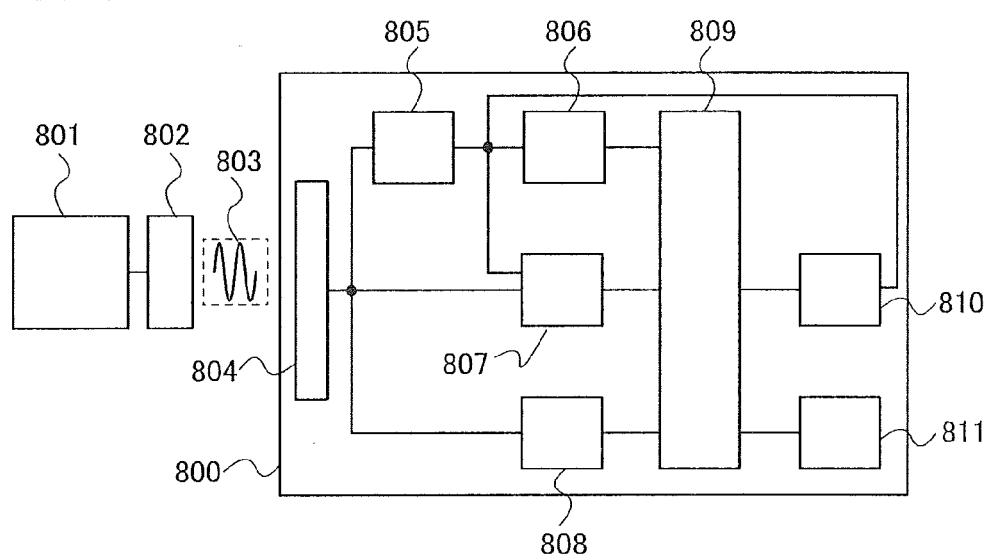
FIG. 22 illustrates a configuration example of an RF tag of an embodiment.

As shown in FIG. 22, an RF tag 800 includes an antenna 804 that receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material that enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, a configuration of each circuit is described. The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. The modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RF tag. In addition, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing that is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers only to good products to be shipped. Thus, the identification numbers of the shipped products are in series and customer management corresponding to the shipped products is easily performed.

At least part of this embodiment can be implemented in combination with any of the other embodiments described in this specification as appropriate.

(Embodiment 9)

In this embodiment, a CPU in which at least the transistor described in any of the above embodiments can be used and the memory device described in the above embodiment is included is described.

Figure 23:
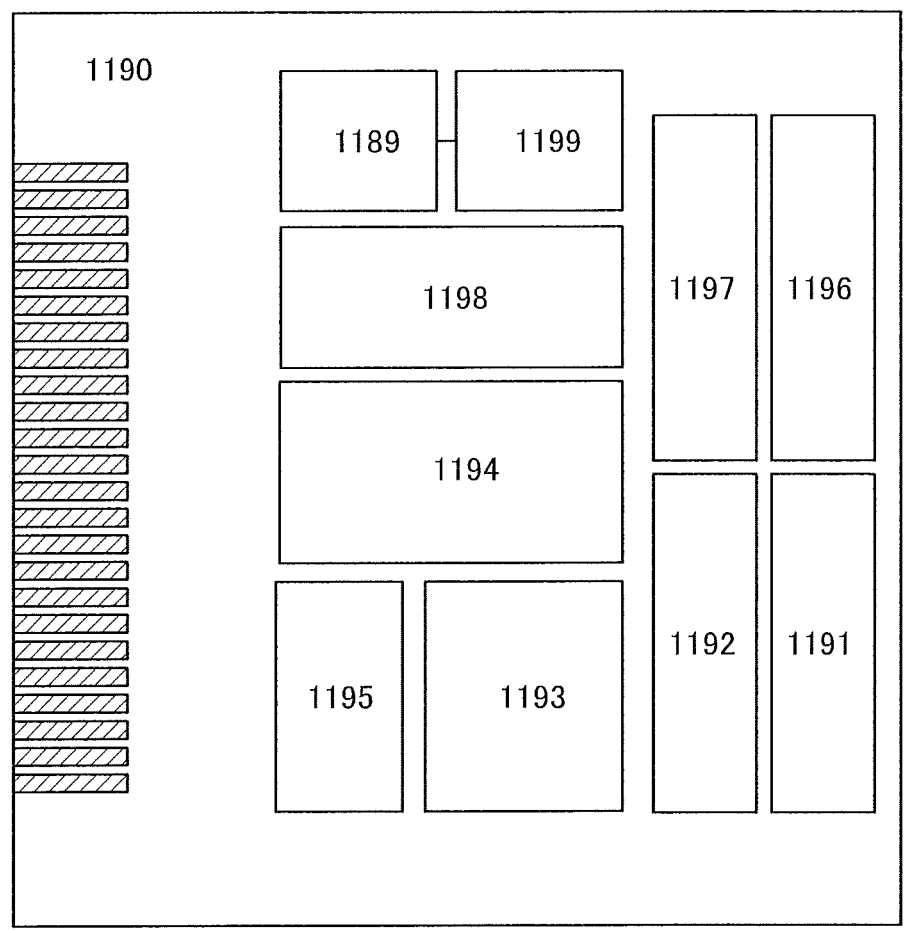
FIG. 23 is a block diagram of a semiconductor device of an embodiment.

FIG. 23 is a block diagram illustrating a configuration example of a CPU at least partly including any of the transistors described in the above embodiments as a component.

The CPU illustrated in FIG. 23 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 23 is just an example in which the configuration is simplified, and an actual CPU may have a variety of configurations depending on the application. For example, the CPU may have the following configuration: a structure including the CPU illustrated in FIG. 23 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 23, a memory cell is provided in the register 1196. For the memory cell of the register 1196, any of the transistors described in the above embodiments can be used.

In the CPU illustrated in FIG. 23, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 24:
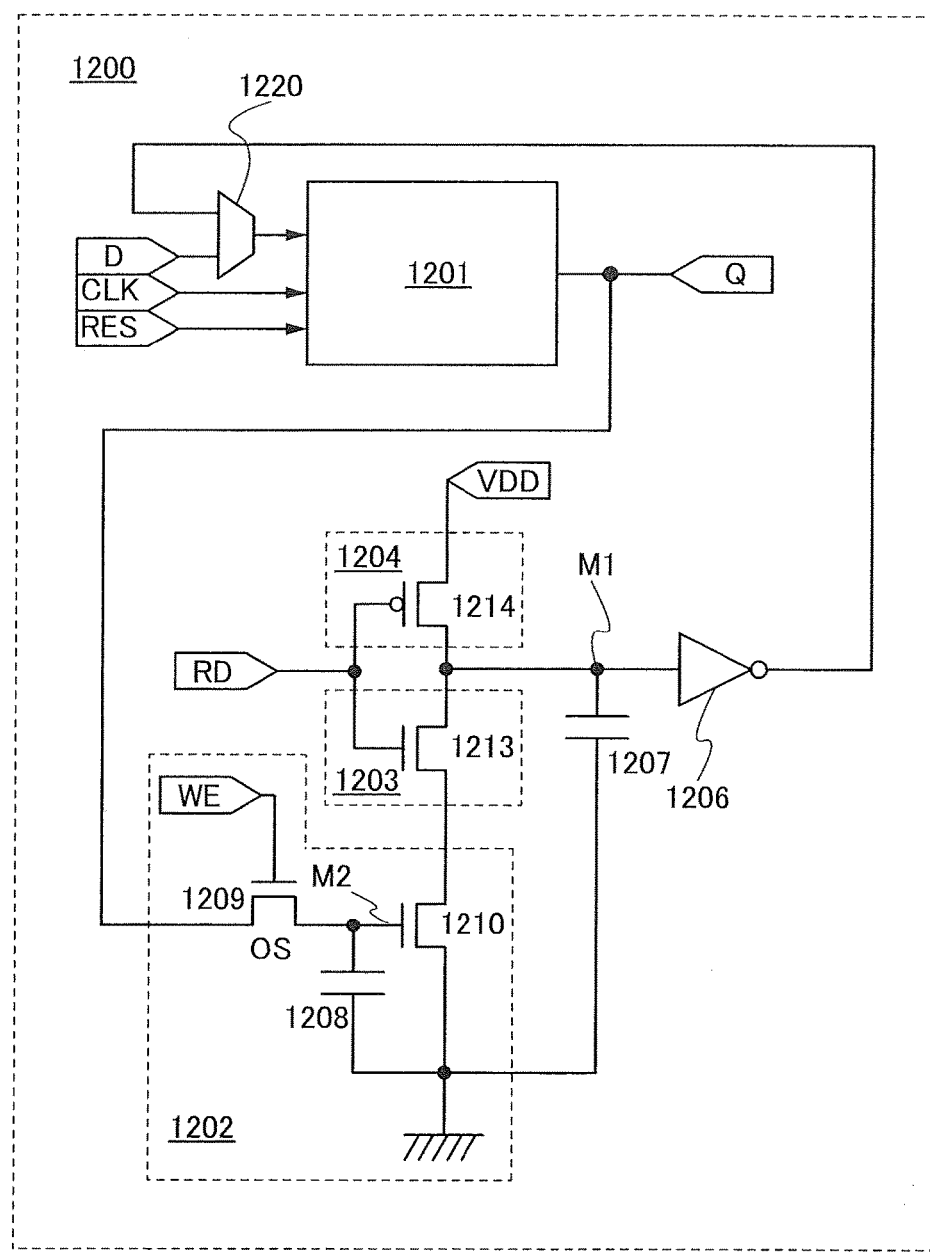
FIG. 24 is a circuit diagram illustrating a memory device of an embodiment.

FIG. 24 is an example of a circuit diagram of a memory circuit that can be used as the register 1196. A memory circuit 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory circuit 1200 may further include another element such as a diode, a resistor, or an inductor, as needed.

Here, the memory device described in the above embodiment can be used as the circuit 1202. When supply of a power supply voltage to the memory circuit 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When one of the switches is in the conduction state between the first terminal and the second terminal, the other of the switches is in the non-conduction state between the first terminal and the second terminal.

A signal corresponding to data retained in the circuit 1201 is input to the other of the source and the drain of the transistor 1209. FIG. 24 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 24, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 24, the transistors included in the memory circuit 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor film can be used for all the transistors in the memory circuit 1200. Further alternatively, in the memory circuit 1200, a transistor in which a channel is formed in an oxide semiconductor film can be included besides the transistor 1209, and a transistor in which a channel is formed in a layer formed using a semiconductor other than an oxide semiconductor or in the substrate 1190 can be used for the rest of the transistors.

As the circuit 1201 in FIG. 24, for example, a flip-flop circuit can be used. As the logic element 1206, for example, an inverter or a clocked inverter can be used.

In a period during which the memory circuit 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor film is extremely low. For example, the off-state current of a transistor in which a channel is formed in an oxide semiconductor film is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory circuit 1200. The memory circuit 1200 can accordingly retain the stored content (data) also in a period during which the supply of the power supply voltage is stopped.

Since the above-described memory circuit performs precharge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory circuit 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory circuit 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory circuit 1200 is used in a CPU in this embodiment, the memory circuit 1200 can also be used in an LSI such as a digital signal processor (DSP), a custom LSI, or a programmable logic device (PLD), and a radio frequency tag (RF tag).

At least part of this embodiment can be implemented in combination with any of the other embodiments described in this specification as appropriate.

(Embodiment 10)

In this embodiment, a structure example of a display panel of one embodiment of the present invention is described.

[Structure Example]

Figure 25A:
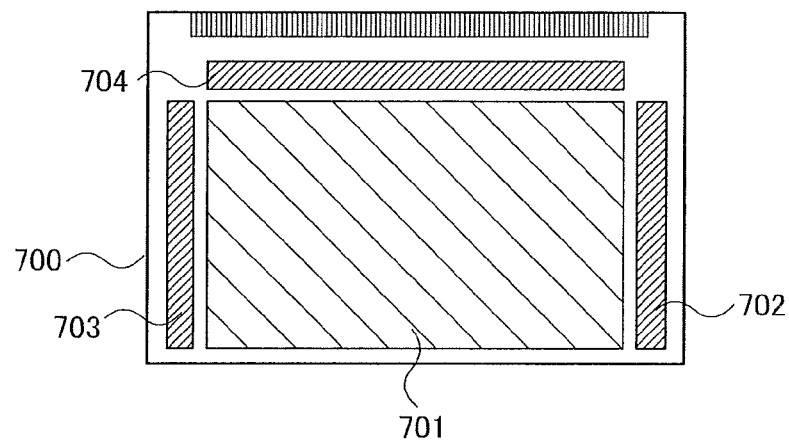
FIGS. 25A to 25C are a block diagram and circuit diagrams of a display device of one embodiment.
Figure 25B:
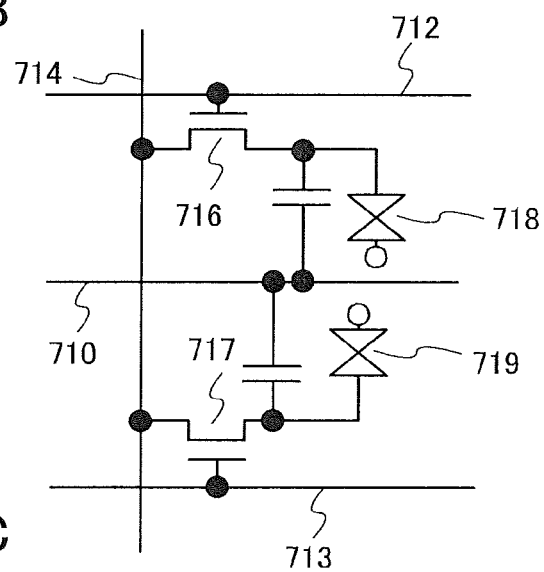
Figure 25C:
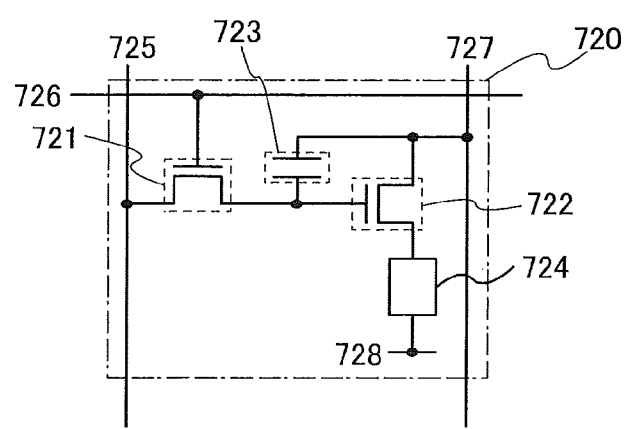

FIG. 25A is a top view of the display panel of one embodiment of the present invention. FIG. 25B is a circuit diagram illustrating a pixel circuit that can be used in the case where a liquid crystal element is used in a pixel in the display panel of one embodiment of the present invention. FIG. 25C is a circuit diagram illustrating a pixel circuit that can be used in the case where an organic EL element is used in a pixel in the display panel of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 25A illustrates an example of a block diagram of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 25A, the first scan line driver circuit 702, the second scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid Crystal Panel]

FIG. 25B illustrates an example of a circuit configuration of the pixel. Here, a pixel circuit that can be used in a pixel of a VA liquid crystal display panel is illustrated.

This pixel circuit can be used in a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 712 of a transistor 716 and a gate wiring 713 of a transistor 717 are separated so that different gate signals can be supplied thereto. In contrast, a source or drain electrode 714 that functions as a data line is shared by the transistors 716 and 717. The transistor described in any of the above embodiments can be used as appropriate as each of the transistors 716 and 717. Thus, a highly reliable liquid crystal display panel can be provided.

A first pixel electrode is electrically connected to the transistor 716 and a second pixel electrode is electrically connected to the transistor 717. The first pixel electrode and the second pixel electrode are separated. Shapes of the first pixel electrode and the second pixel electrode are not especially limited. For example, the first pixel electrode may have a V-like shape.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Furthermore, a storage capacitor may be formed using a capacitor wiring 710, a gate insulator functioning as a dielectric, and a capacitor electrode electrically connected to the first pixel electrode or the second pixel electrode.

The pixel structure is a multi-domain structure in which a first liquid crystal element 718 and a second liquid crystal element 719 are provided in one pixel. The first liquid crystal element 718 includes the first pixel electrode, a counter electrode, and a liquid crystal layer therebetween. The second liquid crystal element 719 includes the second pixel electrode, a counter electrode, and a liquid crystal layer therebetween.

Note that a pixel circuit of the present invention is not limited to that shown in FIG. 25B. For example, a switch, a resistor, a capacitor, a transistor, a sensor, a logic circuit, or the like may be added to the pixel illustrated in FIG. 25B.

[Organic EL Panel]

FIG. 25C illustrates another example of a circuit configuration of the pixel. Here, a pixel structure of a display panel including an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 25C illustrates an example of a pixel circuit that can be used. Here, one pixel includes two n-channel transistors. Note that a metal oxide film of one embodiment of the present invention can be used for channel formation regions of the n-channel transistors. Furthermore, digital time grayscale driving can be employed for the pixel circuit.

The configuration of the pixel circuit that can be used and the operation of a pixel employing digital time grayscale driving are described.

A pixel 720 includes a switching transistor 721, a driver transistor 722, a light-emitting element 724, and a capacitor 723. A gate electrode of the switching transistor 721 is connected to a scan line 726, a first electrode (one of a source electrode and a drain electrode) of the switching transistor 721 is connected to a signal line 725, and a second electrode (the other of the source electrode and the drain electrode) of the switching transistor 721 is connected to a gate electrode of the driver transistor 722. The gate electrode of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in any of the above embodiments can be used as appropriate. In this manner, a highly reliable organic EL display panel can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0 V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode of the driver transistor 722. Note that voltage higher than or equal to voltage which is the sum of power supply line voltage and the threshold voltage Vth of the driver transistor 722 is applied to the signal line 725.

In the case of performing analog grayscale driving, a voltage higher than or equal to a voltage which is the sum of the forward voltage of the light-emitting element 724 and the threshold voltage Vth of the driver transistor 722 is applied to the gate electrode of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 25C. For example, a switch, a resistor, a capacitor, a sensor, a transistor, a logic circuit, or the like may be added to the pixel circuit illustrated in FIG. 25C.

In the case where the transistor shown in any of the above embodiments is used for any of the circuits shown in FIGS. 25A to 25C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

At least part of this embodiment can be implemented in combination with any of the other embodiments described in this specification as appropriate.

(Embodiment 11)

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 26A to 26F illustrate specific examples of these electronic devices.

Figure 26A:
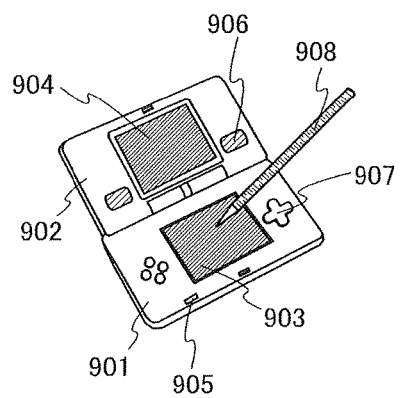
FIGS. 26A to 26F illustrate examples of an electronic device of an embodiment.

FIG. 26A illustrates a portable game machine, which includes a housing 901, a housing 902, a display portion 903, a display portion 904, a microphone 905, a speaker 906, an operation key 907, a stylus 908, and the like. Although the portable game machine in FIG. 26A has the two display portions 903 and 904, the number of display portions included in a portable game machine is not limited to this.

Figure 26B:
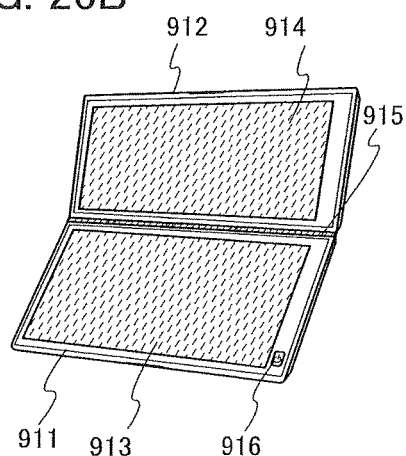

FIG. 26B illustrates a portable data terminal, which includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. Images displayed on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 26C:
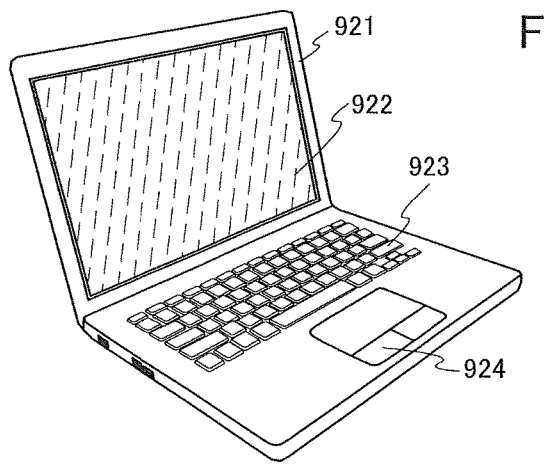

FIG. 26C illustrates a laptop personal computer, which includes a housing 921, a display portion 922, a keyboard 923, a pointing device 924, and the like.

Figure 26D:
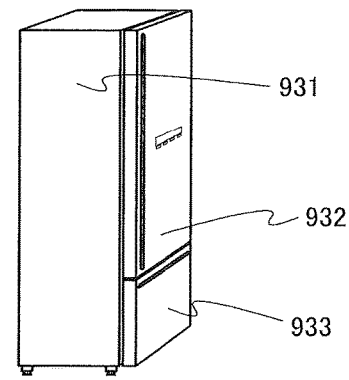

FIG. 26D illustrates an electric refrigerator-freezer, which includes a housing 931, a refrigerator door 932, a freezer door 933, and the like.

Figure 26E:
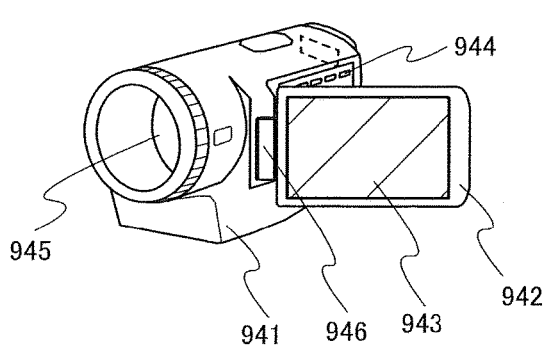

FIG. 26E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 26F:
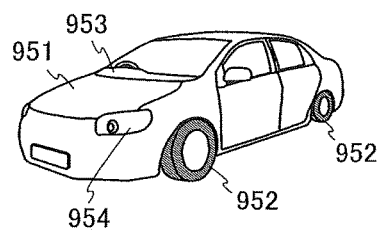
Figure 27A:
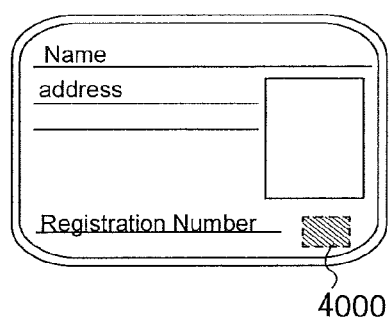
FIGS. 27A to 27F illustrate application examples of an RF tag of an embodiment.
Figure 27B:
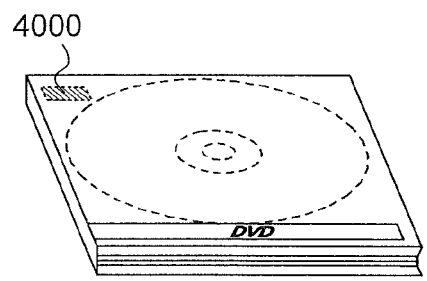
Figure 27C:
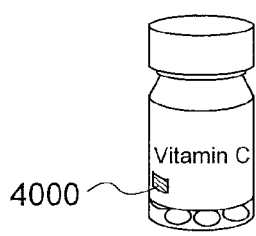
Figure 27D:
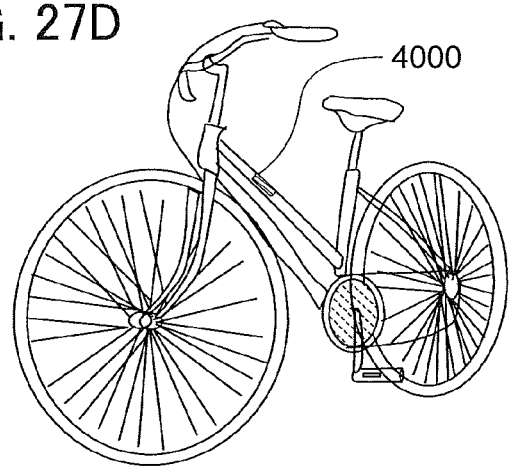
Figure 27E:
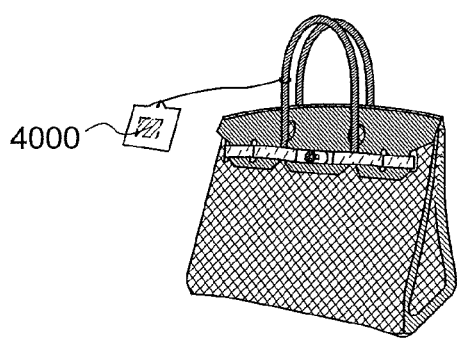
Figure 27F:
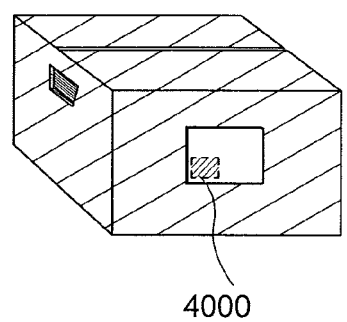
Figure 28A:
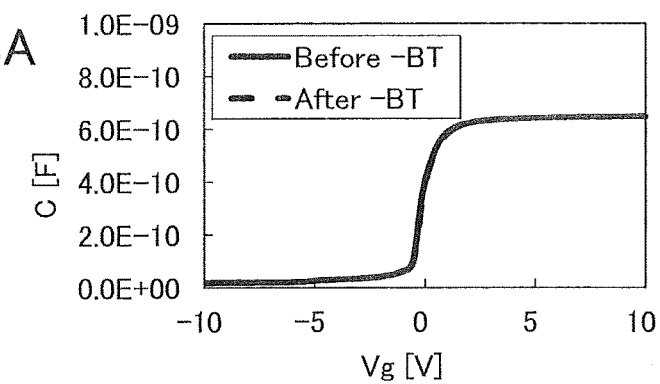
FIGS. 28A to 28D show C-V characteristics in an example.
Figure 28B:
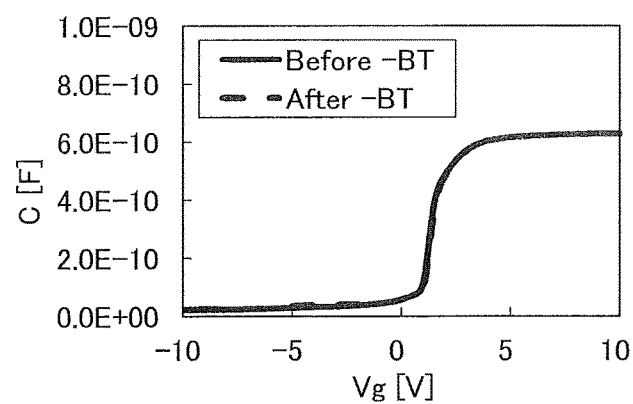
Figure 28C:
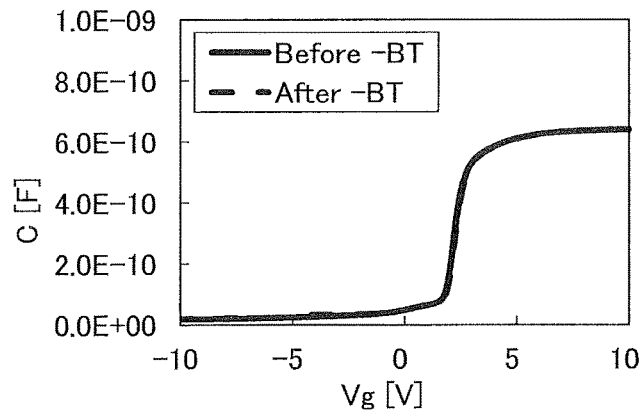
Figure 28D:
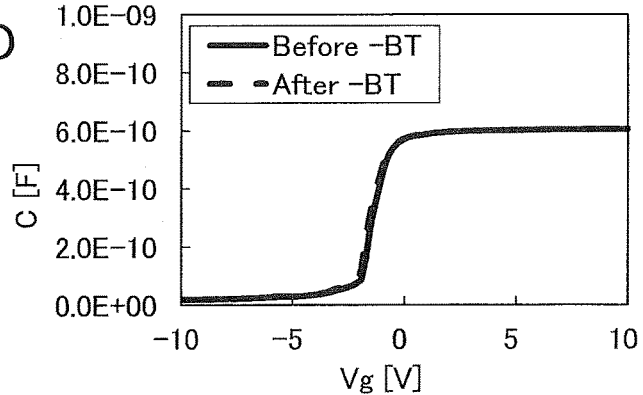
Figure 29A:
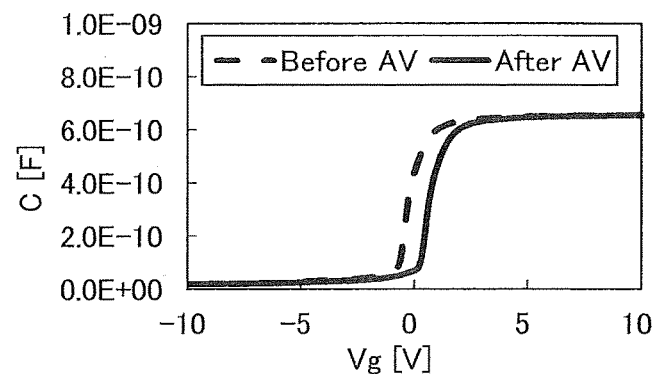
FIGS. 29A to 29D show C-V characteristics in an example.
Figure 29B:
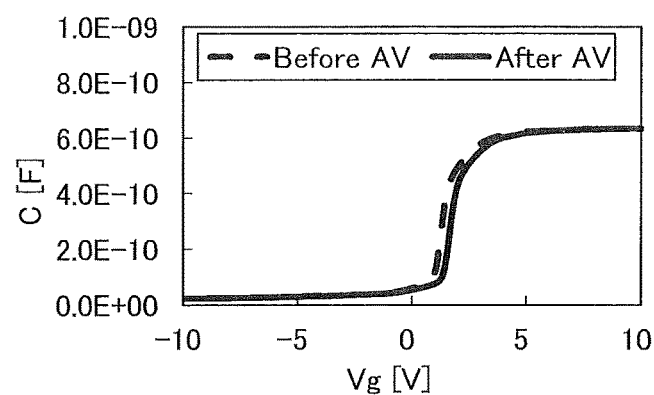
Figure 29C:
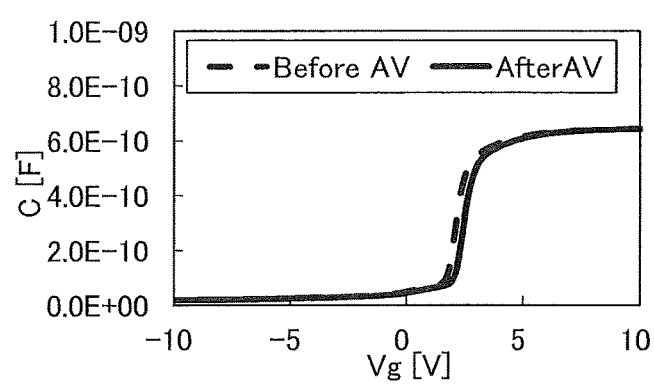
Figure 29D:
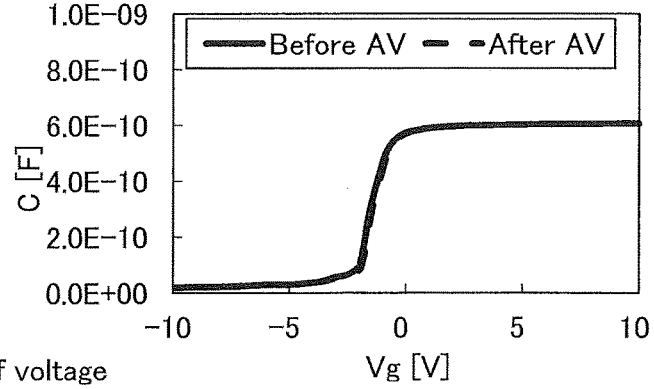
Figure 30A:
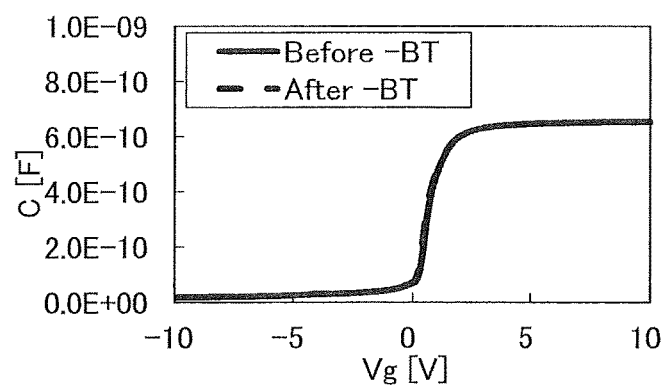
FIGS. 30A to 30D show C-V characteristics in an example.
Figure 30B:
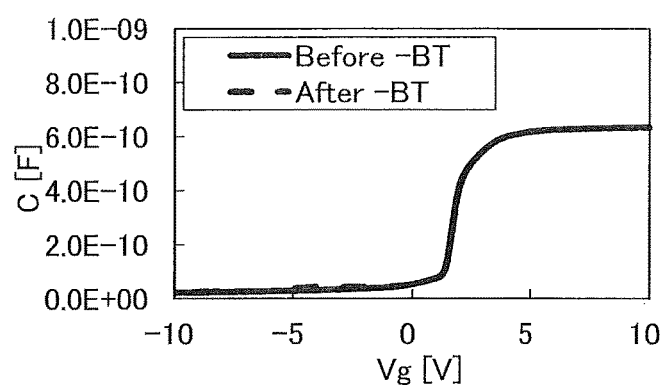
Figure 30C:
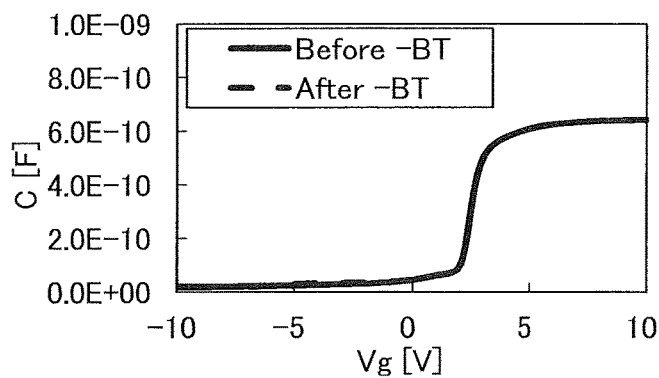
Figure 30D:
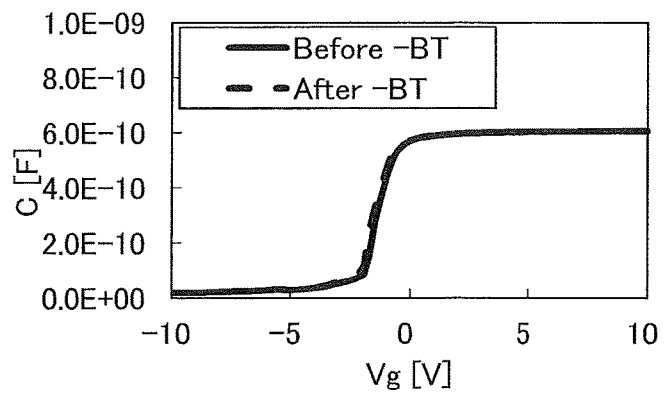

FIG. 26F illustrates a car which includes a car body 951, wheels 952, a dashboard 953, lights 954, and the like.

At least part of this embodiment can be implemented in combination with any of the other embodiments described in this specification as appropriate.

(Embodiment 12)

In this embodiment, application examples of an RF tag of one embodiment of the present invention are described with reference to FIGS. 27A to 27F. The RF tag is widely used and can be provided for, for example, products such as bills, coins, securities, bearer bonds, documents (e.g., driver's licenses or resident's cards, see FIG. 27A), recording media (e.g., DVDs or video tapes, see FIG. 27B), packaging containers (e.g., wrapping paper or bottles, see FIG. 27C), vehicles (e.g., bicycles, see FIG. 27D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 27E and 27F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be retained for an extremely long period even in the state where power is not supplied; thus, the RF tag can be preferably used for application in which data is not frequently written or read.

At least part of this embodiment can be implemented in combination with any of the other embodiments described in this specification as appropriate.

EXAMPLE 1

In Example 1, Samples 1 to 3 each having a metal insulator silicon (MIS) structure in which an electron trap layer is used as a gate insulator and Sample 4 were fabricated, and subjected to C-V measurement.

A 10-nm-thick silicon oxynitride film was deposited as a first insulator on an n-type silicon wafer by a plasma CVD method. Next, by an atomic layer deposition (ALD) method, a 20-nm-thick hafnium oxide film was deposited as an electron trap layer, and a 30-nm-thick silicon oxynitride film was deposited as a second insulator. The resulting sample was used for each of Samples 1 to 3. Note that the first insulator, the electron trap layer, and the second insulator function as gate insulating films in each of Samples 1 to 3.

Next, a 45-nm-thick silicon oxynitride film was deposited on an n-type silicon wafer by a plasma CVD method to fabricate Sample 4. The 45-nm-thick silicon oxynitride film of Sample 4, and the three-layer film, that is, the stack including the 10-nm-thick silicon oxynitride film, the 20-nm-thick hafnium oxide film, and the 30-nm-thick silicon oxynitride film of each of Samples 1 to 3 have the electrically equivalent thickness when converted into silicon oxide thickness (equivalent oxide thickness (EOT)). Note that the silicon oxynitride film functions as a gate insulating film in Sample 4.

After that, Sample 2 was subjected to heat treatment at 490° C. in an oxygen atmosphere while Sample 1 was not subjected to heat treatment. Samples 3 and 4 were subjected to heat treatment at 550° C. in an oxygen atmosphere.

Next, a conductor was deposited by a sputtering method. Here, the conductor was a stacked film of tantalum nitride, tungsten, and aluminum. The conductor was processed by a lithography method to form a gate electrode. Finally, a 400-nm-thick aluminum film was deposited on the rear surface of the silicon wafer, and a rear-surface electrode was formed.

FIGS. 28A to 28D show C-V characteristics before and after application of negative gate bias temperature (NGBT) stress. FIGS. 28A, 28B, 28C, and 28D correspond to Samples 1, 2, 3, and 4, respectively.

First, initial characteristics were measured, then NGBT stress was applied, and measurement was performed under the same condition as the measurement for the initial characteristics. The measurement for initial characteristics was carried out in such a manner that the gate voltage (Vg) was swept from −10 V to +10 V one time at room temperature with a measurement frequency of 10 kHz. The NGBT stress conditions were as follows: the temperature was 150° C., Vg to be applied was −3.3 V, and the time was 1 hour. After that, the application of stress was stopped, and characteristics after the NGBT stress were measured under the same condition as the measurement for the initial characteristics.

As for Sample 1, a flat band voltage (Vfb) in the measurement for initial characteristics was 0.20 V and Vfb in the measurement after the NGBT stress was 0.30 V. As for Sample 2, Vfb in the measurement for initial characteristics was 1.80 V and Vfb in the measurement after the NGBT stress was 1.90 V. As for Sample 3, Vfb in the measurement for initial characteristics was 2.60 V and Vfb in the measurement after the NGBT stress was 2.70 V. As for Sample 4, Vfb in the measurement for initial characteristics was −1.00 V and Vfb in the measurement after the NGBT stress was −1.10 V.

These results reveal that charge is introduced to the electron trap layer by heat treatment performed after deposition of the gate insulator, so that Vfb shifts in the positive direction. Furthermore, Vfb was hardly shifted by the NGBT test, which suggests that there was substantially no change in the amount of charge introduced to the electron trap layer. Thus, the amount of shift of Vfb has dependence on heat treatment temperature; as the heat treatment temperature becomes high, the amount of shift of Vfb increases, that is, the amount of charge introduced to the electron trap layer increases. In Sample 4, which did not include an electron trap layer, there was no shift of Vfb even when heat treatment was performed.

Next, voltage was applied to the rear-surface electrode, and C-V characteristics were measured at a different measurement point in each of the above samples. The voltage applied to the rare-surface electrode was ±35 V and the application was performed at room temperature for 0.1 seconds.

Next, NGBT stress was applied to each sample, and C-V characteristics were measured again. The NGBT stress conditions were the same as those described above.

FIGS. 29A to 29D show C-V characteristics before and after application of voltage to the rear-surfaces of the samples. FIGS. 29A, 29B, 29C, and 29D correspond to Samples 1, 2, 3, and 4, respectively. FIGS. 30A to 30D show the C-V characteristics after the NGBT stress. FIGS. 30A, 30B, 30C, and 30D correspond to Samples 1, 2, 3, and 4, respectively.

As for Sample 1, Vfb shifted from 0.10 V to 1.00 V after application of voltage to the rear-surface electrode. As for Sample 2, Vfb shifted from 1.80 V to 2.20 V after application of voltage to the rear-surface electrode. As for Sample 3, Vfb shifted from 2.50 V to 2.80 V after application of voltage to the rear-surface electrode. As for Sample 4, Vfb did not shift and remained at −1.00 V even after application of voltage to the rear-surface electrode. In measurement after the NGBT stress, there was substantially no shift of Vfb in every sample.

These results show that charge is introduced to the electron trap layer also by application of voltage to the rear-surface electrode at room temperature, so that Vfb shifts in the positive direction. In the case where heat treatment was not performed after deposition of the gate insulator, the original amount of charge introduced to the electron trap layer was small; therefore, the amount of positive shift of Vfb due to application of voltage to the Si wafer was the largest. Furthermore, since there was no shift of Vfb in any sample after the NGBT stress, charge of the electron trap layer was hardly moved by the NGBT stress. Sample 4 not including an electron trap layer also had no shift of Vfb.

The results reveal that charge is introduced to the electron trap layer by heat treatment or application of voltage.

EXAMPLE 2

Figure 31A:
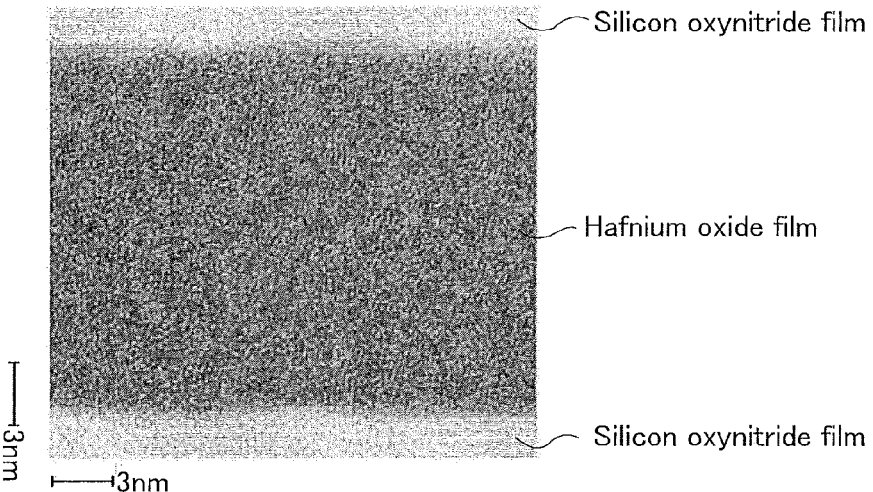
FIGS. 31A to 31C show cross-sectional TEM images in an example.
Figure 31B:
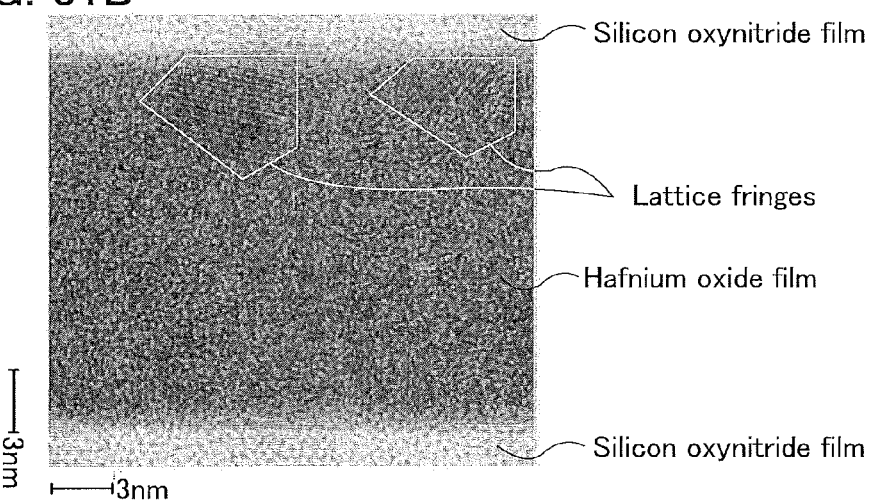
Figure 31C:
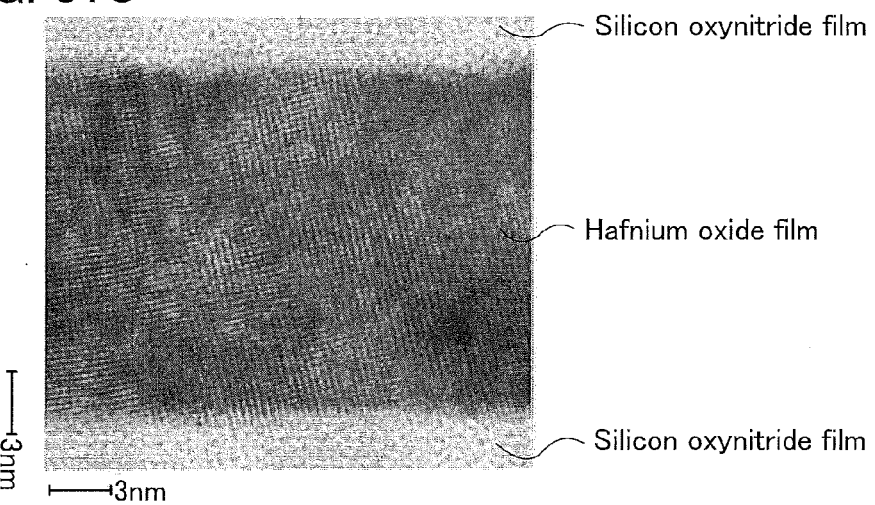

In Example 2, the electron trap layer was observed by cross-sectional transmission electron microscopy (cross-sectional TEM). The observed samples were the same as those used in Example 1. Cross-sectional TEM images of the samples are shown in FIGS. 31A to 31C. FIGS. 31A, 31B, and 31C correspond to Samples 1, 2, and 3, respectively.

Lattice fringes indicating crystallinity were observed in the electron trap layer, here, in the hafnium oxide film in each of Samples 2 and 3, which had been subjected to heat treatment after deposition of the gate insulator. Crystallinity depended on heat treatment temperature after deposition of the gate insulator; no lattice fringe was observed in the measured area of Sample 1 not subjected to heat treatment (see FIG. 31A), lattice fringes were observed in part of the measured area of Sample 2 subjected to heat treatment at 490° C. (see FIG. 31B), and lattice fringes were observed in most part of the measured area of Sample 3 subjected to heat treatment at 550° C. (see FIG. 31C).

EXAMPLE 3

In this example, the transistor 450 including the electron trap layer 402b, which is illustrated in FIGS. 8A to 8C, was fabricated by the manufacturing method described in Embodiment 5, and the transistor characteristics were measured. In addition, a transistor not including the electron trap layer 402b was fabricated for comparison.

Figure 32A:
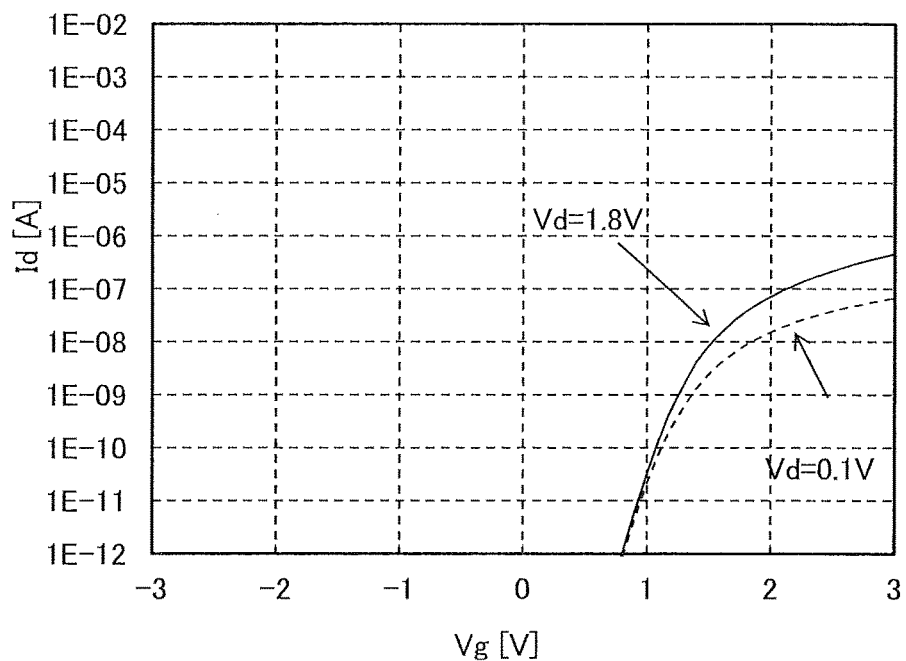
FIGS. 32A and 32B show Id-Vg characteristics in an example.
Figure 32B:
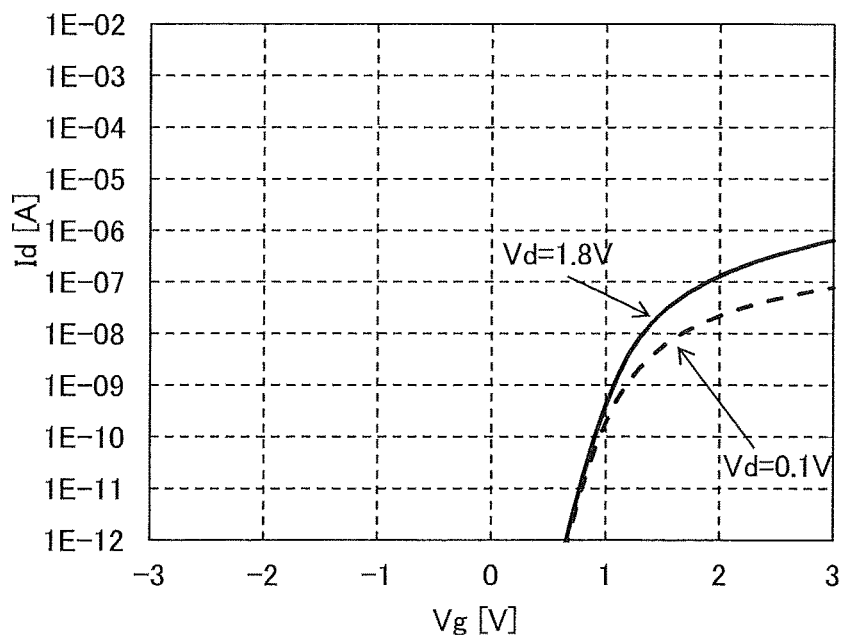

First, initial characteristics of the transistor were measured. Change in source-drain current (hereinafter referred to as a drain current Id) when a source-gate voltage (hereinafter referred to as a gate voltage Vg) changed from −3 V to +3 V at a source-drain voltage (hereinafter referred to as a drain voltage Vd) of 0.1 V or 1.8 V was measured. That is, Id-Vg characteristics were measured. FIG. 32A shows Id-Vg characteristics of the transistor with the electron trap layer 402b. FIG. 32B shows Id-Vg characteristics of the transistor not including the electron trap layer 402b. A difference owing to the presence or absent of the electron trap layer 402b is small in the initial characteristics.

Next, the source electrode 406a, the drain electrode 406b, and the gate electrode 410 were fixed to an earth potential, and voltage was applied to the gate electrode 401. Here, in the transistor with the electron trap layer 402b, the voltage was fixed at +35 V at room temperature, and time for application of voltage was varied, i.e., 10 milliseconds, 30 milliseconds, 50 milliseconds, and 70 milliseconds. After the application of voltage, the Id-Vg characteristics of the transistor were measured again. The measurement conditions were the same as those for the initial characteristics described above.

In the transistor not including the electron trap layer 402b, the voltage was fixed at +35 V at room temperature, and time for application of voltage was varied, i.e., 100 milliseconds, 300 milliseconds, 500 milliseconds, and 700 milliseconds. After the application of voltage, the Id-Vg characteristics of the transistor were measured again. The measurement conditions were the same as those for the initial characteristics described above.

Figure 33:
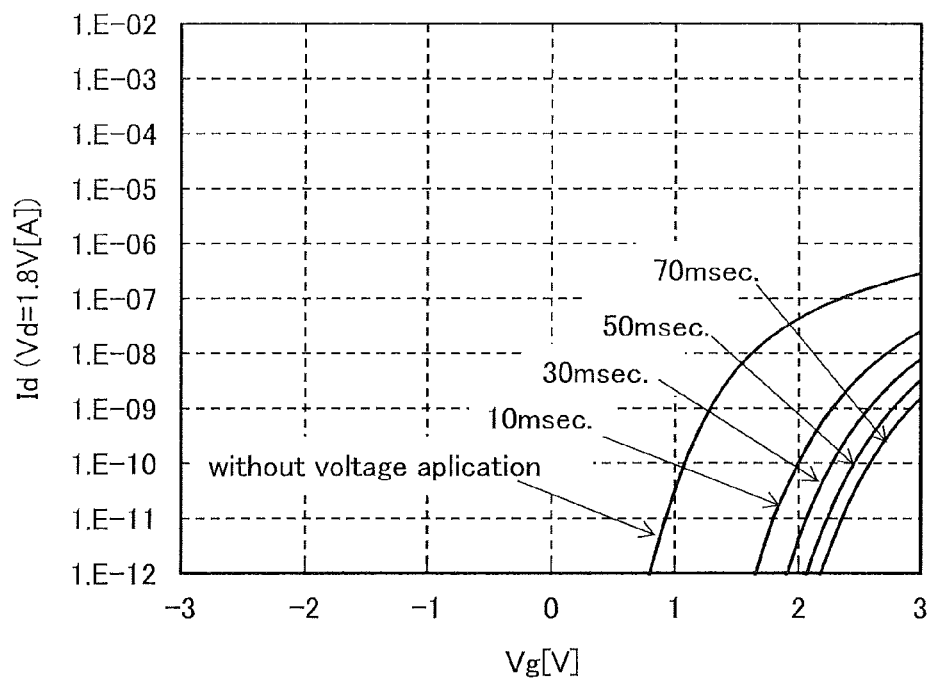
FIG. 33 shows Id-Vg characteristics in an example.
Figure 34A:
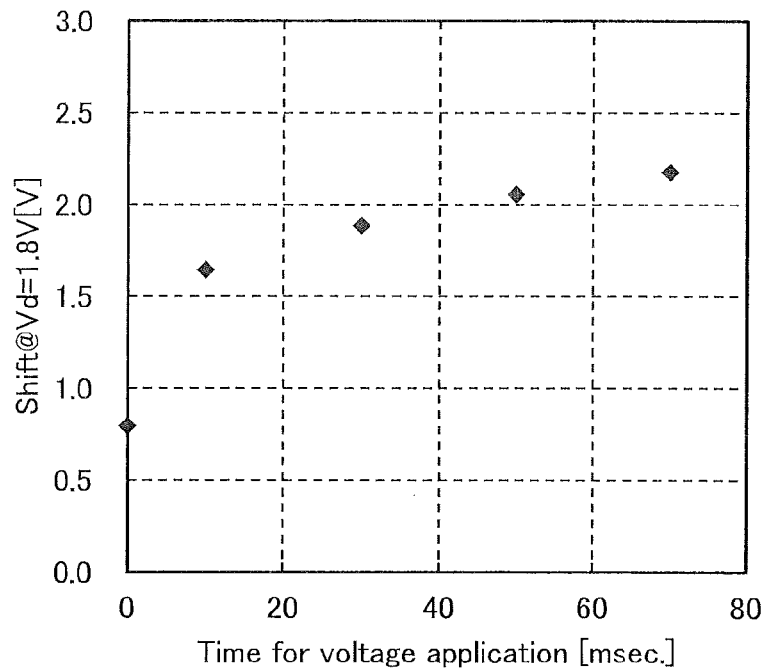
FIGS. 34A and 34B show changes in Shift and ΔShift in an example.
Figure 34B:
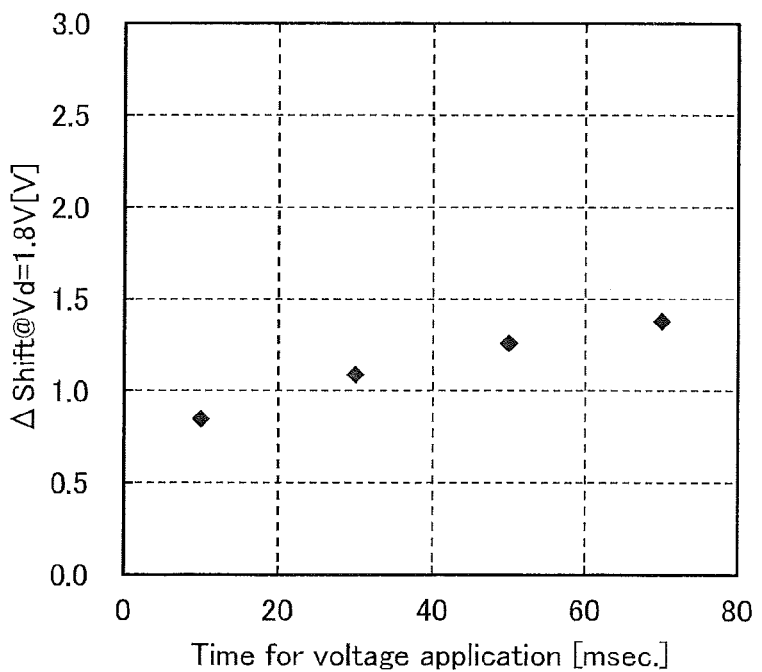
Figure 35A:
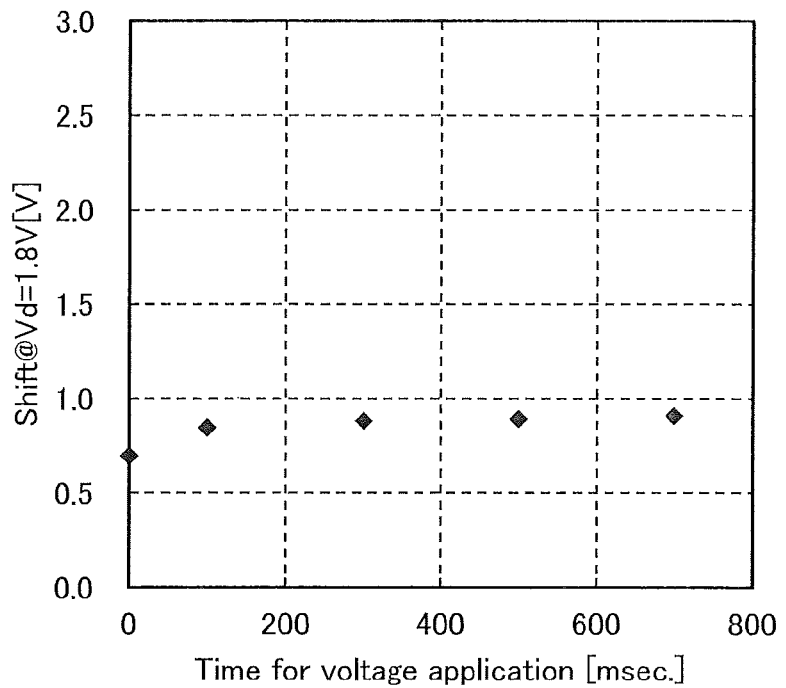
FIGS. 35A and 35B show changes in Shift and ΔShift in an example.
Figure 35B:
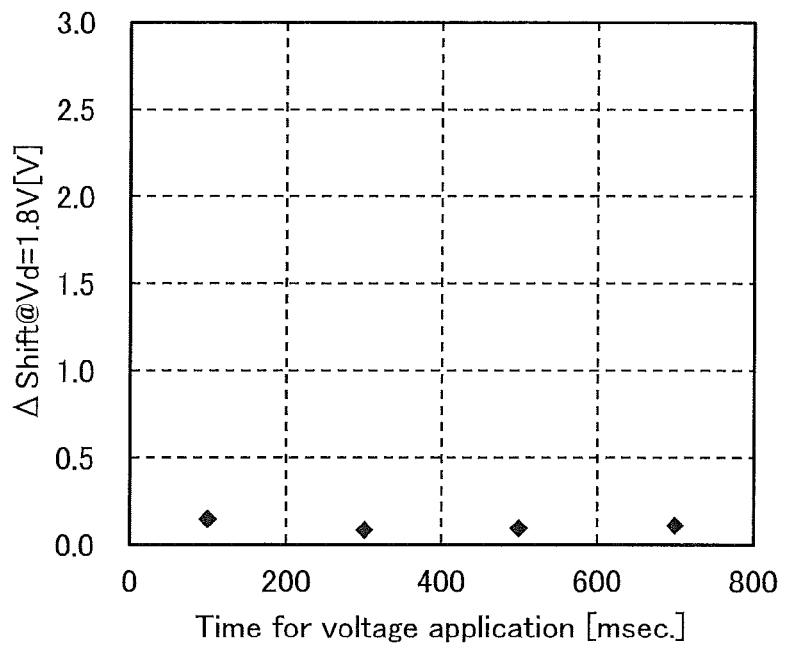

The Id-Vg characteristics at Vd=1.8 V are shown. Note that Shift is defined as the value of a gate voltage Vg when the drain current Id is $1.0 \times 10^{-12}$ (A) in the Id-Vg transistor characteristics. Furthermore, ΔShift represents the amount of change in Shift. FIG. 33 and FIGS. 34A and 34B show the characteristics of the transistor with the electron trap layer 402b. Owing to application of voltage to the gate electrode 401 by the above method, an Id-Vg curve shifted in the positive direction. Furthermore, Shift increased in response to an increase in the time for application of voltage. On the other hand, in the transistor not including the electron trap layer 402b, even with application of voltage to the gate electrode 401 by the above method, the Id-Vg curve only slightly shifted in the positive direction; even when the time for application of voltage was increased, the amount of shift was small (see FIGS. 35A and 35B).

These results show that when voltage is applied to the gate electrode 401 of the transistor with the electron trap layer 402b for a short period, here, for 10 milliseconds to 70 milliseconds, electrons are trapped in the electron trap layer 402b; thus, the electron trap layer 402b functions as an electron trap layer.

Next, with the use of another sample including the electron trap layer 402b, a voltage of +35 V was applied to the gate electrode 401 at room temperature for 100 milliseconds by the method described above to make the Id-Vg curve shift in the positive direction. After that, a +drain bias temperature (+DBT) stress test was performed. The +DBT stress test was performed under the conditions where the temperature was 150° C., the drain voltage Vd was +0.1 V and +1.8 V, the source voltage Vs was 0 V, and stress was applied for 12 hours (43200 seconds) at a maximum. In the test, Id-Vg measurement was performed at 150° C. after 100 seconds, 600 seconds, 1000 seconds, 1800 seconds, 3600 seconds (1 hour), 7200 seconds (2 hours), 1000 seconds, 18000 seconds (5 hours), 32400 seconds (9 hours), and 43200 seconds (12 hours) from the beginning of the application of stress.

Figure 36A:
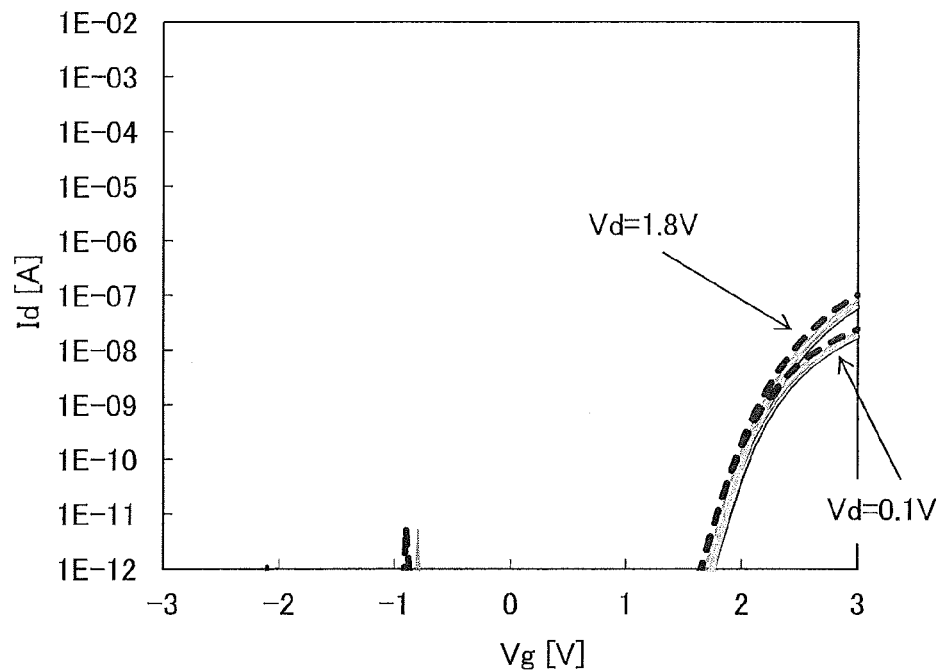
FIGS. 36A and 36B show Id-Vg characteristic and change in ΔShift in an example.
Figure 36B:
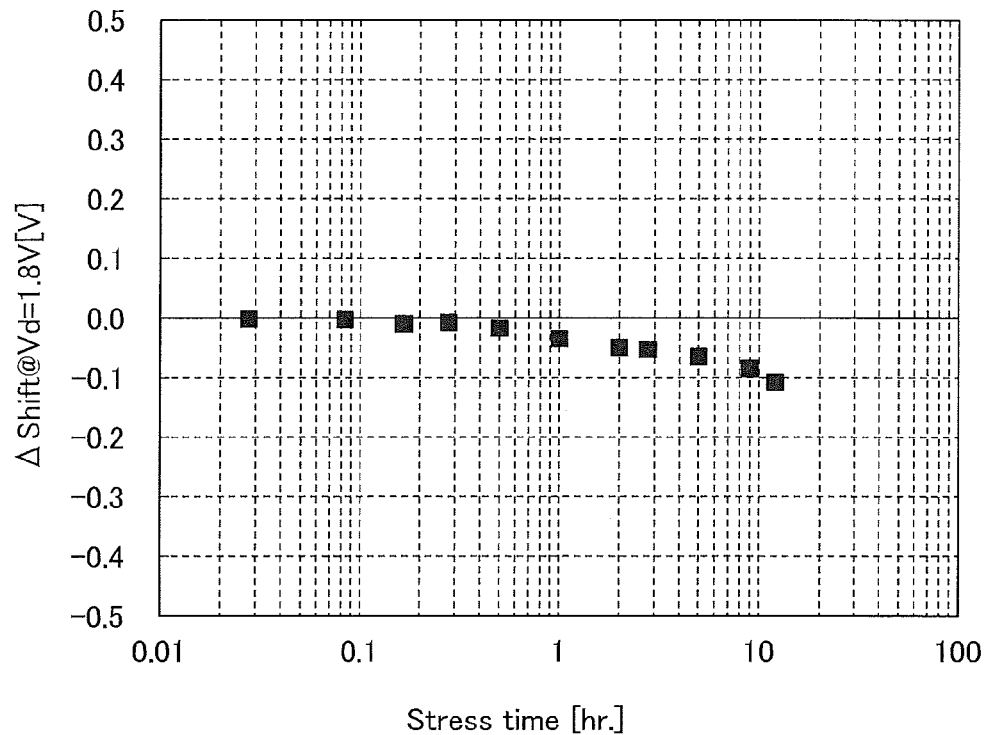

FIGS. 36A and 36B show the results. FIG. 36A shows changes in Id-Vg characteristics after 0 seconds, 600 seconds, 3600 seconds (1 hour), 18000 seconds (5 hours), and 43200 seconds (12 hours) from the beginning of the application of stress. FIG. 36B is a graph obtained by plotting the values of ΔShift with Vd=1.8 V at all the above times. As shown in the results, even when the time for the +DBT stress test was 12 hours, the amount of change in Shift, i.e., ΔShift was less than or equal to 0.1 V. In consideration of these results, electrons introduced to the electron trap layer are trapped stably.

Therefore, the transistor including the electron trap layer 402b can be used in the program memory circuit, which is required to retain data for a long period and is described in Embodiment 2.

EXAMPLE 4

In this example, as in Example 3, the transistors 450 including the electron trap layers 402b, each of which is illustrated in FIGS. 8A to 8C, were fabricated by the manufacturing method described in Embodiment 5. Characteristics of 60 transistors within an area for one shot of a light exposure apparatus (a region of 20 mm×20 mm) were measured and variations were estimated.

First, initial characteristics of the transistor were measured. Id-Vg characteristics were measured when the drain voltage Vd was set at 1.8 V and the gate voltage Vg was varied from −3 V to +3 V. From the Id-Vg characteristics, Shift was estimated. Example 3 can be referred to for Shift and ΔShift.

Next, the source electrode 406a, the drain electrode 406b, and the gate electrode 410 were fixed at the earth potential, and voltage was applied to the gate electrode 401. The voltage was changed to +36 V, +38 V, and +40 V at room temperature, and the time for application of voltage was set at 200 milliseconds. After the application of voltage, the Id-Vg characteristics of the transistors were measured again. The measurement conditions were the same as those for the measurement of the initial characteristics.

Figure 37A:
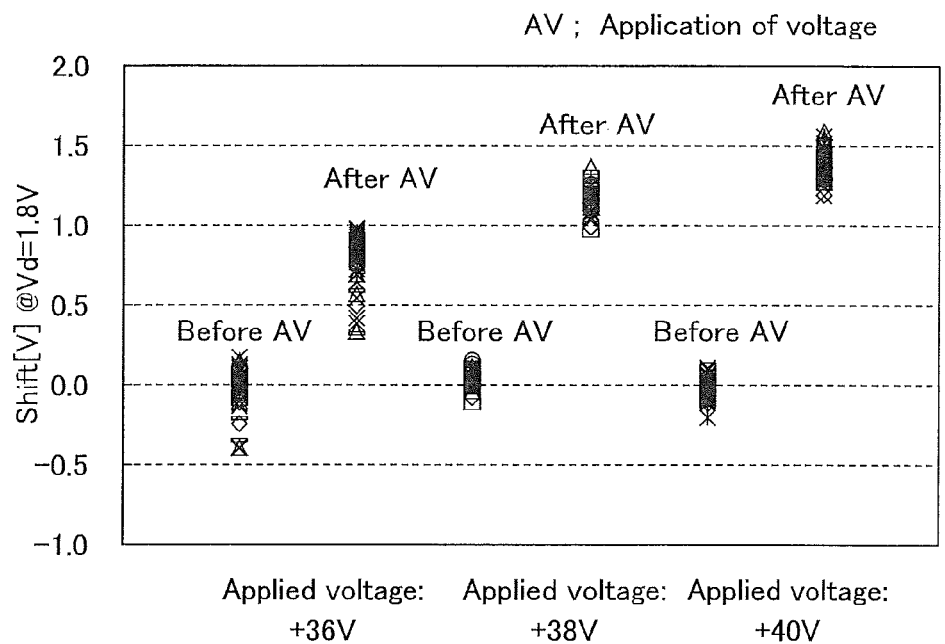
FIGS. 37A and 37B show changes in Shift before and after application of voltages and dependence of ΔShift on applied voltages, respectively.

The values of Shift obtained before and after the application voltages of +36 V, +38 V, and +40 V were plotted as shown in FIG. 37A. Comparison between variations in Shift before and after application of voltage shows that the variation in Shift after application of voltage is large to a degree.

Specific changes are as follows. In the case of the applied voltage of +36 V, standard deviation (σ) of Shift was 0.127 V and 3σ was 0.380 V before application of voltage, and σ was 0.150 V and 3σ was 0.449 V after application. In the case of the applied voltage of +38 V, σ of Shift was 0.052 V and 3σ was 0.157 V before application of voltage, and σ was 0.073 V and 3σ was 0.218 V after application. In the case of the applied voltage of +40 V, σ of Shift was 0.060 V and 3σ was 0.180 V before application of voltage, and a was 0.087 V and 3σ was 0.260 V after application. These show that variations are sufficiently small.

Figure 37B:
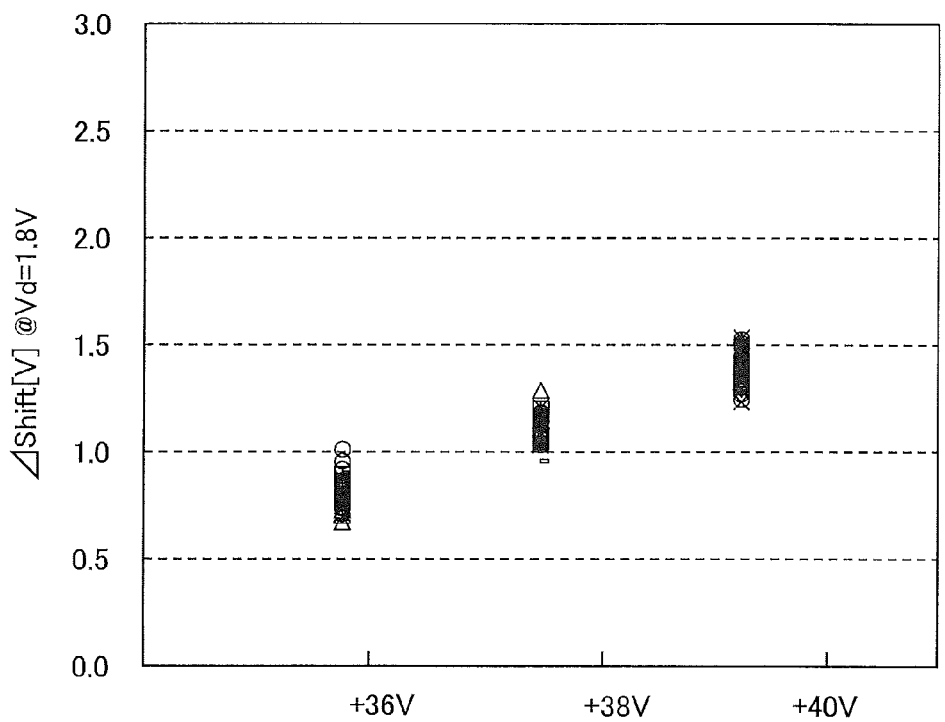

FIG. 37B is a graph showing dependence of ΔShift on applied voltage. There was dependence of Shift on voltage, and the variation in Shift was constant regardless of applied voltage.

Figure 38:
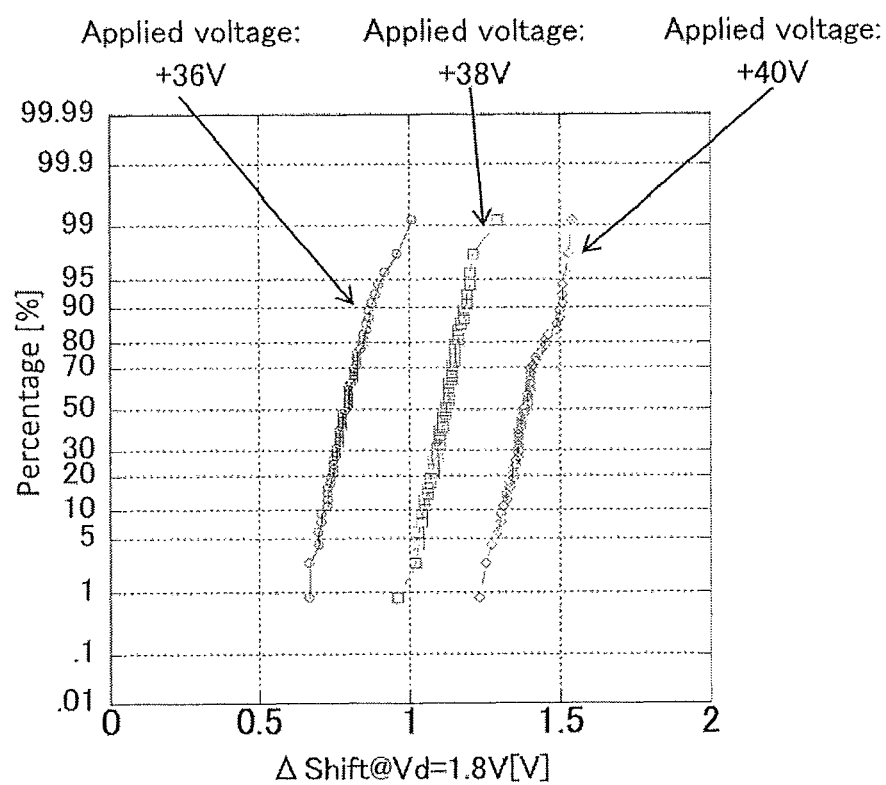
FIG. 38 shows normal probability distribution of ΔShift in an example.

FIG. 38 is a plot diagram of normal possibility of ΔShift after the voltages +36 V, +38 V, and +40 V were applied. The Range value (=Max value−Min value) was approximately 0.3 V with any of the applied voltages of +36 V, +38 V, and +40 V. Furthermore, σ was approximately 0.07 V, and 3σ was 0.20 V.

Specifically, in the case of the applied voltage of +36 V, the average value of ΔShift was 0.796 V, σ was 0.065 V, and 3σ was 0.196 V; in the case of the applied voltage of +38 V, the average value of ΔShift was 1.071 V, σ was 0.055 V, and 3σ was 0.164 V; and in the case of the applied voltage of +40 V, the average value of ΔShift was 1.330 V, σ was 0.070 V, and 3σ was 0.210 V.

These results reveal that the characteristics of the transistors 450 including the electron trap layers 402b within the one-shot area exhibit sufficiently small variations even after voltage is applied; therefore, the transistors can be used in a program memory circuit which is required to retain data for a long time.

This application is based on Japanese Patent Application serial no. 2014-162751 filed with Japan Patent Office on Aug. 8, 2014 and Japanese Patent Application serial no. 2014-254710 filed with Japan Patent Office on Dec. 17, 2014, the entire contents of which are hereby incorporated by reference.

What is claimed is:

1. A semiconductor device comprising:
a first circuit comprising a memory circuit;
a second circuit comprising a first output terminal and a second output terminal; and
a third circuit comprising a second memory circuit,
wherein the memory circuit comprises a first transistor comprising a first gate electrode, a second gate electrode, a first insulator, a second insulator, and a semiconductor,
wherein the first output terminal is connected to the first gate electrode and the second output terminal is connected to the second gate electrode,
wherein the first gate electrode comprises a region overlapping the semiconductor with the first insulator between the first gate electrode and the semiconductor,
wherein the second gate electrode comprises a region overlapping the semiconductor with the second insulator between the second gate electrode and the semiconductor,
wherein the second circuit is configured to apply a positive voltage to the second gate electrode when the first transistor is on, and apply zero voltage or a negative voltage to the second gate electrode when the first transistor is off,
wherein the third circuit comprises a second transistor comprising an electron trap layer formed on a same substrate as the first transistor, the third circuit being functionally connected to the first circuit, and
wherein the second insulator does not include the electron trap layer.

2. The semiconductor device according to claim 1,
wherein the first gate electrode is capable of selecting on or off of the first transistor.

3. The semiconductor device according to claim 1, further comprising a capacitor,
wherein the capacitor is electrically connected to the first transistor.

4. The semiconductor device according to claim 1,
wherein the semiconductor comprises at least one selected from a group consisting of indium, gallium, and zinc.

5. A semiconductor device comprising:
a first circuit comprising a first memory circuit;
a second circuit comprising a first output terminal and a second output terminal; and
a third circuit comprising a second memory circuit,
wherein the first memory circuit comprises a first transistor comprising a first gate electrode, a second gate electrode, a first insulator, a second insulator, and a first semiconductor,
wherein the first output terminal is connected to the first gate electrode and the second output terminal is connected to the second gate electrode,
wherein the first gate electrode comprises a region overlapping the first semiconductor with the first insulator between the first gate electrode and the first semiconductor,
wherein the second gate electrode comprises a region overlapping the first semiconductor with the second insulator between the second gate electrode and the first semiconductor,
wherein the third circuit comprises a second transistor comprising a third gate electrode, a fourth gate electrode, a third insulator, a fourth insulator, a second semiconductor, and an electron trap layer,
wherein the third gate electrode comprises a region overlapping the second semiconductor with the third insulator between the third gate electrode and the second semiconductor,
wherein the fourth gate electrode comprises a region overlapping the second semiconductor with the fourth insulator and the electron trap layer between the fourth gate electrode and the second semiconductor, and
wherein the second insulator does not include the electron trap layer.

6. The semiconductor device according to claim 5,
wherein a stacked structure between the first semiconductor and the second gate electrode is different from a stacked structure between the second semiconductor and the fourth gate electrode, and
wherein the second gate electrode and the fourth gate electrode are provided on same sides as the first semiconductor and the second semiconductor, respectively.

7. The semiconductor device according to claim 5,
wherein the second circuit is configured to apply a positive voltage to the second gate electrode when the first transistor is on, and apply zero voltage or a negative voltage to the second gate electrode when the first transistor is off.

8. The semiconductor device according to claim 5,
wherein the first gate electrode is capable of selecting on or off of the first transistor.

9. The semiconductor device according to claim 5, further comprising a capacitor,
wherein the capacitor is electrically connected to the first transistor.

10. The semiconductor device according to claim 5,
wherein the first semiconductor and the second semiconductor comprise at least one selected from a group consisting of indium, gallium, and zinc.

11. The semiconductor device according to a claim 5,
wherein the electron trap layer comprises one of hafnium oxide, aluminum oxide, tantalum oxide, and aluminum silicate.

12. The semiconductor device according to claim 5,
wherein the electron trap layer has crystallinity.

13. The semiconductor device according to claim 5,
wherein an electron is introduced to the electron trap layer by heating.

14. The semiconductor device according to claim 5,
wherein introduction of an electron to the electron trap layer is performed by heating and application of a potential to the second gate electrode.

15. The semiconductor device according to claim 5,
wherein the fourth insulator comprises one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

16. The semiconductor device according to claim 5,
wherein the first memory circuit is a data memory circuit, and
wherein the second memory circuit is a program memory circuit.

17. A semiconductor device comprising:
a first circuit comprising a memory circuit;
a second circuit comprising a first output terminal and a second output terminal; and
wherein the memory circuit comprises a first transistor comprising a first gate electrode, a second gate electrode, a first insulator, a second insulator, and a semiconductor,
wherein the first output terminal is connected to the first gate electrode and the second output terminal is connected to the second gate electrode,
wherein the first gate electrode comprises a region overlapping the semiconductor with the first insulator between the first gate electrode and the semiconductor,
wherein the second gate electrode comprises a region overlapping the semiconductor with the second insulator between the second gate electrode and the semiconductor, and
wherein the second circuit is configured to apply a positive voltage to the second gate electrode when the first transistor is on, and apply zero voltage or a negative voltage to the second gate electrode when the first transistor is off.

18. The semiconductor device according to claim 17,
further comprising a third circuit comprising a second memory circuit,
wherein the third circuit comprises a second transistor comprising an electron trap layer,
wherein the first gate electrode of the first transistor and a gate electrode of the second transistor comprise a same material,
wherein the first insulator and a gate insulator of the second transistor comprise a same material, and
wherein the second insulator does not include the electron trap layer.

19. The semiconductor device according to claim 17,
wherein the first gate electrode is capable of selecting on or off of the first transistor.

20. The semiconductor device according to claim 17,
further comprising a capacitor,
wherein the capacitor is electrically connected to the first transistor.

21. The semiconductor device according to claim 17,
wherein the semiconductor comprises at least one selected from a group consisting of indium, gallium, and zinc.

* * * * *